US009713289B2

United States Patent
Rasmussen et al.

(10) Patent No.: US 9,713,289 B2
(45) Date of Patent: Jul. 18, 2017

(54) MODULAR POD

(71) Applicant: CH2M HILL ENGINEERS, INC., Englewood, CO (US)

(72) Inventors: Benjamin D. Rasmussen, Tigard, OR (US); Robert Kirkendall, West Linn, OR (US); Michael R. Monis, Lake Oswego, OR (US); Aubrey A. Berliner, III, Camas, WA (US); Judson W. Moore, Portland, OR (US); Dale W. Heberling, Milwaukie, OR (US); Keith L. Kibbee, Portland, OR (US); David W. Seger, Taulatin, OR (US); Timothy G. Meier, Portland, OR (US)

(73) Assignee: CH2M Hill Engineers, Inc., Englewood, CO (US)

( * ) Notice: Subject to any disclaimer, the term of this patent is extended or adjusted under 35 U.S.C. 154(b) by 1054 days.

(21) Appl. No.: 13/843,596

(22) Filed: Mar. 15, 2013

(65) Prior Publication Data
US 2014/0213169 A1    Jul. 31, 2014

Related U.S. Application Data

(60) Provisional application No. 61/757,596, filed on Jan. 28, 2013.

(51) Int. Cl.
*F24F 13/08* (2006.01)
*F24F 1/00* (2011.01)
(Continued)

(52) U.S. Cl.
CPC ....... *H05K 7/20745* (2013.01); *H05K 7/1497* (2013.01); *H05K 7/2079* (2013.01)

(58) Field of Classification Search
None
See application file for complete search history.

(56) References Cited

U.S. PATENT DOCUMENTS

| 3,803,790 A | 4/1974 | Buck et al. |
| 3,997,819 A | 12/1976 | Eggert et al. |

(Continued)

FOREIGN PATENT DOCUMENTS

| DE | 2537295 A1 | 4/1976 |
| EP | 2336661 A1 | 6/2011 |

(Continued)

OTHER PUBLICATIONS

PCT International Search Report and Written Opinion dated Jul. 24, 2014 for International Application No. PCT/US2014/013409, 9 pages.

(Continued)

*Primary Examiner* — Gregory Huson
*Assistant Examiner* — Eric Gorman
(74) *Attorney, Agent, or Firm* — Dorsey & Whitney LLP

(57) ABSTRACT

A modular pod may include two or more walls, a roof, and a base, an air plenum, an air inlet, and an air economizer. The two or more walls, the roof, and the base may define a substantially enclosed interior space. The return air plenum may be positioned within the interior space. The air inlet may be positioned proximate one of the walls. The air economizer may be positioned within the interior space. The air economizer may include a mixing zone and two or more air shafts. The mixing zone may be in communication with the air inlet. The two or more air shafts may be in communication with the air plenum and in communication with the mixing zone. Each air shaft may taper down from the top end to the bottom end of the air shaft.

15 Claims, 47 Drawing Sheets

(51) Int. Cl.
   *F24F 11/00*  (2006.01)
   *H05K 7/20*   (2006.01)
   *H05K 7/00*   (2006.01)
   *G06F 1/20*   (2006.01)
   *H05K 7/14*   (2006.01)

(56) References Cited

U.S. PATENT DOCUMENTS

| | | | |
|---|---|---|---|
| D281,315 S | 11/1985 | Kjeld | |
| 4,706,608 A * | 11/1987 | Foster | A01K 41/00 |
| | | | 119/319 |
| 5,031,515 A | 7/1991 | Niemela et al. | |
| D338,469 S | 8/1993 | Alden et al. | |
| D373,349 S | 9/1996 | Millard | |
| 5,563,768 A | 10/1996 | Perdue | |
| 6,092,592 A * | 7/2000 | Toyoshima | B60H 1/0005 |
| | | | 165/204 |
| 6,139,425 A | 10/2000 | Yazici et al. | |
| 6,213,867 B1 * | 4/2001 | Yazici | F24F 1/01 |
| | | | 454/261 |
| 6,233,841 B1 * | 5/2001 | Beach | A23L 3/54 |
| | | | 34/203 |
| D453,146 S | 1/2002 | Kent et al. | |
| 6,411,515 B1 | 6/2002 | Sakamoto et al. | |
| 6,446,396 B1 * | 9/2002 | Marangoni | A47B 96/027 |
| | | | 108/50.02 |
| 6,623,353 B1 | 9/2003 | Akhtar et al. | |
| D486,828 S | 2/2004 | Dearborn et al. | |
| D490,805 S | 6/2004 | Lee | |
| D493,797 S | 8/2004 | Dearborn et al. | |
| 7,177,148 B2 * | 2/2007 | Nakata | H02B 1/28 |
| | | | 174/16.1 |
| 7,438,638 B2 | 10/2008 | Lewis, II et al. | |
| 7,903,403 B2 * | 3/2011 | Doll | G06F 1/20 |
| | | | 361/679.48 |
| 8,045,328 B1 | 10/2011 | Chen | |
| 8,072,780 B1 * | 12/2011 | Roy | H05K 7/20736 |
| | | | 361/825 |
| 8,180,495 B1 * | 5/2012 | Roy | H05K 7/20745 |
| | | | 165/67 |
| D662,501 S | 6/2012 | Lohman | |
| 8,270,154 B2 | 9/2012 | Andersen et al. | |
| 8,469,782 B1 * | 6/2013 | Roy | H05K 7/20745 |
| | | | 454/184 |
| 8,523,643 B1 * | 9/2013 | Roy | G06F 1/20 |
| | | | 454/184 |
| D711,382 S | 8/2014 | Eriksen | |
| 2003/0181158 A1 | 9/2003 | Schell et al. | |
| 2005/0225936 A1 | 10/2005 | Day | |
| 2005/0237714 A1 | 10/2005 | Ebermann | |
| 2005/0237716 A1 * | 10/2005 | Chu | H05K 7/20745 |
| | | | 361/696 |
| 2008/0314611 A1 | 12/2008 | Beck | |
| 2010/0057258 A1 | 3/2010 | Clanin | |
| 2010/0130117 A1 | 5/2010 | Larsen | |
| 2010/0165565 A1 * | 7/2010 | Hellriegal | G06F 1/183 |
| | | | 361/679.46 |
| 2010/0263829 A1 * | 10/2010 | Kimura | F24F 1/01 |
| | | | 165/59 |
| 2012/0006038 A1 | 1/2012 | Sharma et al. | |
| 2012/0008275 A1 * | 1/2012 | Doll | G06F 1/20 |
| | | | 361/679.47 |
| 2012/0014060 A1 | 1/2012 | Slessman | |
| 2012/0227930 A1 | 9/2012 | Rowe | |
| 2012/0267069 A1 | 10/2012 | Seeliger et al. | |
| 2014/0206271 A1 * | 7/2014 | Ignacio | H05K 7/20736 |
| | | | 454/184 |
| 2014/0213169 A1 | 7/2014 | Rasmussen et al. | |
| 2015/0059385 A1 * | 3/2015 | Burd | B60H 1/00014 |
| | | | 62/239 |
| 2016/0096055 A1 * | 4/2016 | Smock | A63B 5/11 |
| | | | 482/27 |
| 2016/0178223 A1 * | 6/2016 | James | F24F 11/001 |
| | | | 165/250 |

FOREIGN PATENT DOCUMENTS

| | | |
|---|---|---|
| EP | 2357421 A2 | 8/2011 |
| JP | 2010266085 A1 | 11/2010 |
| JP | 2012220107 A | 11/2012 |
| WO | 03/073012 A1 | 9/2003 |

OTHER PUBLICATIONS

Eiland, Richard et al., "Air Filter Effects on Data Center Supply Fan Power", 13th IEEE ITHERM Conference, 2012, 317-325 (8 pages).

Frachtenberg, Eitan et al., "Thermal Design in the Open Compute Datacenter", 13th IEEE ITHERM Conference, 2012, 530-539 (9 pages).

Gebrehiwot, Betsegaw et al., "CFD Analysis of Free Cooling of Modular Data Centers", 28th IEEE Semi-Therm Symposium, 2012, 108-111 (4 pages).

Iyengar, Madhusudan et al., "Energy Efficient Economizer Based Data Centers with Air Cooled Servers", 13th IEEE ITHERM Conference, 2012, 367-377 (10 pages).

Li, Pengfei et al., "Entremum Seeking Control for Efficient and Reliable Operation of Air-Side Economizers", American Control Conference, Jun. 10-12, 2009, pp. 20-25.

Scofield, C. M. et al., "Using Wet-Bulb Economizers, Data Center Cooling", ASHRAE Journal, Aug. 2008, 52-58.

MicroMetl Corporation, "MicroMetl Economizers", http:www.micrometl.com/economizers.aspx, at least as early as Dec. 11, 2012, 1 pages.

Plenums Incorporated, "Mixing box units", http://www.plenums.com/mixing_box_units.html, at least as early as Dec. 11, 2012, 1 page.

U.S. Appl. No. 29/450,304, filed Mar. 15, 2013, Robert Kirkendall.

* cited by examiner

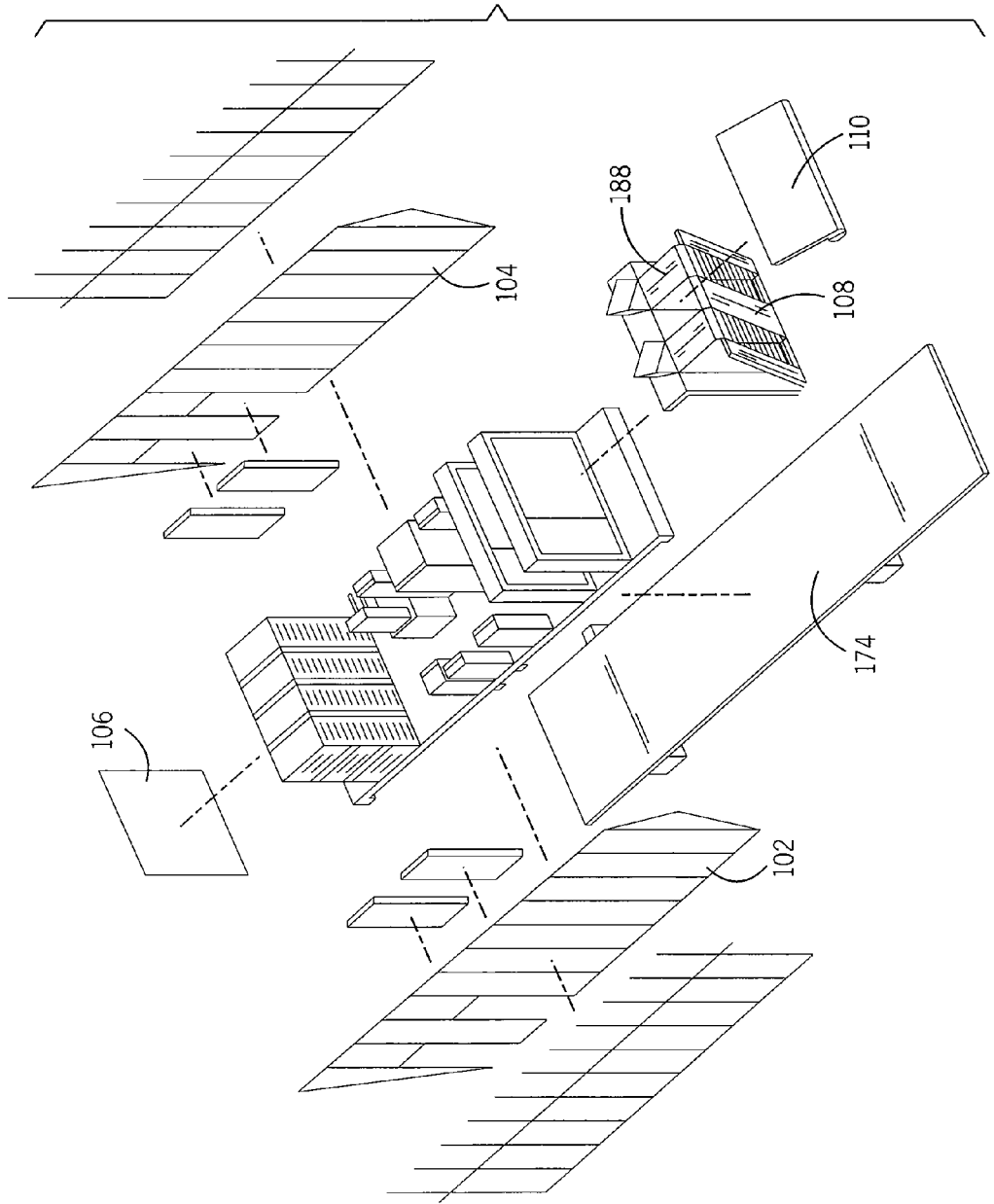

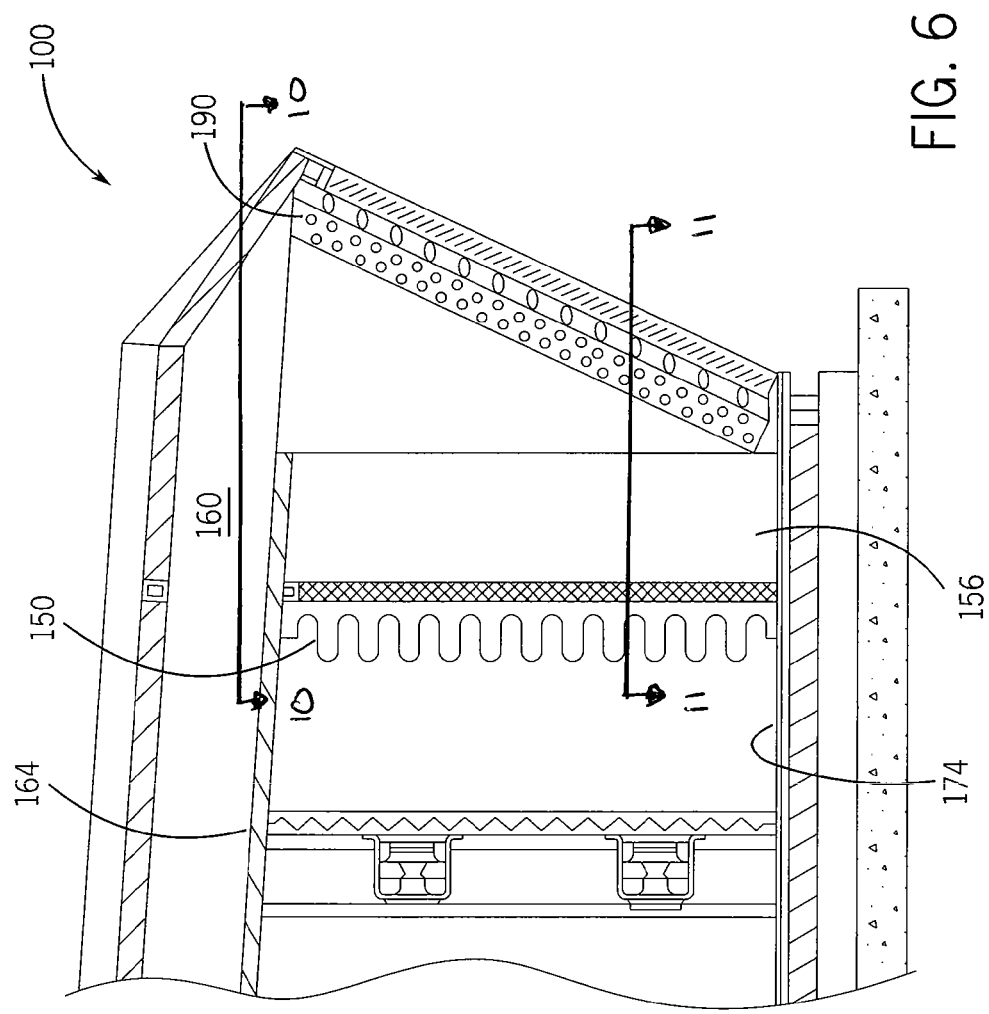

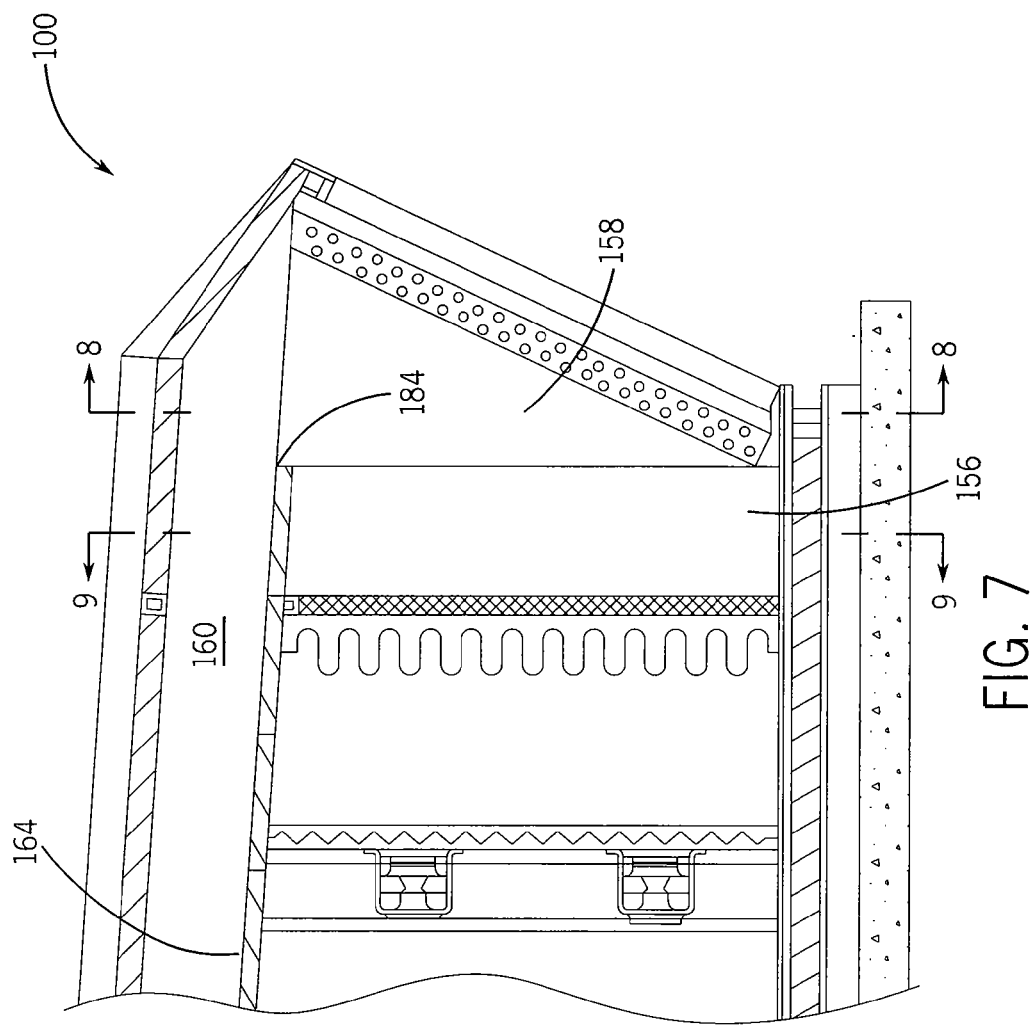

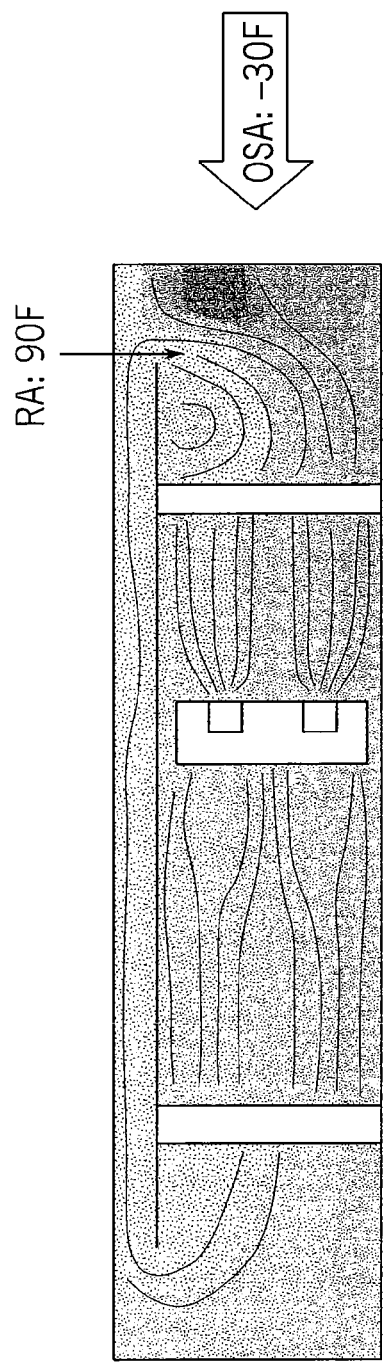
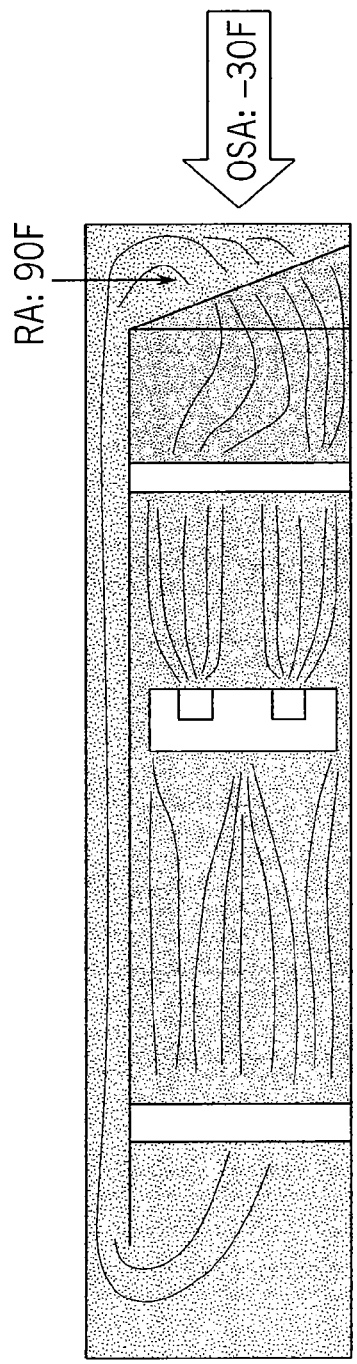
FIG. 14
FIG. 15

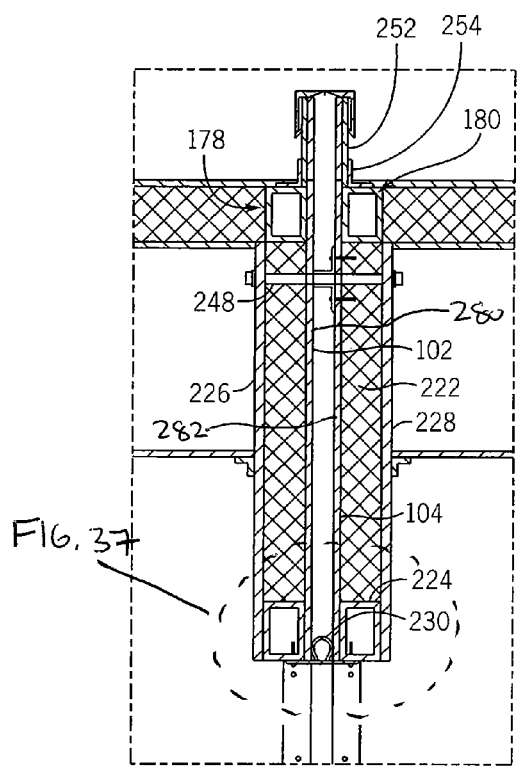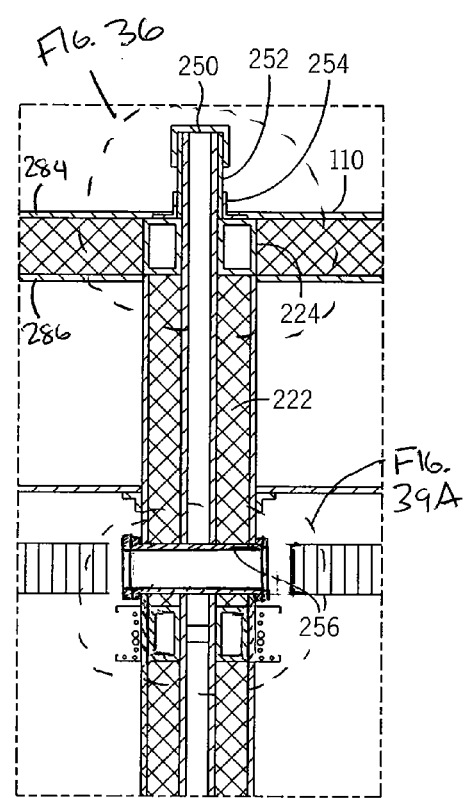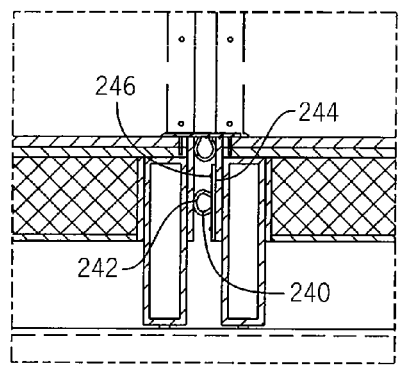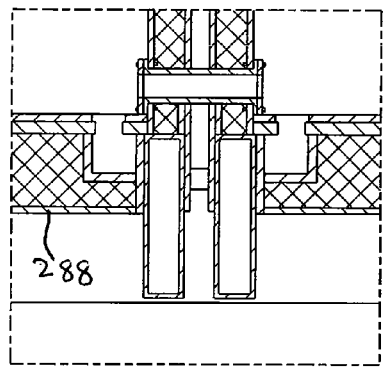
FIG. 34A    FIG. 34B

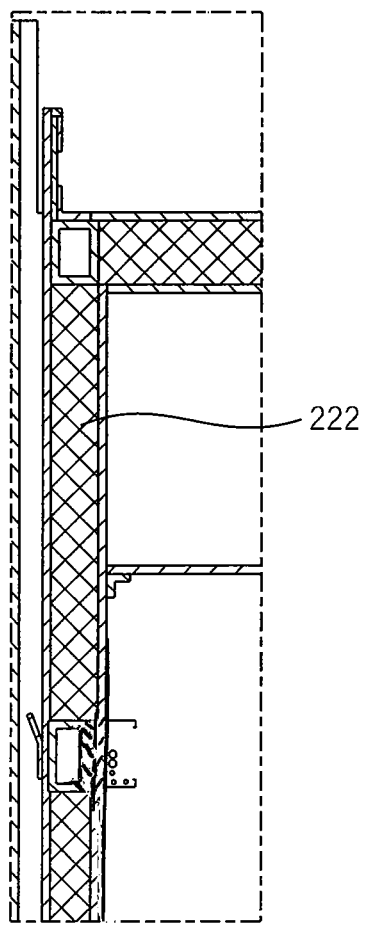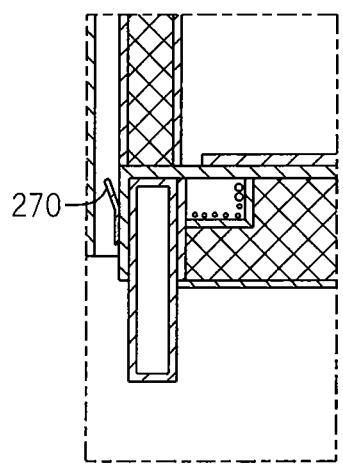
FIG. 35

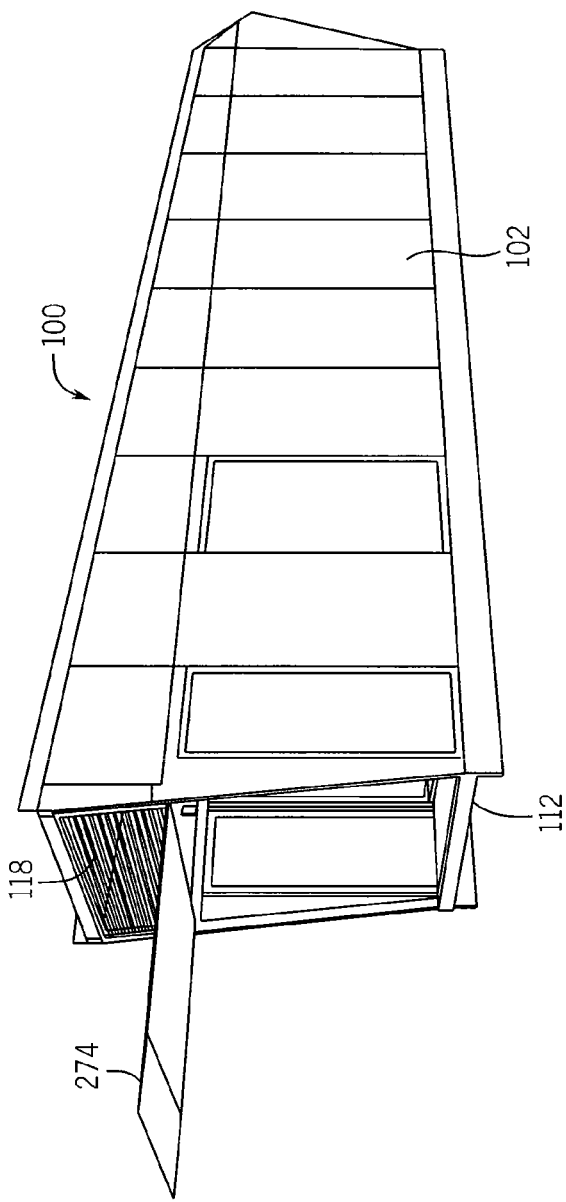
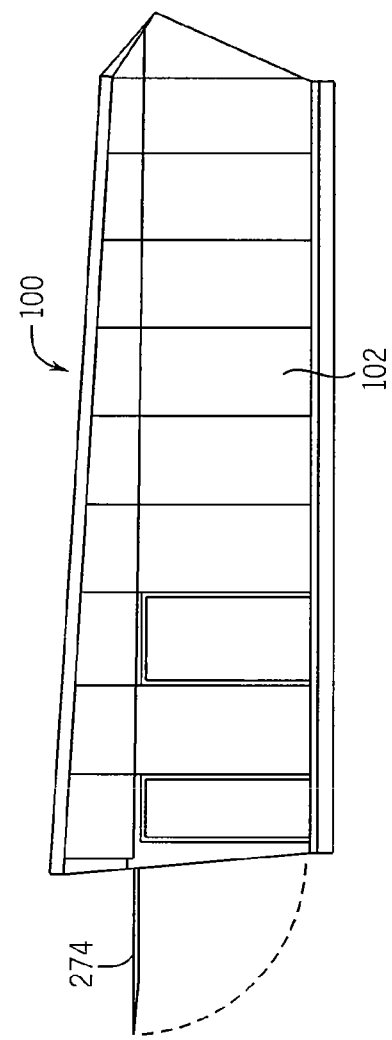
FIG. 48
FIG. 49

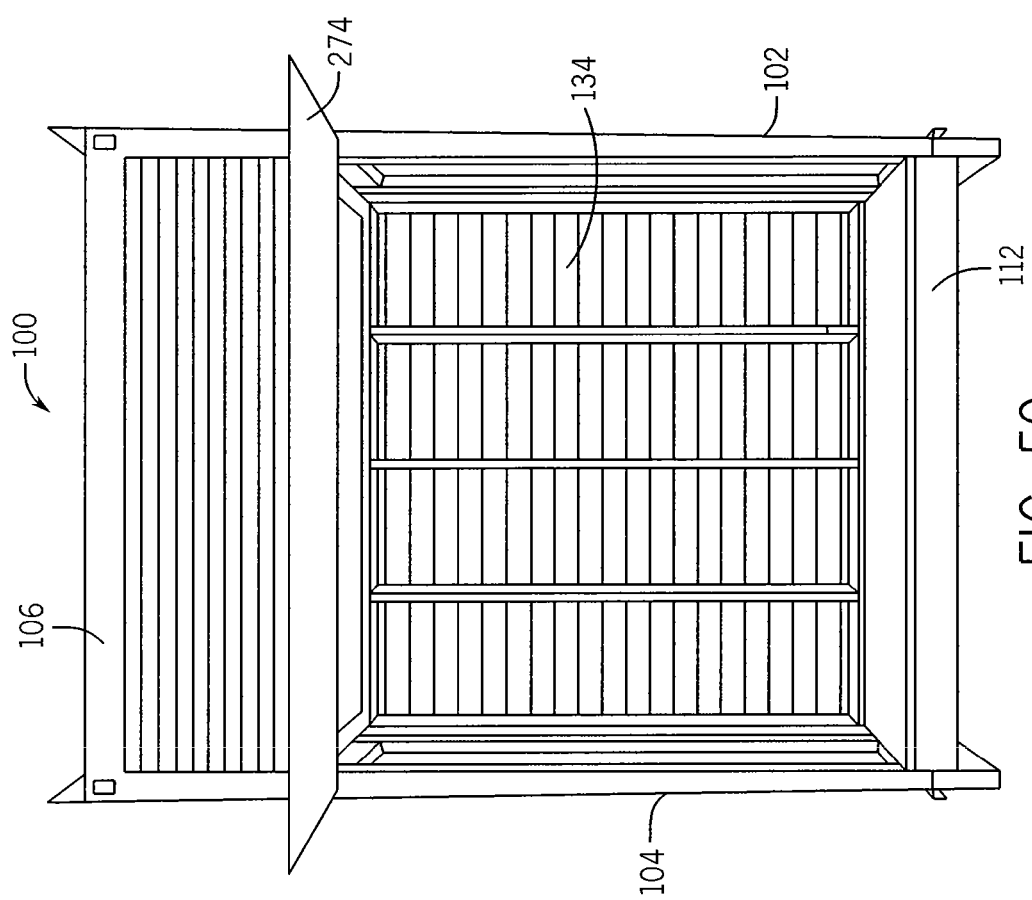

MODULAR POD

CROSS-REFERENCE TO RELATED APPLICATIONS

This application claims the benefit, under 35 U.S.C. 119(e), to U.S. provisional application No. 61/757,596, entitled "Modular Pod" and filed on Jan. 28, 2013, which is hereby incorporated by reference herein in its entirety.

TECHNOLOGICAL FIELD

The technological field generally relates to modular pods, and more particularly to modular pods with interior spaces that are environmentally controlled.

BACKGROUND

By some estimates, 90% of the world's digital data has originated within the last two years. As the amount of digital data continues to increase exponentially, there is a need to rapidly increase the amount of suitable space available for containing servers and associated electrical and mechanical equipment. However, the design of such spaces is often complex because servers and other information technology systems often require placement within suitable environments. As such, there is a need for structures that allow for the relatively rapid addition of space where such space is suitable for servers, electronic equipment, or other types of equipment.

SUMMARY

One embodiment of a modular pod may include two or more walls, a roof, a base, a return air plenum, an air inlet, and an air economizer. The two or more walls, the roof, and the base may define a substantially enclosed interior space. The return air plenum may be positioned within the interior space. The air inlet may be positioned proximate one of the walls. The air economizer may be positioned within the interior space. The air economizer may include a mixing zone and two or more return air shafts. The mixing zone may be in communication with the air inlet. The two or more return air shafts may be in communication with the return air plenum and in communication with the mixing zone. Each return air shaft may taper down from an end of the return air shaft proximate the roof to an end of the return air shaft proximate the base.

In some embodiments, each return air shaft may include at least one wall that includes at least a partially perforated portion that extends from a bottom end portion to a top end portion of the at least one wall. The at least partially perforated portion at the top end portion of the at least one wall may be distal from the return air plenum.

In some embodiments, each return air shaft may include at least one wall that is at least partially perforated. This perforated portion may be distal from another wall of the return air shaft that is proximate the return air plenum.

In some implementations, each return air shaft may include a substantially constant width and a varying length. The length of each return air shaft proximate the roof may be approximately 4 to 8 times greater than the length of each return air shaft proximate the base. In a preferred embodiment, the length of each return air shaft proximate the roof may be approximately 6 times greater than the length of each return air shaft proximate the base.

In some embodiments, three return air shafts may be aligned along one of the walls of the modular pod with one return air shaft centrally positioned between the other two return air shafts, and the centrally positioned return air shaft has approximately double the volume of the other two return air shafts.

In some embodiments, an air diverter may be positioned between the return air plenum and the two or more return air shafts.

In some implementations, at least one damper may be positioned between the air inlet and the mixing zone.

In some embodiments, at least one server rack, an uninterrupted power system, and/or a fan array may be positioned in the interior space downstream of the air economizer. The uninterrupted power system and the fan array may further be positioned between the at least one server rack and the air economizer. The fan array may include at least one fan.

In some embodiments, an air cooling system and/or an air filter may be positioned between the air economizer and the at least one server rack.

In some implementations, the two or more walls may include a first end wall, a second end wall, and a pair of opposing sidewalls that each extend at least between the first end wall and the second end wall. The first end wall may be taller than the second end wall, and the roof may slope downward from the first end wall to the second end wall.

In some embodiments, components of the air economizer, such as the two or more return air shafts, may be positioned proximate the second end wall.

In some implementations, the first end wall and the second end wall may each extend upward from the base at an acute angle relative to vertical.

In some embodiments, at least one doorway may be defined in at least one of the sidewalls at a location closer to the first end wall than the second end wall.

In some embodiments, a first doorway may be defined in one of the sidewalls, and a second doorway may be defined in the other sidewall. The first and second doorways may be located on their respective sidewalls at approximately the same distance from the first end wall.

In some implementations, an architectural skin may be joined to at least one wall of the two or more walls. At least one wall of the two or more walls may include at least one rail. The architectural skin may be joined to the at least one wall of the two or more walls by the at least one rail. The architectural skin may be at least coextensive with the least one wall of the two or more walls.

Another embodiment of a modular pod may include a first end wall, a second end wall, a first sidewall, a second sidewall, a roof, and a base. The first end wall, the second end wall, the first sidewall, the second sidewall, the roof, and the base may define a substantially enclosed interior space. The first end wall may be taller than the second end wall. The first end wall and the second end wall may each extend upward from the base at an acute angle relative to vertical. The first sidewall and the second sidewall may each extend from the first end wall to the second end wall. The roof may slope down from the first end wall to the second end wall.

In some implementations, a first architectural skin may be joined to the first sidewall.

In some embodiments, a second architectural skin may be joined to the second sidewall.

In some embodiments, the second architectural skin may be at least coextensive with the second sidewall.

In some implementations, the second architectural skin may include at least one of two or more horizontal slats or two or more vertical slats.

In some embodiments, the second sidewall may include at least one rail that extends along a substantial portion of a length of the second sidewall, and the at least one rail may be configured to facilitate joining the second architectural skin to the second sidewall.

In some embodiments, the first architectural skin may be at least coextensive with the first sidewall.

In some implementations, the first architectural skin may include at least one of two or more horizontal slats or two or more vertical slats.

In some embodiments, the first sidewall may include at least one rail that extends along a substantial portion of a length of the first sidewall, and the at least one rail may be configured to facilitate joining the first architectural skin to the first sidewall.

In some embodiments, the modular pad may include a first structural frame and a second structural frame. The first sidewall may include two or more panels joined to the first structural frame, and the second sidewall may include two or more panels joined to the second structural frame. In some implementations, the first and second sidewalls are insulated by positioning insulating material between inner and outer panels forming the sidewalls. The roof may be insulated by positioning insulating material between inner and outer roof panels forming the roof, and the base may be insulated by positioning insulating between inner and outer base panels forming the base.

In some implementations, two or more horizontal structural members may be joined the first and second structural frames, and each horizontal structural member may be joined at one of its ends to the first structural frame and at a second distal end to the second structural frame. Each of the two or more horizontal structural members may be located proximate either the first end wall or the second end wall.

In some embodiments, the first end wall may include may include a first end wall, the first end wall panel may be joined by a hinged connection to the first and second structural frames along a top edge of the first end panel to allow the first end wall panel to be pivoted relative to the remaining components of the first end wall in order to selectively create an opening in the first end wall.

An embodiment of a structure for containing equipment may include two or more modular pods. Each modular pod may include a first end wall, a second end wall, a first sidewall, a second sidewall, a roof, and a base. The first end wall, the second end wall, the first sidewall, the roof, and the base may define a substantially enclosed interior space. Each of the modular pods may be arranged so that at least one of the first and second sidewalls of each modular pod is adjacent to one of the first and second sidewalls of another modular pod. Each of the two or more modular pods may be further arranged so that each modular pod includes, in any first or second sidewall that is adjacent to the first or second sidewall of another modular pod, at least one doorway that aligns with a doorway formed in the adjacent first or second sidewall of the other modular pod.

In some embodiments, flexible gaskets may be positioned between any adjacent first and second sidewalls of the two or more modular pods around any aligned doorways in the adjacent first and second sidewalls.

In some implementations, a flexible cable boot may extend between adjacent sidewalls of two of the two or more modular pods.

In some embodiments, each of the two or more modular pods may be approximately the same size as the other modular pods, and adjacent first or second sidewalls may be approximately coextensive with each other.

An embodiment of an air mixing system may include a first air inlet, a second air inlet, a mixing zone, and at least one air shaft. The mixing zone may be in communication with the first air inlet. The at least one air shaft may be in communication with the second air inlet and in communication with the mixing zone. Each air shaft of the at least one air shaft may taper down from a top end of the air shaft to a bottom end of the air shaft.

In some embodiments, each air shaft may include at least one wall that includes at least a partially perforated portion that extends from a bottom end portion to a top end portion of the at least one wall. The at least partially perforated portion at the top end portion of the at least one wall may be distal from the second air inlet.

In some embodiments, each air shaft may include at least one wall that is at least partially perforated, and preferably said perforated portion is distal from another wall of the air shaft that is proximate the second air inlet.

In some implementations, each air shaft may include a substantially constant width and a varying length. Preferably, the length of each air shaft proximate the top end portion of the air shaft may be approximately 4 to 8 times greater than the length of each air shaft proximate the bottom portion of the air shaft. In a preferred embodiment, the length of each air shaft proximate the top end portion of the air shaft may be approximately 6 times greater than the length of each air shaft proximate the bottom portion of the air shaft In some embodiments, the at least one air shaft takes the form of three air shafts horizontally aligned along a common vertical plane with one air shaft centrally positioned between the other two air shafts, and the centrally positioned air shaft has approximately double the volume of the other two return air shafts.

In some embodiments, an air diverter may be positioned between the second air inlet and the at least one air shaft.

In some implementations, at least one damper may be positioned between the first air inlet and the mixing zone.

In some embodiments, the second air inlet is in communication with an air plenum, and the second air inlet is positioned between the air plenum and the at least one air shaft.

In some implementations, the first air inlet is in communication with either a hot air or a cold air supply, and the second air inlet is in communication with a cold air supply when the first air inlet is in communication with a hot air supply and is in communication with a hot air supply when the first air inlet is in communication with a cold air supply. In a preferred embodiment, the first air inlet is communication with a cooler air supply, and the second air inlet is in communication with a warmer air supply.

While multiple embodiments of modular pods, air mixing systems, and other systems and components are disclosed, still other embodiments will become apparent to those skilled in the art from the following detailed description. As will be realized, the various modular pods, air mixing systems, and other systems and components described herein are capable of modifications in various aspects. Accordingly, the drawings and detailed description are to be regarded as illustrative in nature and not restrictive.

BRIEF DESCRIPTION OF THE DRAWINGS

FIG. 5B shows an exploded isometric view of another portion of the modular pod shown in FIG. 1.

FIG. 6 shows a cross-section view of an end portion of the modular pod shown in FIG. 1, viewed along line 6-6 in FIG. 11.

FIG. 7 shows a cross-section view of an end portion of the modular pod shown in FIG. 1, viewed along line 7-7 in FIG. 11

FIG. 14 shows a schematic view of an estimated temperature profile for a modular container that does not incorporate an air economizer as utilized in the modular pod shown in FIG. 1.

FIG. 15 shows a schematic view of an estimated temperature profile for the modular pod shown in FIG. 1.

FIG. 34A shows an enlarged view of a portion the cross-section elevation view of FIG. 33.

FIG. 34B shows a cross-section elevation view of pair of adjacent modular pod, viewed along line 34B-34B in FIG. 30.

FIG. 35 shows an enlarged view of another portion the cross-section elevation view of FIG. 33.

FIG. 48 shows a rear isometric view of a modular pod with a hinged access panel.

FIG. 49 shows a side elevation view of the modular pod shown in FIG. 48.

FIG. 50 shows a rear elevation view of the modular pod shown in FIG. 48.

DETAILED DESCRIPTION

Figure 1:
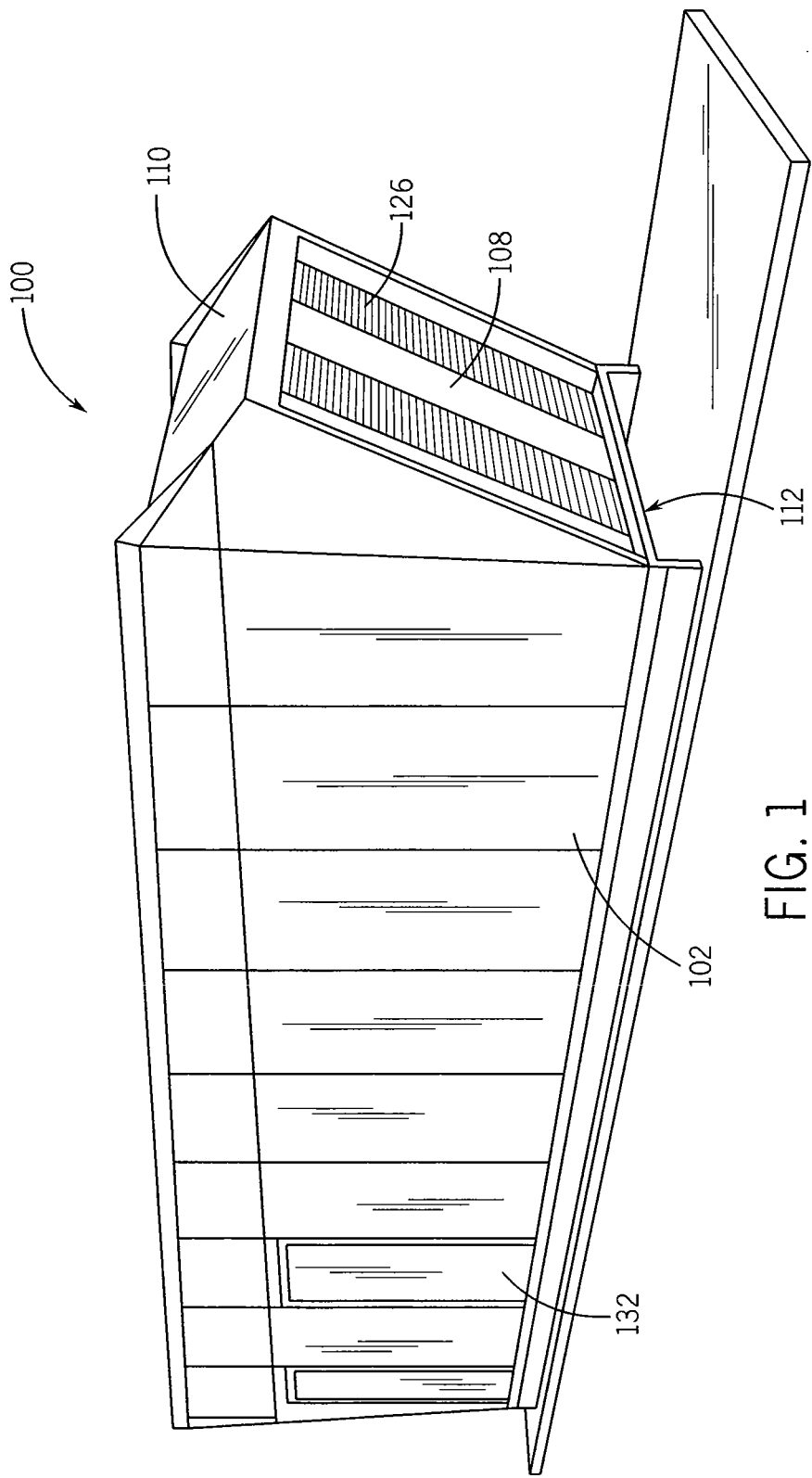
FIG. 1 shows an isometric view of a modular pod.

Described herein are modular pods. These modular pods may be useful for applications that require the housing of equipment that requires controlled environments. For example, the modular pods may be particularly suited as data centers for containing servers, especially densely packed servers, and various equipment associated with the servers. However, these modular pods may also be useful for housing any other equipment that requires placement within a temperature or other controlled environment.

To house temperature sensitive equipment, the modular pods may include an enhanced air cooling system. This enhanced air cooling system allows the modular pods to function in a wide variety of exterior temperatures. In particular, the enhanced air cooling system allows the modular pods to function efficiently in a range of ambient temperatures from extreme cold to extreme hot climates.

In some embodiments, the enhanced air cooling system may include an air economizer. The air economizer may be housed at an end portion of the modular pod and may be configured to mix warm return air with cooler, outside air. Moreover, the air economizer is configured to reduce the tendency of the warm return air and the cool outside air to stratify and resist mixing. In particular, the air economizer is designed to create an environment more conducive to efficient blending of warm and cool air streams by forcing warm air down specifically positioned shafts and through perforated panels where it mixes nearly uniformly with cold outside air.

In addition to providing for temperature control of the interior, the modular pods may further be customizable, expandable, and adaptable. With respect to customization, each modular pod may be assembled from common components to any desired length. Further, each modular pod can accommodate one or more of the following modules: an information technology ("IT") module, an electrical module, an uninterrupted power system ("UPS") module, and a mechanical module. Yet further, each of these modules may be customized based on the particular needs of a user.

With respect to expandability, each modular pod may be joined to another modular pod to form a substantially integrated equipment housing or container system, such as an integrated data center. Further, each modular pod may include various connectors, gaskets, and seals that may be used to create a continuous, watertight environment between adjacent modular pods. Each modular pod may further be configured to provide shared access to other modular pods joined to it.

With respect to adaptability, each modular pod may include a framing system that allows for unique secondary skins to be joined to the modular pod. These secondary skins allow each modular pod to be blended into an existing site or to be branded by the user.

Also described herein is an air mixing system. The air mixing system is configured to facilitate mixing air flows at two different temperatures to form an air flow with a temperature between the two temperatures of the air flows. The air mixing system is further configured to reduce the tendency of the air flows at two different temperatures to stratify and resist mixing. In particular, the air mixing system is designed to create an environment more conducive to efficient blending of air streams at two different temperatures by forcing one of the air streams down specifically positioned shafts and through perforated panels where it mixes more uniformly with the other air stream.

Figure 2:
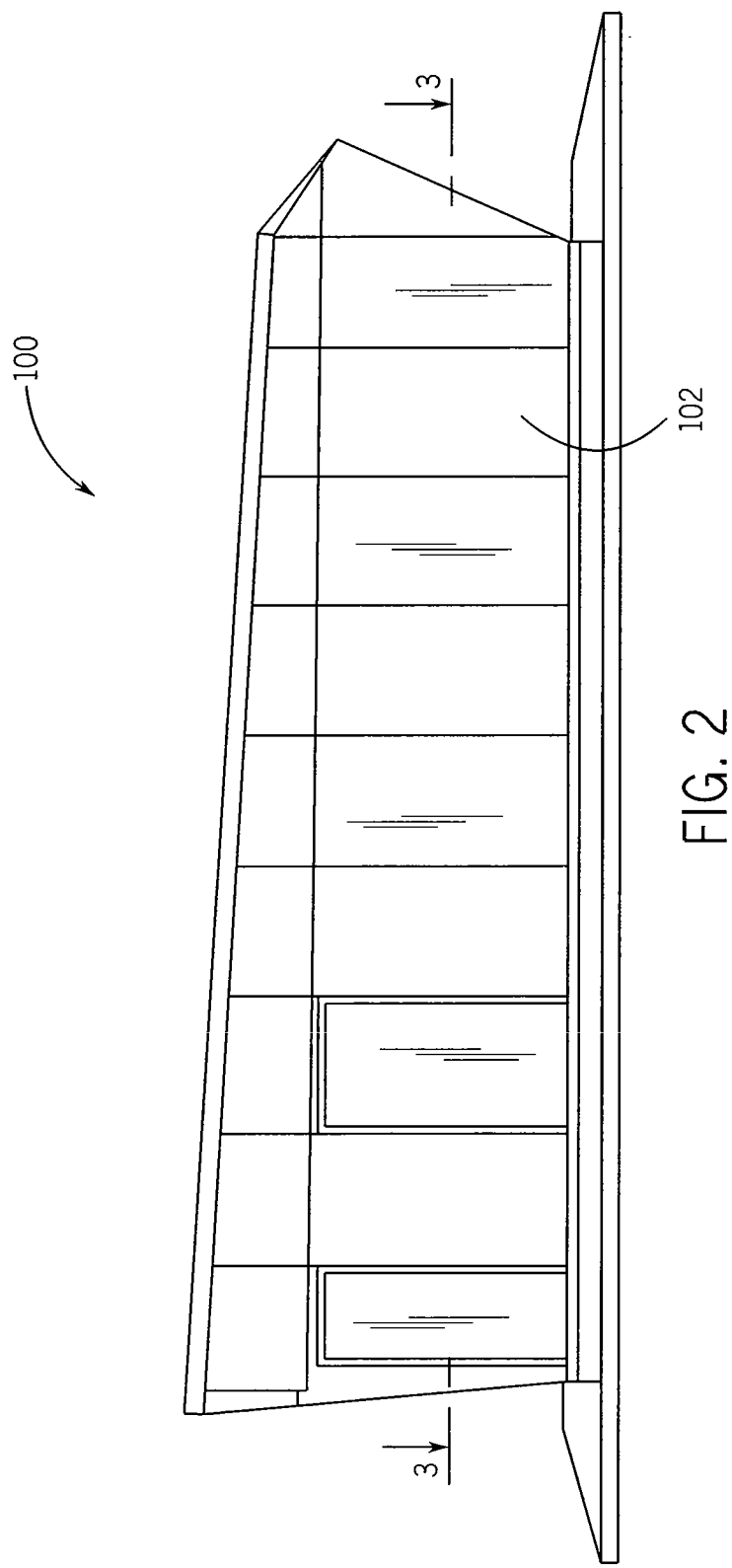
FIG. 2 shows an elevation view of the modular pod shown in FIG. 1.

FIG. 1 shows an isometric view of a modular pod, and FIG. 2 shows an elevation view of the modular pod. The modular pod 100 may be supported on the ground or on a foundation, such as a concrete pad or the like. The modular pod 100 may include spaced apart first and second sidewalls 102, 104, spaced apart first and second end walls 106, 108, a roof 110, and a base 112. Each sidewall 102, 104 and each end wall 106, 108 may span vertically, or substantially vertically, from the base 112 to the roof 110. Further, each sidewall 102, 104 may span horizontally from the first end wall 106 to the second end wall 108. Collectively, the sidewalls 102, 104, the end walls 106, 108, the roof 110, and the base 112 define an enclosed space, which may be referred to as an interior space.

The first and second end walls 106, 108 may each extend upward from the base 112 at an acute angle as measured from vertical. The measured angle between vertical and the first end wall 106 may be less than the measured angle between vertical and the second end wall 108. However, the measured angles could be the same, or the measured angle between vertical and the first end wall 106 may be greater than the measured angle between vertical and the second side wall 108. Further, the measured angle (as viewed from the first sidewall 102 side) between vertical and the first end wall 106 may be positive, while the measured angle between vertical and the second end wall 108 may be negative. As such, each of the first and second end walls 106, 108 may generally extend vertically outwardly away from the ends of the base 112 (i.e., away from the interior space). In other words, the end portions of the first and second end walls 106, 108 proximate the base 112 are closer together than the end portions of the first and second ends walls 106, 108 proximate the roof 110. However, if desired, either or both of the first and second end walls 106, 108 could extend vertically away from the ends of the base 112 (i.e., orthogonal to the base 112), either or both of the first and second end walls 106, 108 may extend generally vertically inwardly from the ends of the base 112 (i.e., towards the interior space), or the first and second end walls 106, 108 may extend away from the ends of the base 112 in any combination of vertically, outwardly away, or inwardly from the base 112. For the second end wall 108, the angle may be a function of the amount of airflow through return air shafts and the height of those shafts in order maximize the static pressure regain of the airstream as it travels down the return shafts and through perforated openings in the return shafts.

The distance that the first end wall 106 extends away from the base 112 may be greater than the distance that the second end wall 108 extends away from the base 112. In other words, the first end wall 106 may be taller than the second end wall 108. In such embodiments, the roof 110 may be configured to slope in a downward direction from the first end wall 106 to the second end wall 108. Further, the roof 110 may slope downwardly at different inclinations. For example, and with reference to FIG. 4, among other figures, a first portion 114 of the roof 110 may extend from the top of the first end wall 106 to a first area of the roof 110 that is approximately vertically aligned with the end of the base 112 distal from the first end wall, and a second portion 116 of the roof 110 may extend from this first area of the roof 110 to the top of the second end wall 108. Further, the first portion 114 of the roof 110 may slope downward at a first angle relative to horizontal, and the second portion 116 of the roof may slope downward at a second angle relative to horizontal. Yet further, the first angle of the first roof portion 114 may be less than the second angle of the second roof portion 116. In other words, the downward slope of the second portion 116 of the roof 110 may be greater than the downward slope of the first portion 114 of the roof 110. However, if desired, the roof 110 may have a constant slope from the top of the first end wall 106 to the top of the second end wall 108, the first portion 114 of the roof 110 may have a greater downward slope than the second portion 116 of the roof 110, the first and second portions 114, 116 of the roof 110 may occur at different locations of the roof 110, the roof 110 may include three or more portions with differing downward slopes, or the roof 110 may have some combination of any of the foregoing changes.

Figure 4:
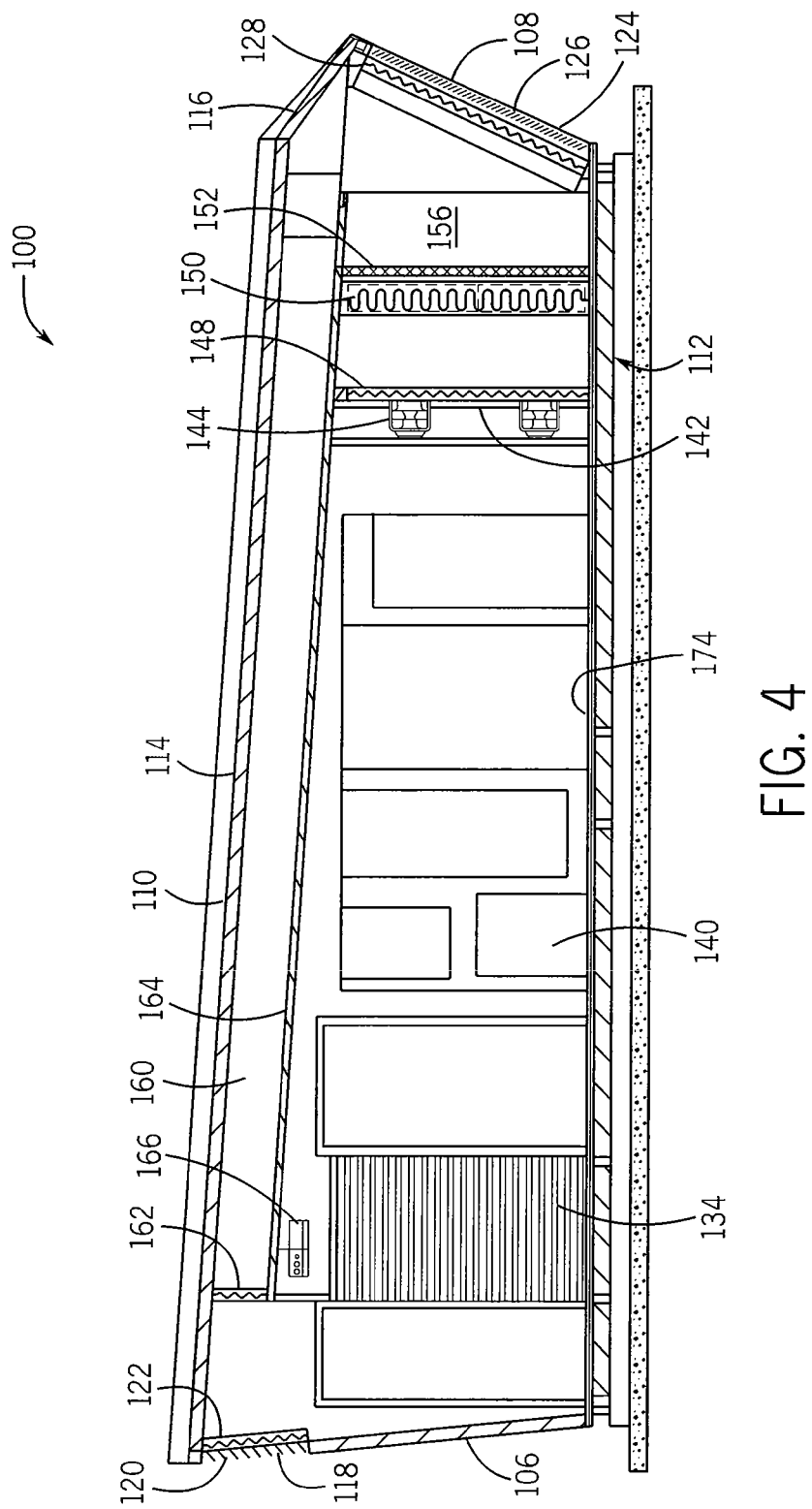
FIG. 4 shows a vertical cross-section view of the modular pod shown in FIG. 1, viewed along line 4-4 in FIG. 3.

With reference to FIGS. 1, 2, and 4, the first end wall 106 may include a first end wall opening 118, which may function as an air outlet. The first end wall opening 118 may be formed in a portion of the first end wall 106 that is proximate to the roof 110 and may extend from approximately the first sidewall 102 to the second sidewall 104. A first architectural louver 120 or the like may be positioned in the first end wall opening 118. Further, a first end wall damper 122 or the like may be positioned adjacent to the first architectural louver 120 within the interior space of the modular pod 100. The first end wall damper 122 may be sized to be co-extensive with the first end wall opening 118 and/or the first architectural louver 120.

The second end wall 108 may include one or more second end wall openings 124. Each second end wall opening 124 may function as an air inlet. Further, each second end wall opening 124 may generally extend from approximately the bottom to approximately the top of the second end wall 108. Yet further, if there is more than one second end wall opening 124, each second end wall opening 124 may be approximately the same size of the other second end wall openings 124. For each second end wall opening 124, a second architectural louver 126 or the like may be positioned within the second end wall opening 124. Further, for each second end wall opening 124, a second end wall damper 128 or the like may be positioned adjacent to the second architectural louver 126 within the interior space of the modular pod 100. Each second end wall damper 128 may be sized to be co-extensive with its respective second end wall opening 124 and/or second architectural louver 126. With reference to FIG. 1, two second end wall openings 124 are shown, and thus there are also two second end wall architectural louvers 126 and two second end wall dampers 128. However, the number of second end wall openings 124 may be more or less than two, and thus there may also be more or less than two second architectural louvers 126 and more or less than two second end wall dampers 128.

Figure 3:
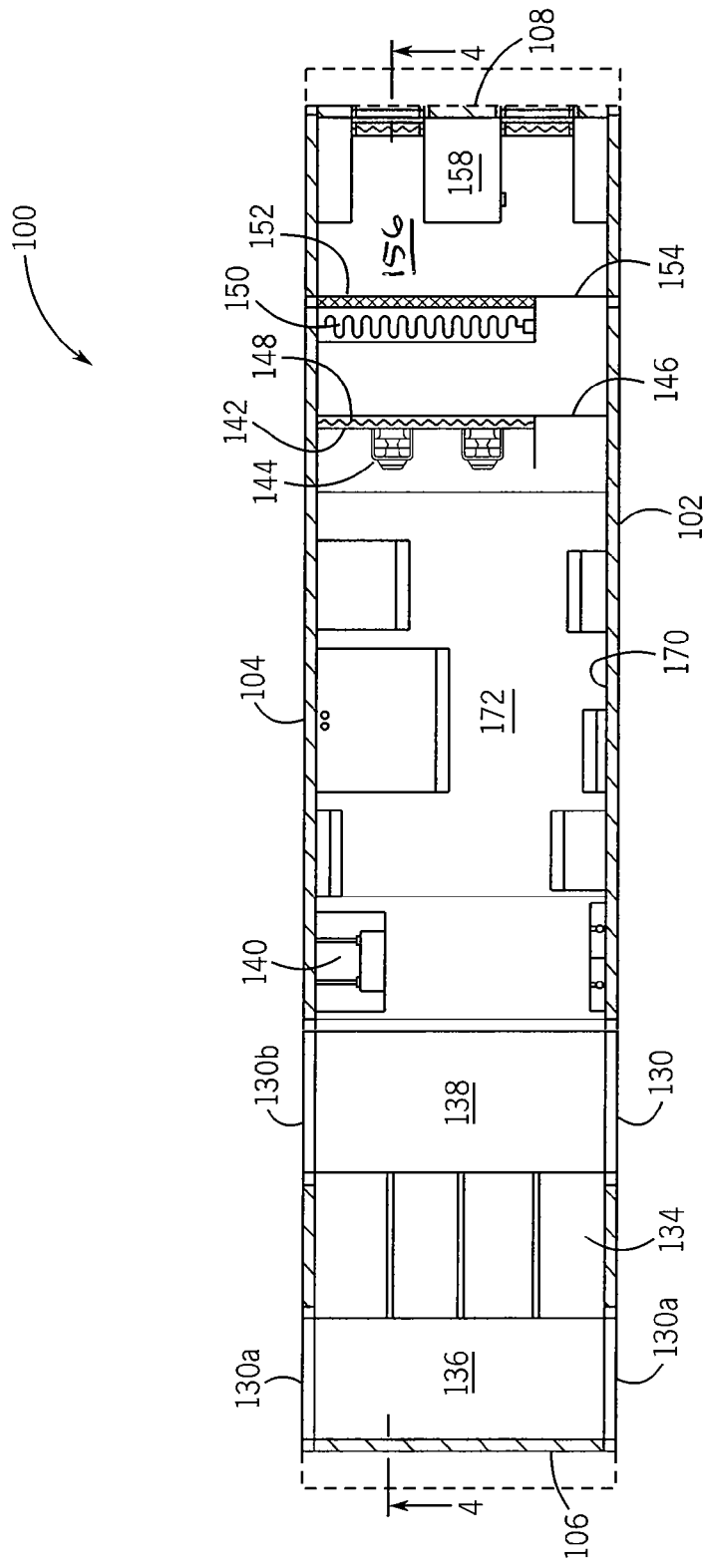
FIG. 3 shows a schematic cross-section plan view of the interior of the modular pod shown in FIG. 1, viewed along line 3-3 in FIG. 2.

With reference to FIGS. 1, 2, and 3, the first and second sidewalls 102, 104 may each generally span between and slightly beyond the first and second end walls 106, 108. In other words, the first and second end walls 106, 108 may be slightly recessed relative to the first and second sidewalls 102, 104. Further, the first and second sidewalls 102, 104 may generally span from the base 112 to a predetermined distance above the roof 110. As such, each of the first and second sidewalls 102, 104 may form a parapet along the respective edges of the roof 110 that are adjacent to the first and second sidewalls 102, 104.

The length of each of the first and second sidewalls 102, 104 of the modular pod 100 may vary along the elevation of each of the sidewalls 102, 104. In some embodiments, the length of each of the first and second sidewalls 102, 104 may increase as the elevation of the sidewalls 102, 104 from the base 112 increases until the top of the second end wall 108 is reached. At the top of the second end wall 108, the length of each of the first and second sidewalls 102, 104 may generally decrease towards the top of the first and second sidewalls 102, 104. Thus, the maximum length of the first and second sidewalls 102, 104 may occur at the elevation of the first and second sidewalls 102, 104 that is approximately the same as the elevation of the top of the second end wall 108. However, the lengths of the first and second sidewalls 102, 104 at any elevation relative to the base 112 may be a function of the slopes and heights of the first and second end walls 106, 108, the slope or slopes of the roof 110, and the length of the base 112. Thus, the lengths of the first and second side walls 102, 104 may vary from embodiment to embodiment as a function of the characteristics of the first and second end walls 106, 108, the roof 110, and the base 112. For example, the lengths of each of the first and second sidewalls 102, 104 may be substantially constant along the elevation of each sidewall 102, 104 if the first and second end walls 106, 108 extend vertically away from the base 112. As another example, the lengths of the first and second sidewalls 102, 104 may decrease as their elevation from the base 112 increases if the first and second end walls 106, 108 are configured to slope towards the central portion of the base 112 as they extend upwardly away from the base 112.

To access the interior space, openings 130, such as doorways, may be formed in the sidewalls 102, 104. Generally, the openings 130 are sized to be sufficiently large to allow a person to pass through the opening 130. Proximate each opening 130, a door 132 may be joined to respective sidewalls 102, 104 to allow for the respective opening 130 to be selectively opened and closed. Each door 132 may include a locking mechanism to prevent unauthorized access to the interior space of the modular pod 100.

FIG. 3 shows a schematic cross-section plan view of the interior space of the modular pod 100, and FIG. 4 shows a schematic vertical cross-section view of the modular pod 100. With reference to FIGS. 3 and 4, the interior space may include one or more of the following:
 1. server racks 134 (e.g., 4 server racks);
 2. hot access aisle 136 (may be generally aligned with a pair of doorways 130a, each doorway 130a positioned in one of the sidewalls 102, 104 at approximately the same distance from the first end wall 106);
 3. cold access aisle 138 (may be generally aligned with a second pair of doorways 130b, each doorway 130b positioned in one of the sidewalls 102, 104 at approximately the same distance from the first end wall 106);
 4. electrical equipment 140;
 5. a fan array 142 with fans 144;
 6. a fan array hinged access panel 146;
 7. a fan array damper 148;
 8. an air cooling system 150;
 9. air filters 152;
 10. a mixing chamber hinged access panel 154;
 11. an air mixing chamber 156;
 12. return air shafts 158;
 13. a mechanical return air plenum 160;
 14. a return airflow damper 162;
 15. a ceiling 164;
 16. a cable tray 166; and
 17. ceiling support struts (e.g., steel angle) or other support members.

The server racks 134 may be located within a portion of the interior space that is closer to the first end wall 106 than the second end wall 108. The hot access aisle 136 may be positioned on one side of the server racks 134, and the cold access aisle 138 may be positioned on the other side of the server racks 134. The hot and cold access aisles 136, 138 provide access to the server racks 134.

The hot access aisle 136 may be located between the first end wall 106 and the server racks 134 and may extend from the first sidewall 102 to the second sidewall 104. Further, hot access aisle doorways 130a, one formed in the first sidewall 102 and another formed in the second sidewall 104, may be aligned with the hot access aisle 136. Each hot access aisle doorway 130a may be located at one end of the hot access aisle 136 in order to provide access to the hot access aisle 136 from outside the modular pod 100. The hot access aisle 136 may further have a width that is approximately the same as, or larger than, the width of the hot access aisle doorways 130a formed in the first and second sidewalls 102, 104.

The cold access aisle 138 may be located adjacent to the server racks 134 between the server racks 134 and the second end wall 108. Similar to the hot access aisle 136, the cold access aisle 138 may extend between the first sidewall 102 and the second sidewall 104. Also, similar to the hot access aisle 136, cold access aisle doorways 130b, one formed in the first sidewall 102 and another formed in the second sidewall 104, may be aligned with the cold access aisle 138. Each cold access aisle doorway 130b may be located at one end of the cold access aisle 138 in order to provide access to the cold access aisle 138 from outside the modular pod 100. The cold access aisle 138 may further have a width that is approximately the same as, or larger than, the width of the cold access aisle doorways 130b formed in the first and second sidewalls 102, 104.

Electrical or other equipment 140, such as equipment for the uninterrupted power system, may be positioned between the cold access aisle 138 and the second end wall 108. The electrical equipment 140 may be positioned next to interior walls 170 that are adjacent to either the first sidewall 102 or the second sidewall 104. Such positioning creates a central pathway 172 within the central portion of the interior space that runs from the cold access aisle 138 to the fan array 142, which may be positioned between the electrical equipment 140 and the second end wall 108. This central pathway 172 that runs longitudinally along the modular pod 100 may be sufficiently wide to allow an individual to walk from the cold access aisle 138 to the fan array 142. Further, this central pathway 172 allows a user to access any of the electrical or other equipment 140 positioned between the cold access aisle 138 and the fan array 142.

The base 112 may include a floor 174 supported by a subfloor and floor structural supports, such as beams or joists. The fan array 142 may extend generally between and transverse to the first and second sidewalls 102, 104, the floor 174, and the ceiling 164. The fan array 142 may include one or more openings to allow for the flow of air through the fan array 142. One or more fans 144 may be mounted to the fan array 142. The fans 144 may be configured to circulate air from the air mixing chamber 156 to the electrical and information technology ("IT") portions of the modular pod 100 that house the electrical equipment 140 and server racks 134, respectively. This arrangement allows for cooled air to be passed over the electrical equipment 140 and through the server racks 134. The fan array 142 may further include the fan array hinged access panel 146. The fan array hinged access panel 146 is sufficiently large to allow a person to enter into the space between the fan array 142 and the second end wall 108 in order to access the mechanical and other equipment positioned within this space.

The fan array damper 148 may be positioned immediately adjacent to the fan array 142 and located between the fan array 142 and the second end wall 108. The fan array damper 148 may extend from approximately the fan array hinged access panel 154 to one of the first and second sidewalls 102, 104 of the modular pod 100 and from the floor 174 to the ceiling 164 of the modular pod 100. The fan array damper 148 may be configured to allow for the amount of cooled air flowing from the air mixing chamber 156 to the electrical and IT portions of the modular pod 100 to be controlled.

The air cooling system 150, such as a cooling coil, an alternative evaporative system, or other suitable air cooling system, may be positioned between the fan array damper 148 and the second end wall 108. The air cooling system 150 may generally parallel the fan array damper 148 and be generally co-extensive with the fan array damper 148. The air cooling system 150 may be spaced apart from the fan array damper 148 by a sufficient distance to allow a person to walk between the air cooling system 150 and the fan array damper 148. The air cooling system 150 may be configured to condition air that passes through the air cooling system 150 from the air mixing chamber 156 to a desired temperature to the extent that air from the air mixing chamber 156 requires further temperature adjustment. In some embodiments, the air may be conditioned to be between approximately 65 to 80 degrees Fahrenheit, and preferably to approximately 70 degrees Fahrenheit.

The air filters 152 may be positioned immediately adjacent to the air cooling system 150 and located between the air cooling system 150 and the second end wall 108. The air filters 152 may extend from approximately the mixing chamber hinged access panel 154 to one of the first and second sidewalls 102, 104 of the modular pod 100 and from the floor 174 to the ceiling 164 of the modular pod 100. The air filters 152 are configured to remove dust and other contaminants from the air flowing from the air mixing chamber 156 to the electrical and IT portions of the modular pod 100 prior to the air passing through the air cooling system 150. The mixing chamber hinged access panel 154, which may be positioned between the air filters 152 and one of the first and second sidewalls 102, 104 of the modular pod 100, is sufficiently large to allow a person to enter into the air mixing chamber 156.

The air mixing chamber 156 may be positioned between the air filters 152 and the second end wall 108. The air mixing chamber 156 may be in fluid communication with the return air shafts 158, which may be positioned next to the second end wall 108. Each return air shaft 158 may, in turn, be in fluid communication with the mechanical return air plenum 160, which supplies return air to the return air shafts 158.

Figure 5A:
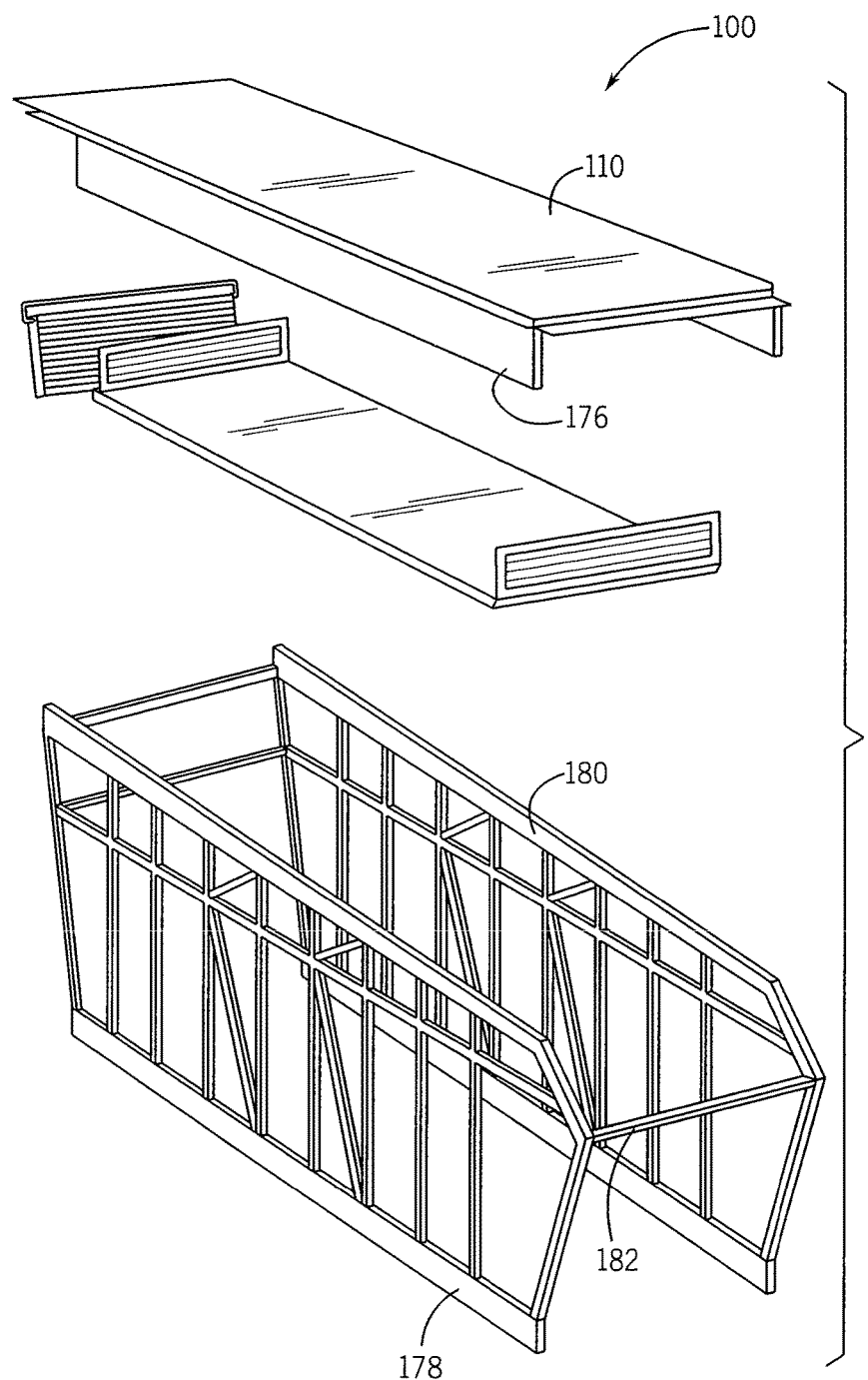
FIG. 5A shows an exploded isometric view of a portion of the modular pod shown in FIG.
Figure 8:
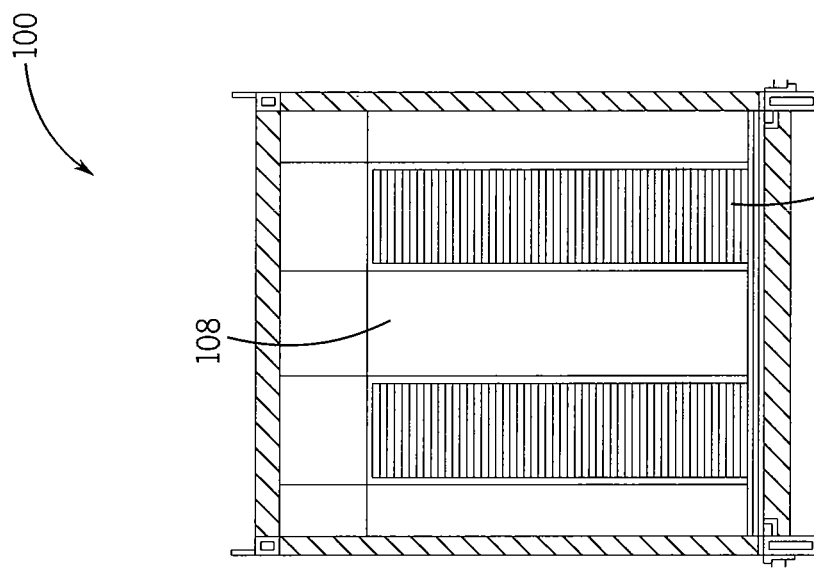
FIG. 8 shows a cross-section view of the modular pod shown in FIG. 1, viewed along line 8-8 in FIG. 7.
Figure 9:
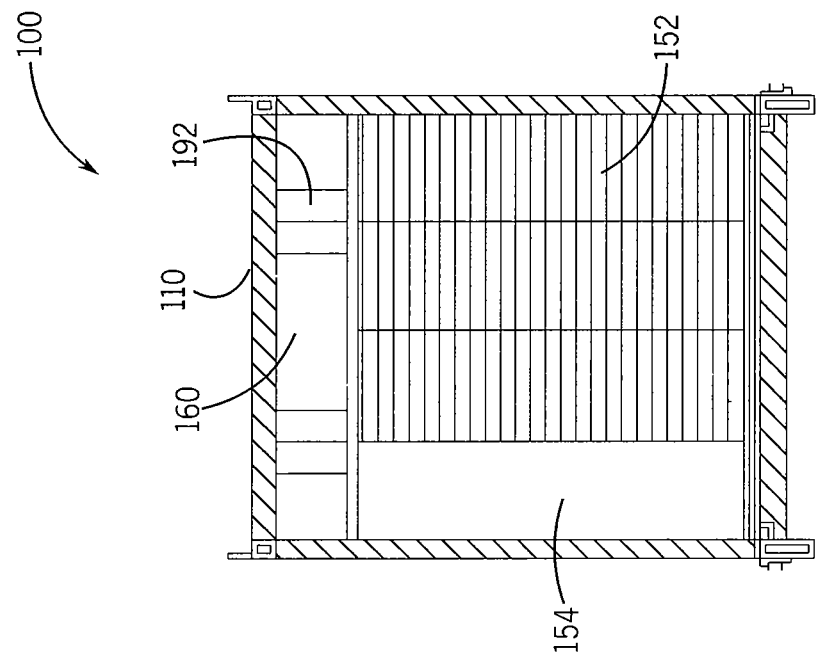
FIG. 9 shows a cross-section view of the modular pod shown in FIG. 1, viewed along line 9-9 in FIG. 7.
Figure 10:
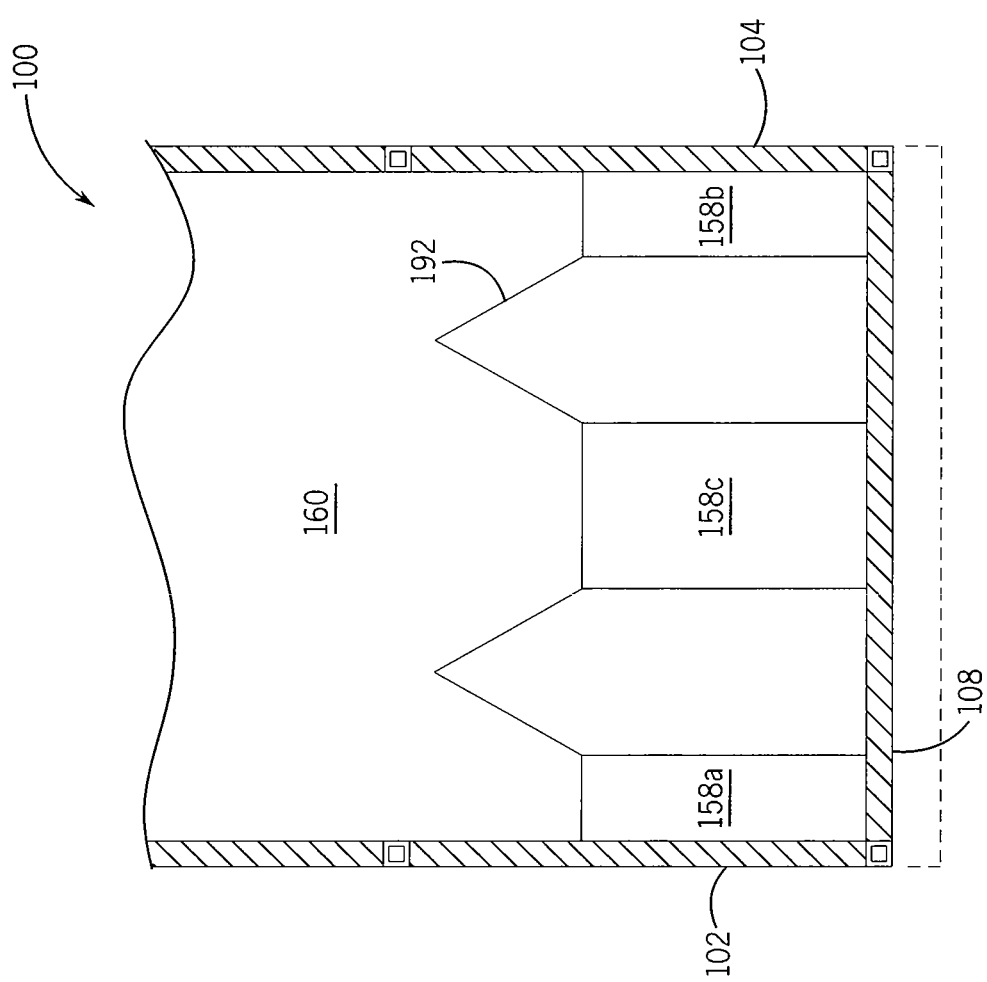
FIG. 10 shows a cross-section view of an end portion of the modular pod shown in FIG. 1, viewed along line 10-10 in FIG. 6.
Figure 11:
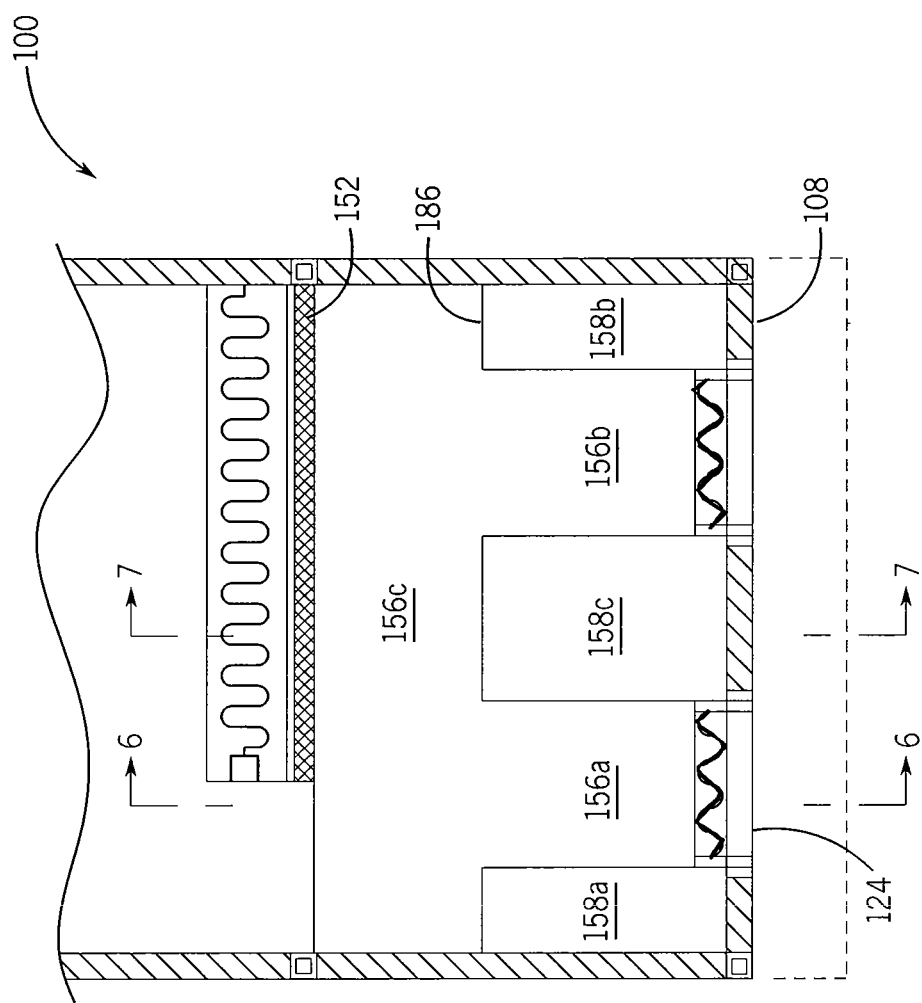
FIG. 11 shows a cross-section view of an end portion of the modular pod shown in FIG. 1, viewed along line 11-11 in FIG. 6.

The mechanical return air plenum 160 may extend from the return air shafts to the hot access aisle 136. The mechanical air plenum 160 may be generally defined by an interior panel for the roof 110, the ceiling 164, and a pair of air plenum members 176, which may take the form of plates or the like. With reference to FIGS. 4 and 5A among other figures, each air plenum member 176 may be positioned next to one of the first and second sidewalls 102, 104 and may extend vertically between the roof 110 and the ceiling 164 and horizontally from the return air shafts 158 to the hot access aisle 136. Returning to FIGS. 3 and 4, the slope of the ceiling 164 may correspond to the slope of the first portion 114 of the roof 110 so that the cross-sectional area of the mechanical return air plenum 160 remains substantially constant along its length.

The return airflow damper 162 may be positioned between the ceiling 164, the roof 110, and the first and second sidewalls 102, 104 at the end of the mechanical return air plenum 160 that is proximate the hot access aisle 136. The return airflow damper 162 may be configured to control the amount of air flowing into the mechanical return air plenum 160. This, in turn, allows for the amount of return air delivered to the air mixing chamber 156 via the return air shafts 158 to be controlled.

The ceiling 164 may extend from the side of the server racks 134 that is adjacent to the hot access aisle 136 to the ends of the return air shafts 158 that are distal from the second end wall 108. Further, along its length, the ceiling 164 may extend between the first and second sidewalls 102, 104, thus separating the mechanical return air plenum 160 from the electrical and IT portions of the modular pod 100. Further, as described above, the ceiling 164 may generally have a slope that matches the slope of the first portion 114 of the roof 110. As such, the ceiling height as measured from the floor 174 gradually decreases from the first end wall 106 to the second end wall 108 of the modular pod 100. In other words, the IT portion of the modular pod 100, which houses the server racks 134, may have a greater ceiling height than the electrical portion of the modular pod 100, which may house the uninterrupted power system. Further, the ceiling height may be selected so that there is adequate clearance between the top of the server racks 134 and the ceiling 164 to accommodate the cable tray 166 or the like that is supported by the ceiling support members that provide structural support for the ceiling 164. The ceiling support members, in turn, may be supported by the structural members for the first and second sidewalls 102, 104.

Referring the FIGS. 5A and 5B, the modular pod 100 may include a first structural frame 178 and a second structural frame 180. The first structural frame 178 may be positioned to be adjacent to the first sidewall 102 and may extend from the first end wall 106 to the second end wall 108 in order to provide structural support for the first sidewall 102, and the second structural frame 180 may be positioned to be adjacent to the second sidewall 104 and may extend from the first end wall 106 to the second end wall 108 in order to provide structural support for the second sidewall 104. The first and second structural frames 178, 180 may also provide structural support for the roof 110, the ceiling 164, and the first and second end walls 106, 108. To structurally join the first and second frame structures 178, 180, horizontal structural members 182 may span between the first and second structural frames 178, 180. In some embodiments, one or more of the horizontal members 182 may be positioned at the ends of the first and second structural frames 178, 180 that are proximate to the first and second end walls 106, 108 of the modular pod 100. The first and second structural frames 178, 180 may each include various horizontal, vertical, and diagonal members that are arranged as needed to structurally support other components of the modular pod 100. The horizontal structural members 182 and the horizontal, vertical and diagonal members of the first and second structural frames 178, 180 may be any suitable structural element, including, but not limited to, steel tubes (square or circular), channels, angles, W-shapes, H-shapes, tees, and so on.

With continued reference to FIGS. 5A and 5B, the first and second sidewalls 102, 104 may be formed using one or more panels or plates. For each sidewall, each panel or plate may be shaped as needed (e.g., rectangular or triangular shaped) to define the overall shape of the sidewalls 102, 104 and may be joined to the structural frames 178, 180 that support the sidewalls 102, 104 by any suitable connection method, including, but not limited to, welds or mechanical fasteners. Similarly, the roof 110, floor 174, the first end wall 106, and the second end wall 108 may be formed using one or more panels or plates that are shaped as need to define the overall shape of the roof 110, the floor 174, or the end walls 106, 108. With respect to the second end wall 108, the one or more panels or plates may be arranged and joined together to define the second end wall 108, the second end wall openings 124, and the return air shafts 158. Further, the panels and plates for the roof 110, the floor 112, the first end wall 106, and the second end wall 108 may be joined to one of the structural frames 178, 180 or to other structural members (e.g., floor joists or beams for the floor 174 or ceiling angles for the ceiling 164). The panels or plates for the sidewalls 102, 104, the floor 174, the roof 110, and the end walls 106, 108 may be formed using any suitable material, including, but not limited to, steel or other metal, concrete, or wood.

With reference to FIGS. 6-11, the modular pod 100 may include an air economizer, such as an air economizer mixing box or the like. The air economizer mixes cooler air, such as cooler outside air, with warmer air, such as warm return air from the servers, to provide a non-stratified, substantially uniform temperature air supply to equipment positioned downstream of the air economizer. In some embodiments, the volume of air flow within the modular pod is designed at 10,000 c.f.m. (cubic feet per minute) to accommodate at 20 degree Fahrenheit temperature rise across four server racks that generate 60 kW of heat. In some embodiments, the air economizer is capable of mixing warm return air, which may be in excess of 110 degrees Fahrenheit, with a range of outside air temperatures, which are generally less than the temperature of the warmer return air, to produce an air stream with a substantially uniform temperature, which in some embodiments may range from 65 to 80 degrees Fahrenheit. This substantially uniform temperature air stream may be supplied to equipment, such as servers, located downstream of the air economizer.

The air economizer may include an air mixing system. The air mixing system may include a mixing zone, such as the air mixing chamber 156, and air shafts, such as the return air shafts 158. In a preferred embodiment, there are three return air shafts 158. However, other embodiments of the air economizer may utilize more or less than three return air shafts 158. In general, the size and number of return air shafts 158 may be selected to provide good lateral distribution of return air to the air mixing chamber 156.

Each return air shaft 158 extends vertically from the floor 174 to the bottom 184 of the mechanical return air plenum 160, which is located above the ceiling 164 of the modular pod 100. In embodiments with three return air shafts 158, there may be a first sidewall return air shaft 158a, a second sidewall return air shaft 158b, and a center return air shaft 158c. The first sidewall return air shaft 158a may be positioned adjacent to the first sidewall 102 and the second end wall 108, the second sidewall return air shaft 158b may be positioned adjacent to the second sidewall 104 and the second end wall 108, and the center sidewall return air shaft 158c may be positioned along the second end wall 108 between the first and second sidewall return air shafts 158a, 158b.

The center sidewall return air shaft 158c may be separated from the first and second sidewall return air shafts 158a, 158b by the air mixing chamber 156. In particular, the air mixing chamber 156 may generally include a first air mixing chamber portion 156a that is located between the first sidewall return air shaft 158a and the center return air shaft 158c, a second air mixing chamber portion 156b that is located between the second sidewall return air shaft 158b and the center return air shaft 158c, and a third air mixing chamber portion 156c that is generally located between the air filters 152 and the ends 186 of the return air shafts 158 that are distal from the second end wall 108. Further, the first and second air mixing chamber portions 156a, 156b may each have a width that generally aligns with and matches the width of one of the second end wall openings 124, and the first, second, and third air mixing chamber portions 156a 156b, 156c may each generally extend from the floor 174 to the bottom 184 of the mechanical return air plenum 160. At the top of each of the first and second air mixing chamber portions 156a, 156b, the second end wall 108 may include generally horizontal upper end wall plates 188 (see FIG. 5b) that separate the first and second air mixing chamber portions 156a, 156b from the mechanical return air plenum 160.

Each return air shaft 158 varies in size. In particular, each return air shaft 158 decreases in size from the mechanical return air plenum 160 to the floor 174. This arrangement creates a zone of contraction that maintains static pressure as return air is delivered to the air mixing chamber 156 via the return air shafts 158. This preservation of static pressure is intended to maintain adequate momentum for the return air as it passes through the return air shafts 158 and into the air mixing chamber 156 in order to provide for a uniform mixing of the return air stream with the outside air stream along the height of the air mixing chamber 156.

The size decrease in the return air shafts 158 may be implemented by reducing the length of the return air shafts 158 from the mechanical return air plenum 160 to the floor 174 while maintaining the width of the return air shafts 158. In some embodiments, the length of each return air shaft 158 may be approximately 4 to 8 times greater at the top of the return air shaft than at the bottom of the return air shaft 158 while the width remains approximately the same from the top to the bottom of the return air shaft 158. In a preferred embodiment, the sidewall return air shafts 158a, 158b (i.e., the return air shafts adjacent to either the first sidewall 102 or the second sidewall 104) may be sized at 36 inches long by 12 inches wide at the connection to the mechanical return air plenum 160, and the center return air shaft 158c may be sized at 36 inches long by 24 inches wide at the connection to the mechanical return air plenum 160. The sidewall return air shafts 158a, 158b may taper down to 6 inches long by 12 inches wide at the floor level, and the center return air shaft 158c may taper down to 6 inches long by 24 inches wide at the floor level. However, return air shafts 158 with other sizes may be used based on desired geometries and air flow characteristics for the air mixing system.

Generally, the sidewall return air shafts 158a, 158b are each sized to have approximately ½ of the volume of the center return air shaft 158c. In other words, the combined volume of the two sidewall return air shafts 158a, 158b approximately equals the volume of the center return shaft 158c. Further, in embodiments with more than three return air shafts 158, the sidewall air shafts 158a, 158b may each have approximately the same first volume, the other return air shafts 158c may generally have the same second volume, and the first volume may be approximately ½ of the second volume (i.e., each sidewall return air shaft 158a, 158b may have ½ of the volume of a non-sidewall return air shaft 158c). For example, if there were four return air shafts 158 with two sidewall return air shafts 158a, 158b (i.e., a first return air shaft located adjacent to the first sidewall 102 and a second return air shaft located adjacent to the second sidewall 104) and two non-sidewall return air shafts 158c positioned along the second end wall 108 between the sidewall return air shafts 158a, 158b, then the two sidewall return air shafts 158a, 158b may each have approximately ½ of the volume of one of the non-sidewall return air shafts 158c, and the non-sidewall return air shafts 158c may have approximately the same volume. In such an embodiment, each of the two sidewall return air shafts 158a, 158b would have approximately ⅙ of the total return air shaft volume and each of the two non-sidewall return air shafts 158c would have approximately ⅓ of the total return air shaft volume.

The sidewall return air shafts 158a, 158b may each include a wall that is at least partially perforated. Each perforated wall may include a perforated portion that extends from a bottom end portion of the perforated wall to a top end portion of the perforated wall. At the top end portion of each perforated wall, the perforated portion may be generally distal from the mechanical return air plenum 160. This arrangement results in air entering the sidewall return air shafts 158a, 158b from the mechanical return air plenum 160 first flowing towards the second end wall 108 and/or down the sidewall return air shafts 158a, 158b before the air passes into the air mixing chamber 156 through the perforated portions of the sidewall return air shafts 158a, 158b.

In some embodiments, the perforated portion of the wall for each sidewall return air shaft 158a, 158b may take the form of a perforated panel 190. Each perforated panel 190 may include a graduated hole pattern or engineered slots. The perforated panel 190 may extend from the floor 174 to the top of its respective sidewall return air shaft 158a, 158b, may also extend from the second end wall 108 towards the air cooling system 150, and may be substantially perpendicular to the second end wall 108. Further, the perforated panel 190 for the first sidewall return air shaft 158a may be adjacent to the first air mixing chamber portion 156a to allow return air to flow from the first sidewall return air shaft 158a to the air mixing chamber 156, and the perforated panel 190 for the second sidewall return air shaft 158b may be adjacent to the second air mixing chamber portion 156b to allow return air to flow from the second sidewall return air shaft 158b to the air mixing chamber 156.

The center return air shaft 158c may include two walls that are at least partially perforated. Each perforated wall may include a perforated portion that extends from a bottom end portion of the perforated wall to a top end portion of the perforated wall. At the top end portion of each perforated wall, the perforated portion may be generally distal from the mechanical return air plenum 160. Like the sidewall return air shafts 158a, 158b, this arrangement results in air entering the center return air shaft 158c from the mechanical return air plenum 160 first flowing towards the second end wall 108 and/or down the center return air shaft 158c before the air passes into the air mixing chamber 156 through the perforated portions of the center return air shaft 158c.

In some embodiments, the perforated portions for the center return air shaft 158c may take the form of perforated panels. Thus, the center return air shaft 158c may include two vertical perforated panels 190. Each vertical perforated panel 190 may include a graduated hole pattern or engineered slots. Each perforated panel 190 for the center return air shaft 158c may extend from the floor 174 to the top of the center return air shaft 158c, may extend from the second end wall 108 towards the air cooling system 150, and may be substantially perpendicular to the second end wall 108. Further, one perforated panel 190 for the center return air shaft 158c may be adjacent to the first air mixing chamber portion 156a and the other perforated panel 190 may be adjacent to the second air mixing chamber portion 156b to allow return air to flow from the center return air shaft 158c to the air mixing chamber 156.

The perforated openings in the perforated panels 190 and/or other perforated portions of the return air shafts 158 may be selected to be directly proportional to the maximum return air flow for the modular pod 100. In a preferred embodiment, each of the perforated panels 190 for the sidewall return air shafts 158a, 158b and the center return air shaft 158c may be a 73% free air flow perforated panel that is 6 inch wide by 84 inch high. However, perforated panels 190 with other air flow characteristics and sizes may be used based on desired geometries and air flow characteristics for the air mixing system.

The cumulative widths of the return air shafts 158 are generally equal to the cumulative widths of the second end wall openings 124. This allows for a full range of air flow to the air mixing chamber 156 from either the return air or outside air depending upon outside air temperatures. In some embodiments, the air mixing system is designed based on the volumetric flow rates of return air at 95 degrees Fahrenheit (or warmer) and outside air at −30 degrees Fahrenheit (or colder) to mix to 70 degrees Fahrenheit server supply air. The air flow mixture at this design condition is 80% return air mixed with 20% outside air. As the outside air temperature increases from −30 degrees Fahrenheit (or colder) to 70 degrees Fahrenheit, the relative percentage of outside air vs. return air increases until the outside air, when at 70 degrees Fahrenheit, makes up 100% of the air being delivered to the air mixing chamber (i.e., no return air is mixed with the outside air). In other words, the air mixing system may be designed for a full variation in air flow from the return air and outside air with a resulting mixed air temperature of 70 degrees Fahrenheit (or any other desired temperature) as the goal.

Air diverters 192 may be located in the mechanical return air plenum 160 at the end of mechanical return air plenum 160 that is adjacent to the return air shafts 158. The air diverters 192 direct the return air into the return air shafts 158. Additionally, the total cross-section area of the return air shafts 158 at the top of the return air shafts 158 may generally be approximately the same as the cross-section area for the mechanical return air plenum 160. These features reduce the potential for vortices to develop as the return air flows from the mechanical return air plenum 160 into the return air shafts 158.

In operation, warm return air is forced down the return air shafts 158 and through the perforated panels 190 of the return air shafts 158 into the air mixing chamber 156 where it mixes uniformly with cold outside air that enters into the air mixing chamber 156 through the second end wall openings 124 of the second end wall 108. This results in a well mixed air stream with a substantially uniform temperature.

Figure 12A:
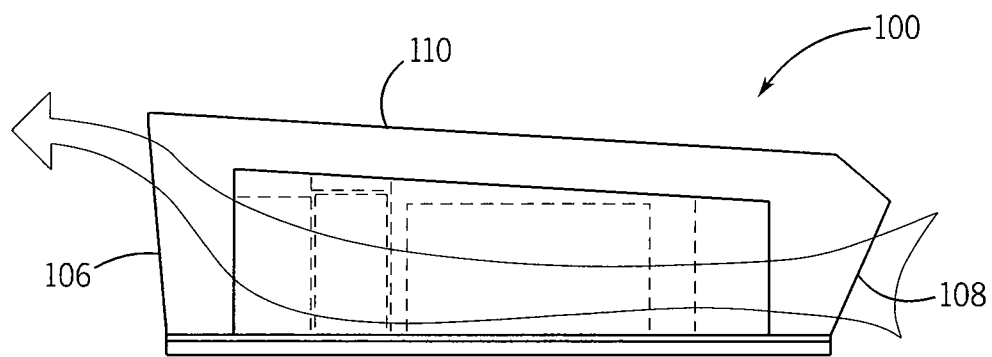
FIG. 12A-12C shows various elevation schematic views of the modular pod shown in FIG. 1, showing potential air flows through the modular pod.
Figure 12B:
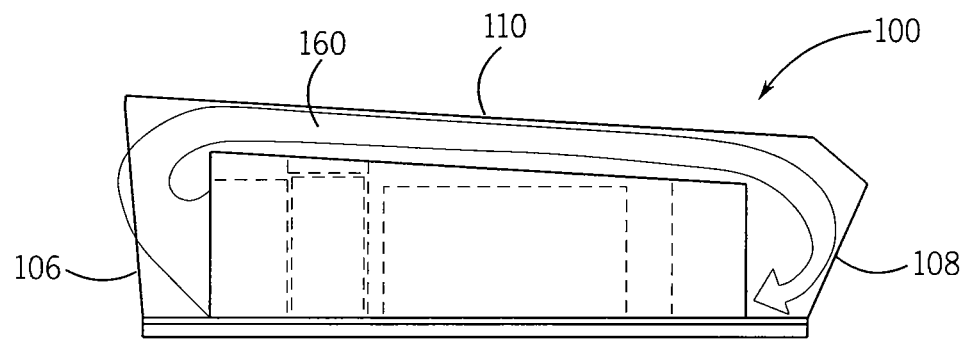
Figure 12C:
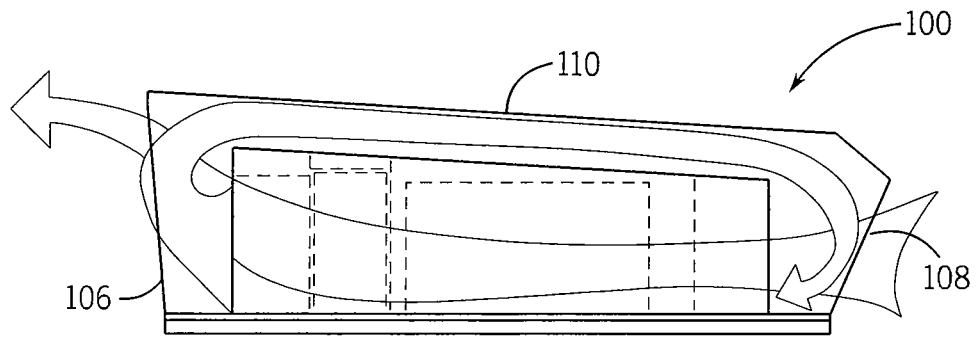
Figure 13:
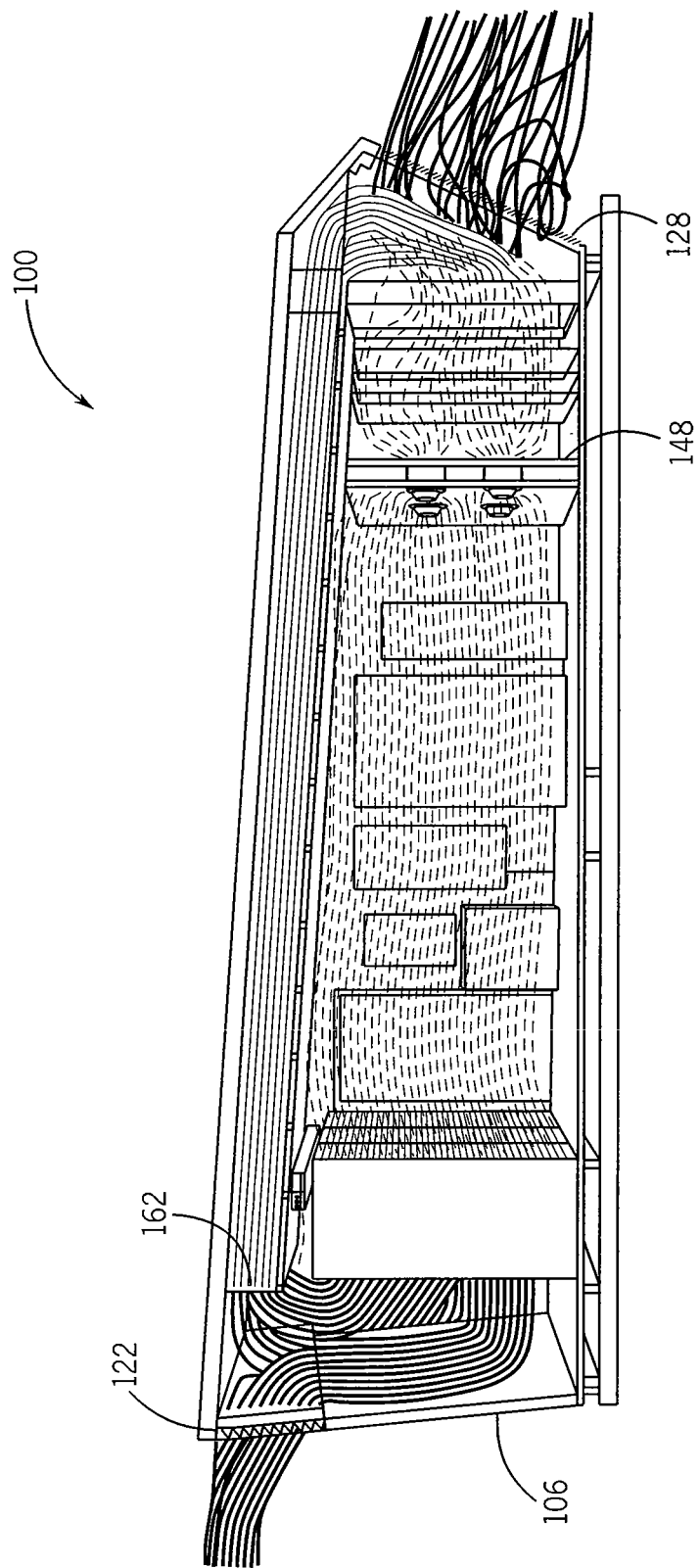
FIG. 13 shows another elevation schematic view of the modular pod shown in FIG. 1, showing air flow patterns for air passing through the modular pod when the modular pod is configured to operate in an economizer mode.
Figure 16:
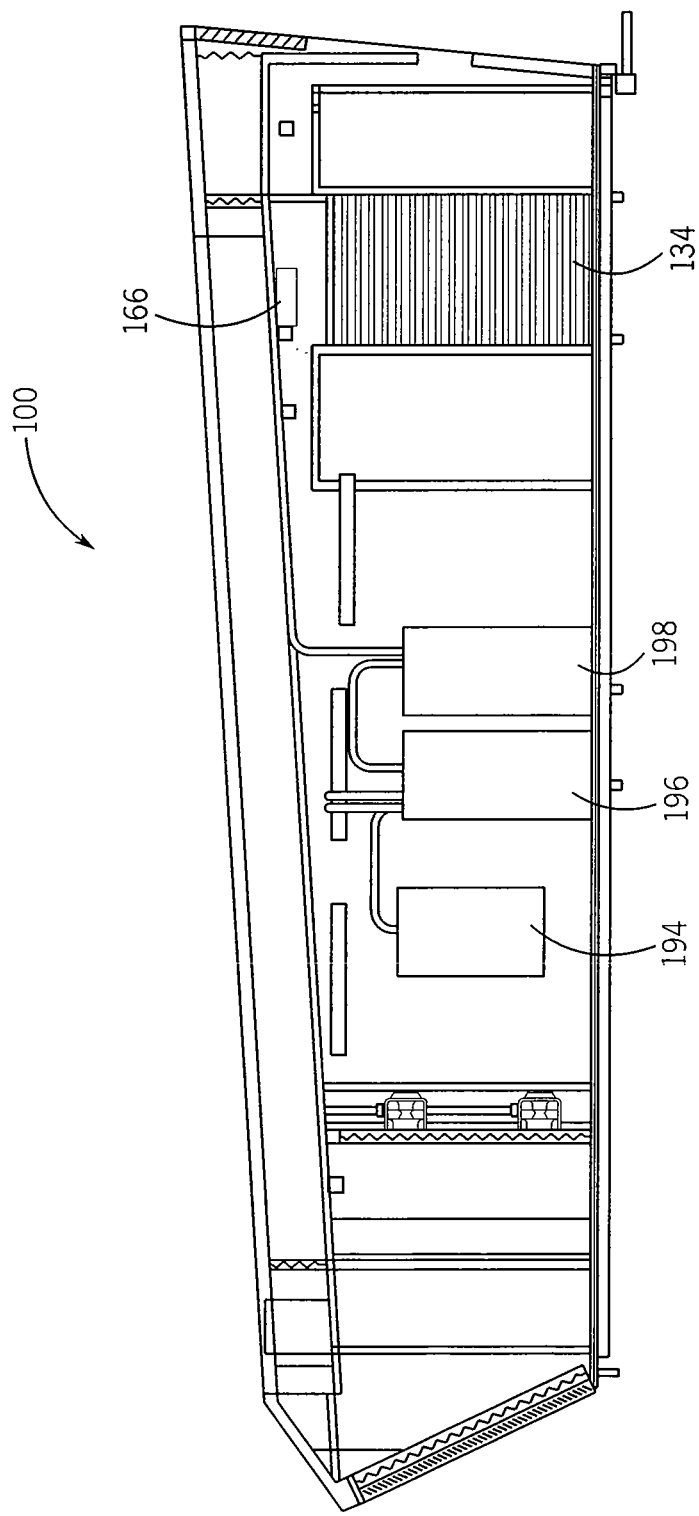
FIG. 16 shows a schematic elevation view of an embodiment of an uninterrupted power system ("UPS") module and an electrical module for the modular pod shown in FIG. 1.
Figure 17:
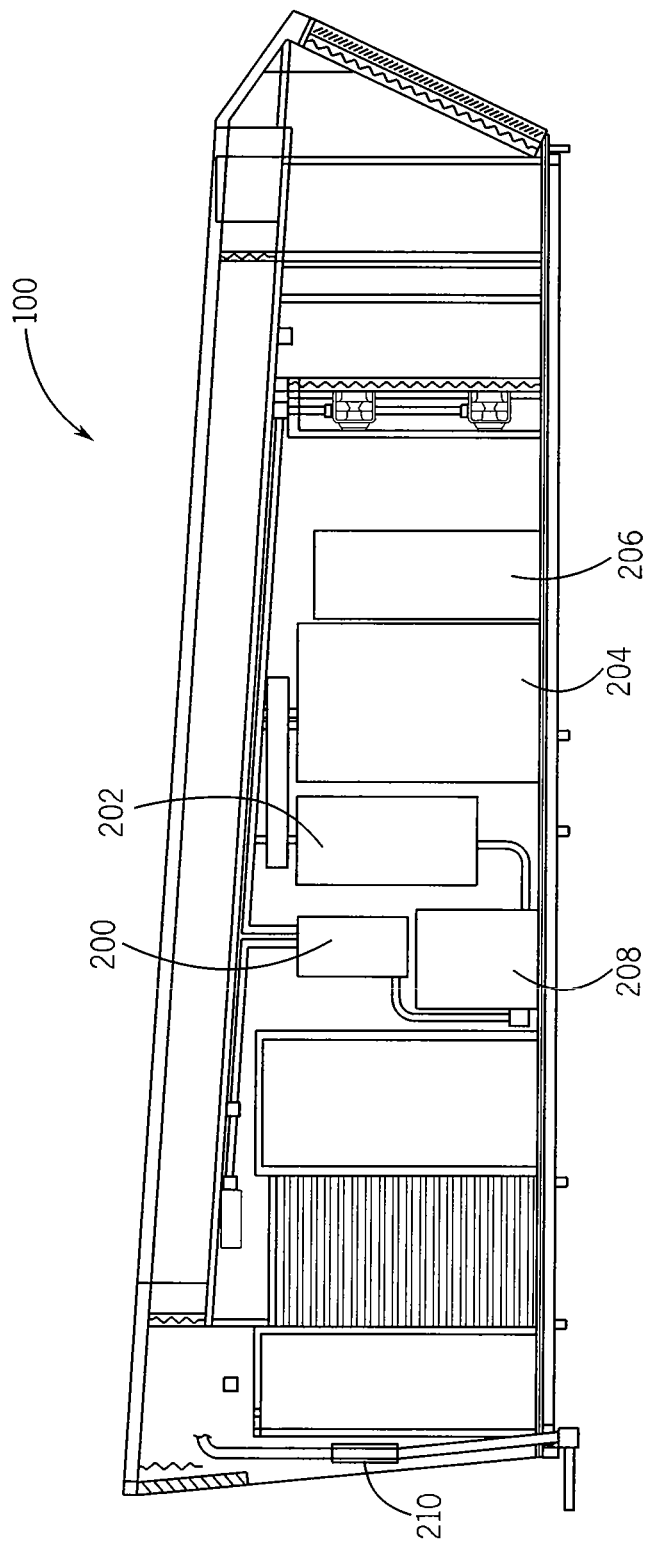
FIG. 17 shows another schematic elevation view of the UPS and electrical modules shown in FIG. 16.
Figure 18:
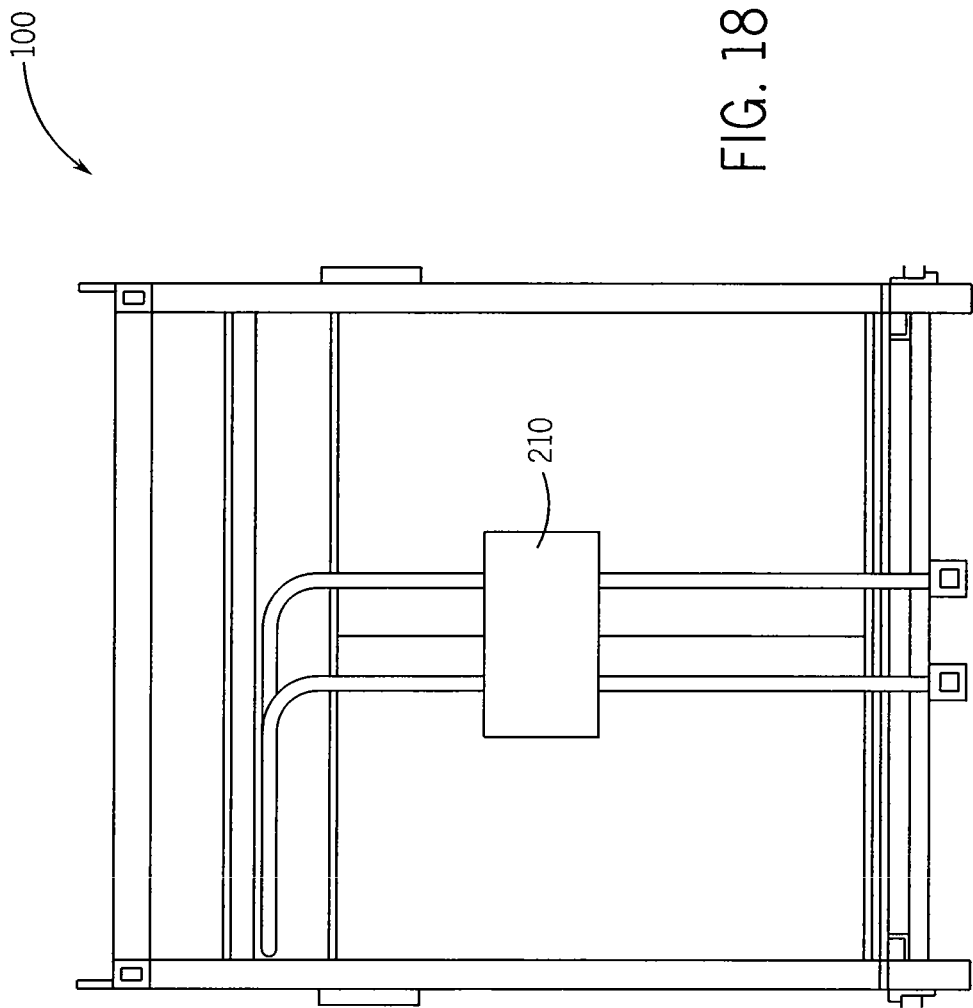
FIGS. 18-20 show additional schematic elevation views of the UPS and electrical modules shown in FIG. 16.
Figure 19:
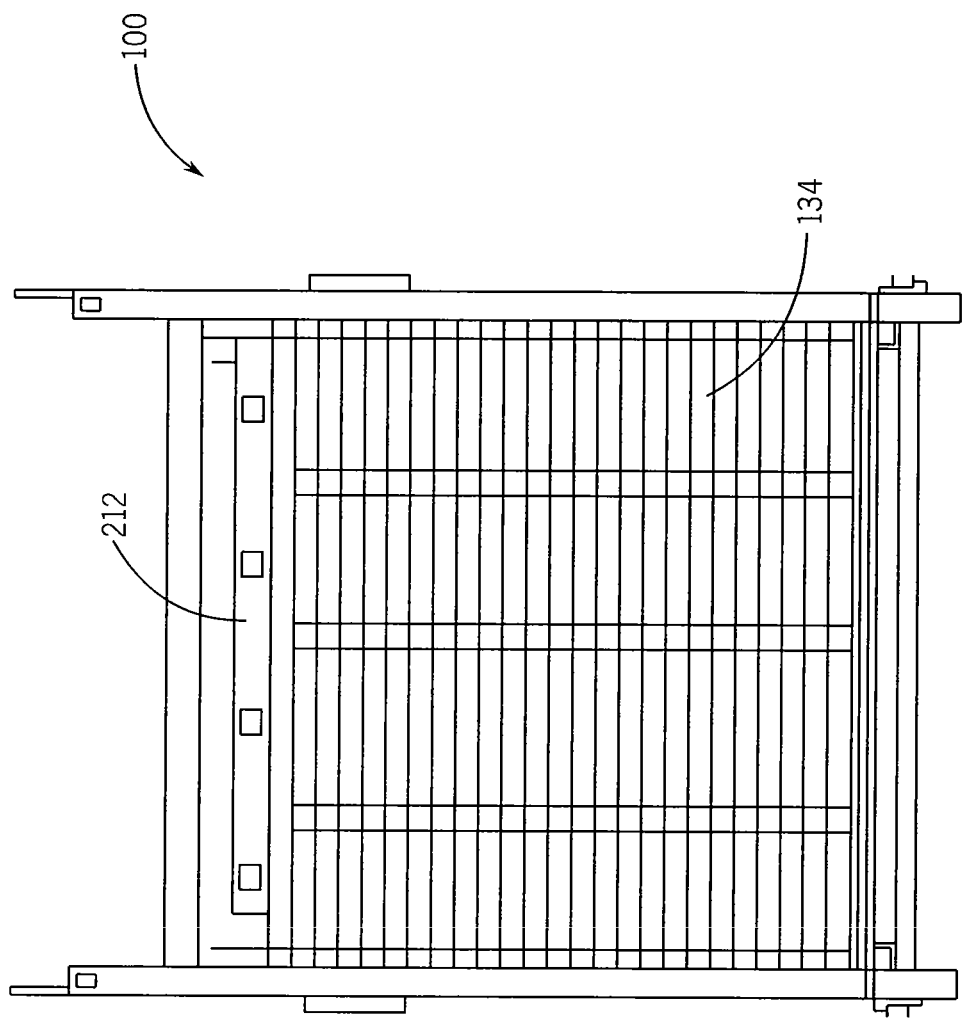
Figure 20:
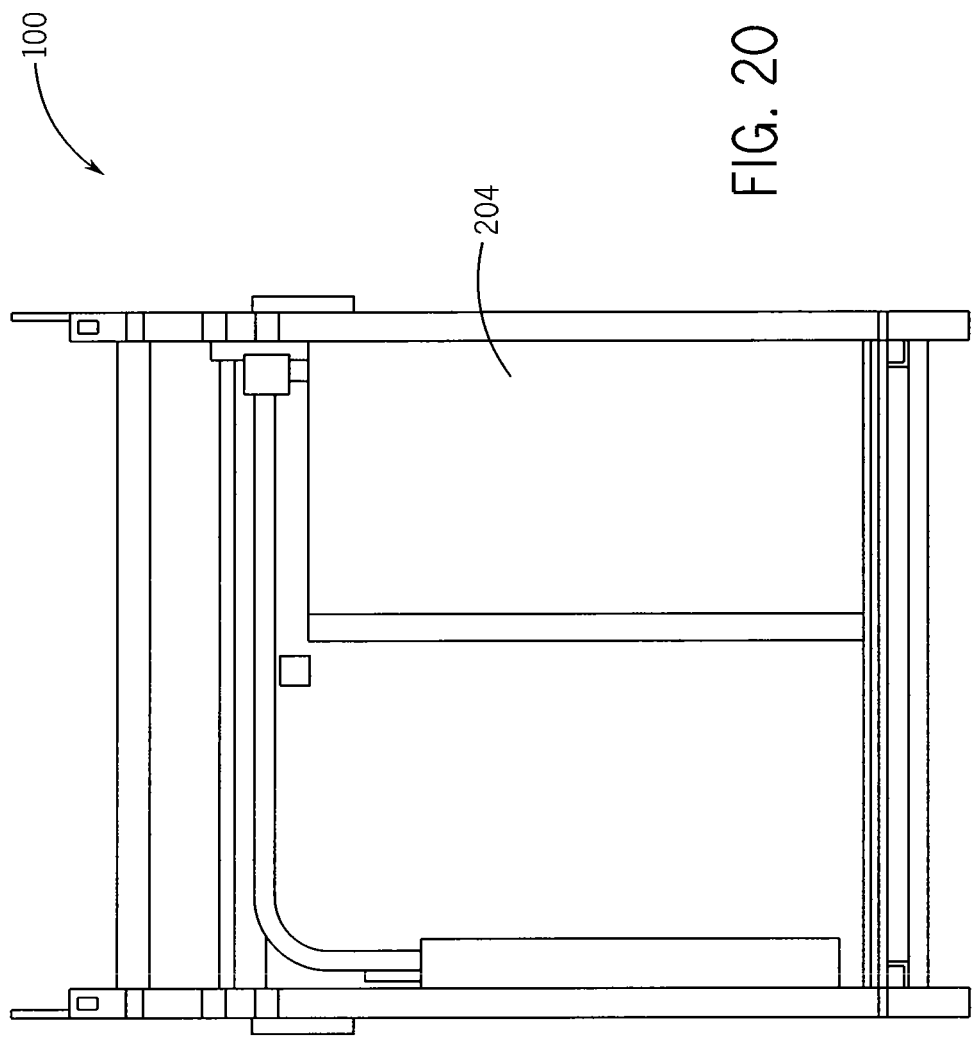
Figure 21:
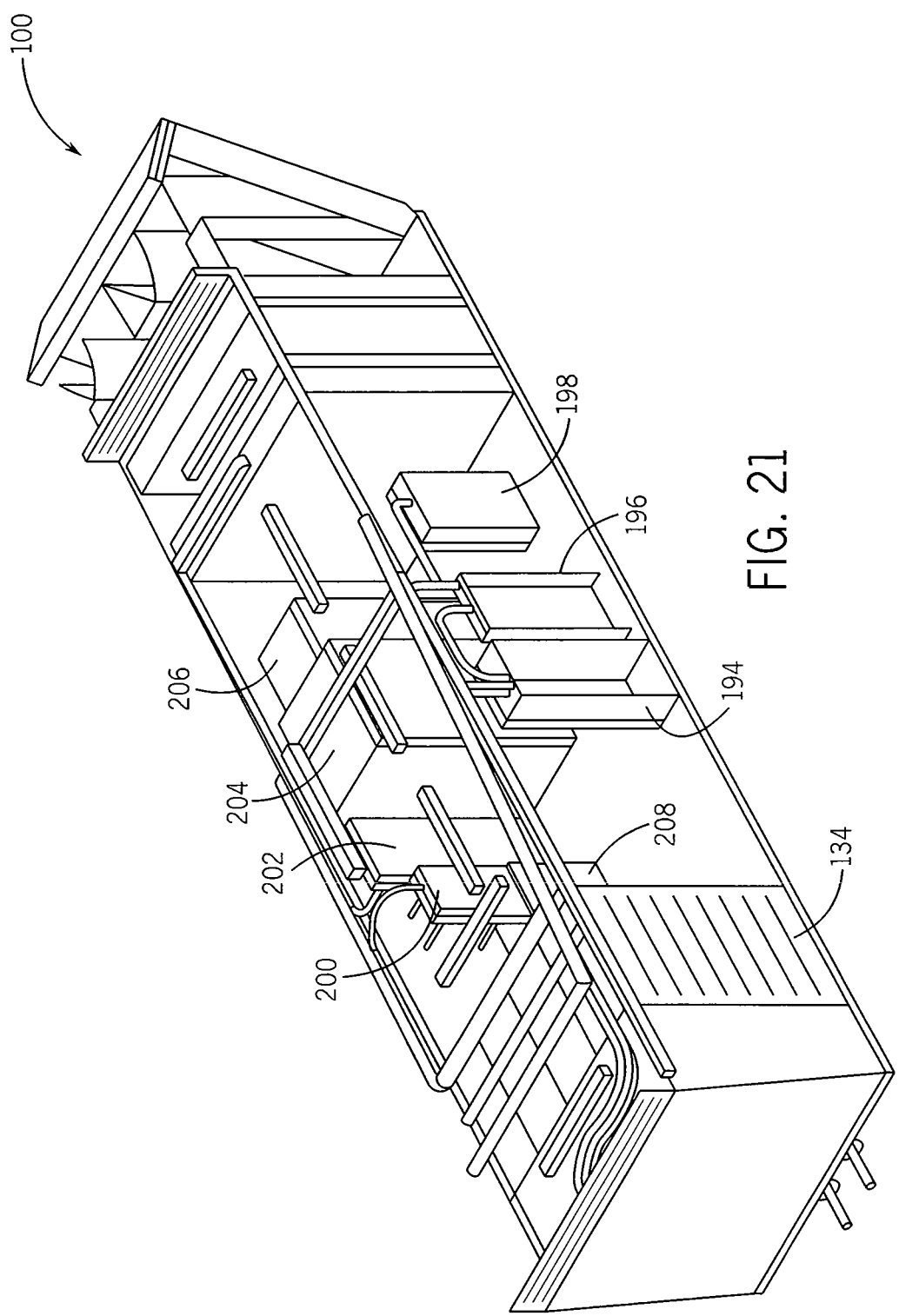
FIG. 21 shows an isometric schematic view of the UPS and electrical modules shown in FIG. 16.
Figure 22:
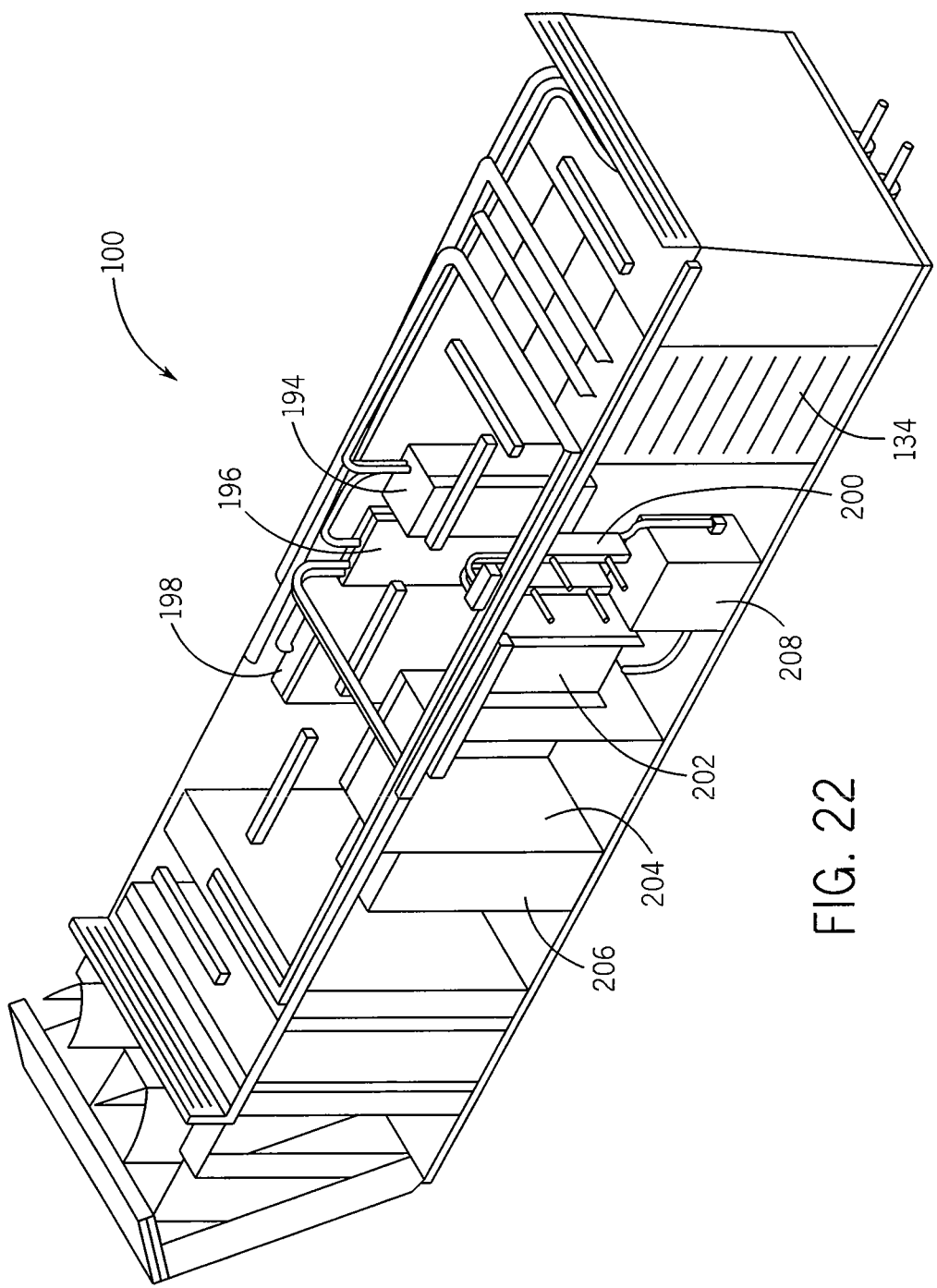
FIG. 22 shows another isometric schematic view of the UPS and electrical modules shown in FIG. 16.

FIGS. 12A-12C show various possible air flows through the interior space of the modular pod 100. In particular, the various dampers 122, 128, 148, 162 of the modular pod 100 may be selectively opened or closed to create pass through air flow, recirculation air flow, or form factor air flow (i.e., a combination of pass through air flow and recirculation air flow). For example, and with reference to FIG. 12A, the first end wall damper 122, the second end wall damper 128, and the fan array damper 148 may be opened while the return air flow damper 162 is closed to create pass through air flow where outside air enters the modular pod 100 through the second end wall openings 124, passes through the portion of the modular pod 100 housing the mechanical and electrical equipment, and exits the modular pod 100 through the first end wall opening 118. As another example, and with reference to FIG. 12B, the fan array damper 148 and the return air flow damper 162 may be opened while the first and second end wall dampers 122, 128 are closed to create recirculation air flow where air within the modular pod 100 circulates from the first end wall 106 to the second end wall 108 through the mechanical return air plenum 160, flows down the return air shafts 158 to the air mixing chamber 156, flows from the air mixing chamber 156 to the hot access aisle 136 through the portion of the modular pod 100 housing the mechanical and electrical equipment, and then flows back into the mechanical return air plenum 160. As yet another example, and with reference to FIGS. 12C and 13, all of the dampers 122, 128, 148, 162 may be opened so that form factor air flow occurs through the modular pod 100.

The modular pod 100 may also be shaped to create more optimum airflow paths while also more efficiently utilizing space. For example, the modular pod 100 may be higher at one end wall 106 than at its opposite end wall 108 and the roof 110 may slope at an angle from the taller end wall side 106 to the shorter end wall side 108. The sloped roof creates a zone of expansion in the return air loop that reduces the velocity of air that enters the air mixing chamber 156 of the modular pod 100. Additionally, the shorter end wall 108 may be sloped at an acute angle relative to vertical to accommodate the vertically tapering return air shafts 158 of the air mixing system. If desired, the taller end wall 106 may also be sloped at an acute angle relative to vertical. The degree of the acute angle at the shorter end wall 108 may be greater than the degree of the acute angle at the taller end wall 106. In other words, the taller end wall 106 may be closer to vertical than the shorter end wall 108. However, the degrees of the acute angles of the taller and shorter end walls 106, 108, if desired, may be approximately the same, or the degree of the acute angle of the taller end wall 106 may be greater than the degree of the acute angle of the shorter end wall 108. In some embodiments, the interior geometry of the modular pod 100 may be configured such that average airflow velocities do not exceed 200 feet per minute, thus minimizing air flow resistance and energy consumption. In some embodiments, the cross-sectional area of the first end wall damper 122, the second end wall damper 128, the fan array damper 148, and the return air flow damper 162 are sized so that temperature control is robust while resistance through the air circuit is minimized.

FIG. 14 shows a modeled temperature profile for an air stream where the modular pod 100 does not include an air economizer as described above, and FIG. 15 shows a modeled temperature profile for an air stream where the modular pod 100 does include an air economizer as described above. With reference to FIG. 14, the temperature of the air downstream of the air mixing chamber 156 tends to be stratified, with hotter air above colder air. In contrast, and with reference to FIG. 15, the temperature of the air downstream of the air mixing chamber 156 tends to be much more uniform across the height of the interior space of the modular pod 100 between the floor 174 and the ceiling 160 when an air economizer as described above is incorporated into the modular pod 100.

The UPS module provides continuous conditioned power to the server racks 134. In some embodiments, the UPS module may support four data server racks 134 although more or less than four data server racks 134 could be powered by the UPS, if desired. Each server rack 134 is planned for a 15 kW load density or greater. Thus, the total design load for a four data server rack 134 set-up is anticipated to be approximately 80 kVA or greater, including IT, mechanical, ventilation, control, and lighting.

Power supply to the modular pod 100 may include two external sources: normal utility (house) power and standby generator. The electrical equipment set configuration depends on the source voltage available. Generally, a single reliable power source, either house or generator power, is anticipated to be available at locations where the modular pods 100 are located. The power to the server racks 134 may be a single cord scheme and redundant automatic transfer switch ("ATS") or UPS components are generally not provided. However, maintenance bypass capability is provided. The base electrical equipment set may include automatic transfer switch, UPS batteries or flywheel, and distribution panels.

FIGS. 17-22 show schematic elevation and perspective views of an embodiment of UPS and electrical modules for the modular pod 100 shown in FIG. 1. The layout for the electrical equipment shown in these figures is based on a 480 volt facility source option. Twist-lock receptacles mounted above the server racks 134 may be utilized for quick connect and flexibility. An early warning smoke detection system may be installed with the sample tube located above the server racks 134 at the hot access aisle 136 side of the server racks 134. The data network active and passive devices are anticipated to be located within the server racks 134. The cable tray 166 may be installed above the server racks 134 to accommodate network cabling.

The UPS and electrical modules may include the following:
1. mini power unit 194;
2. main distribution board 196;
3. service entrance ATS 198;
4. server panel 200;
5. UPS distribution panel 202;
6. UPS main box 204;
7. UPS battery or flywheel 206;
8. a transformer 208;
9. service entrance disconnect switches 210; and
10. IT rack power receptacles wireway 212.

The actual equipment used in the UPS and electrical modules will generally be a function of the power source and the desired capabilities of the UPS and electrical modules.

Figure 23:
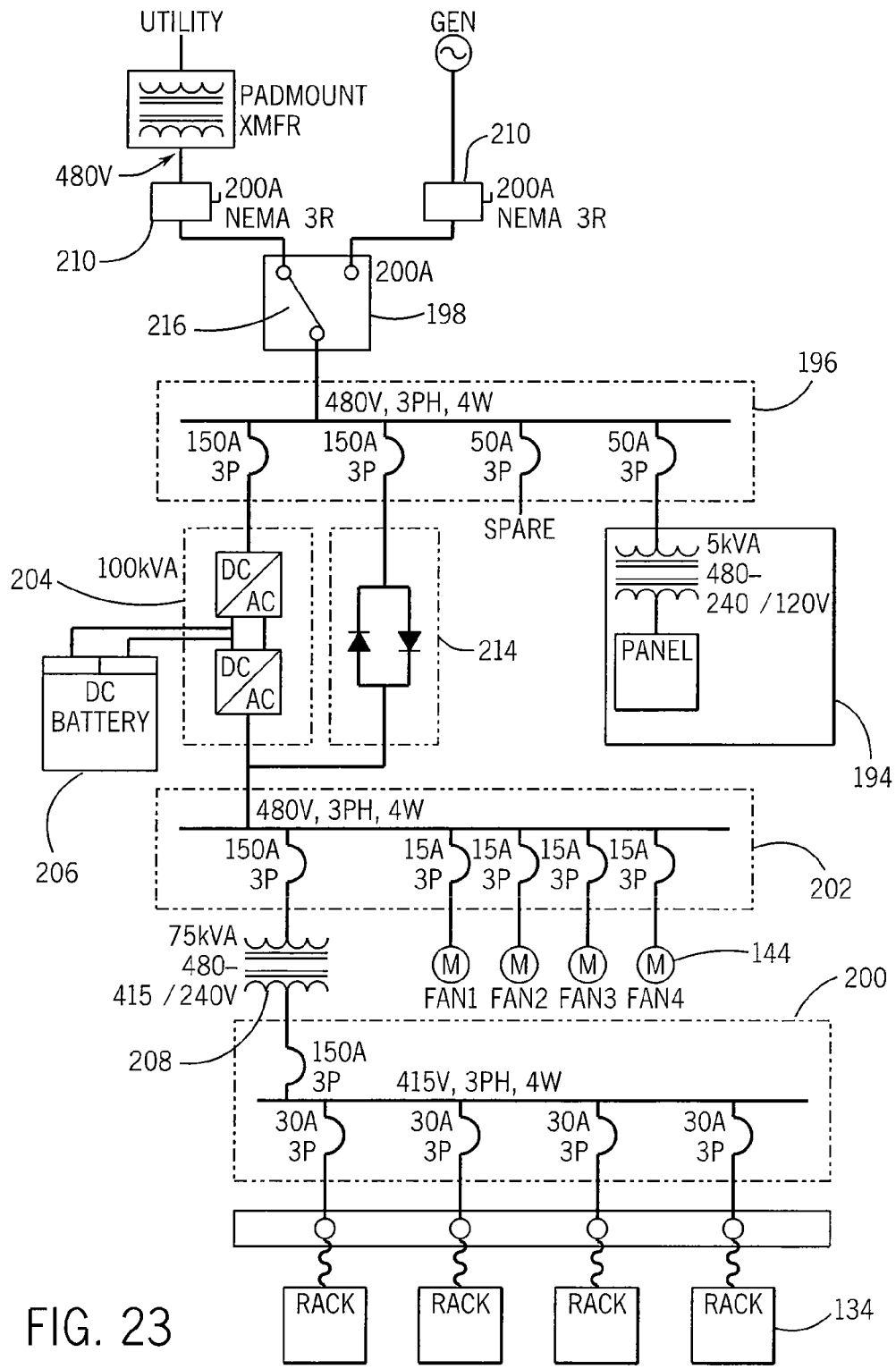
FIGS. 23-26 show schematics of various possible electrical designs for various embodiments of UPS and electrical modules for the modular pod shown in FIG. 1.
Figure 24:
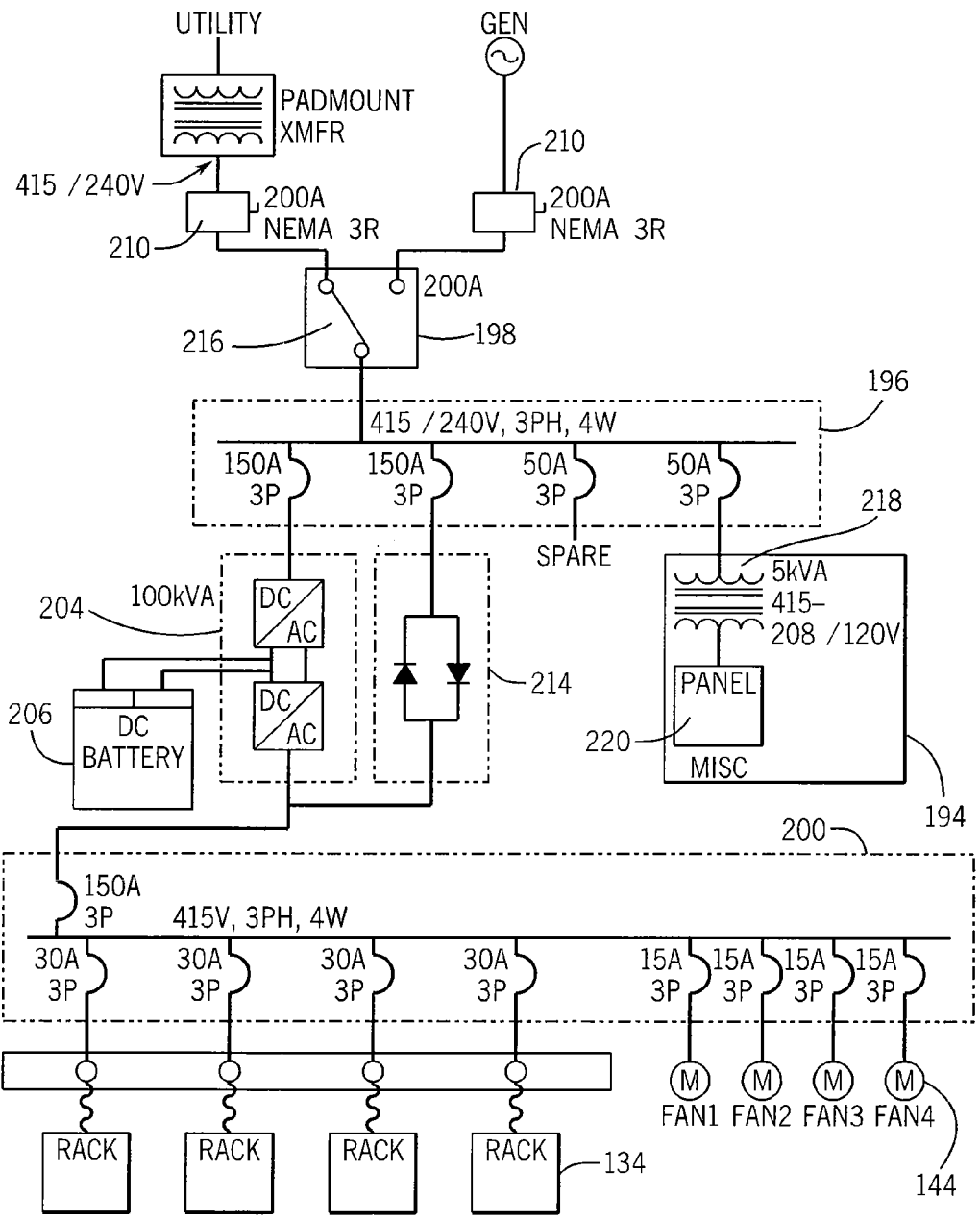
Figure 25:
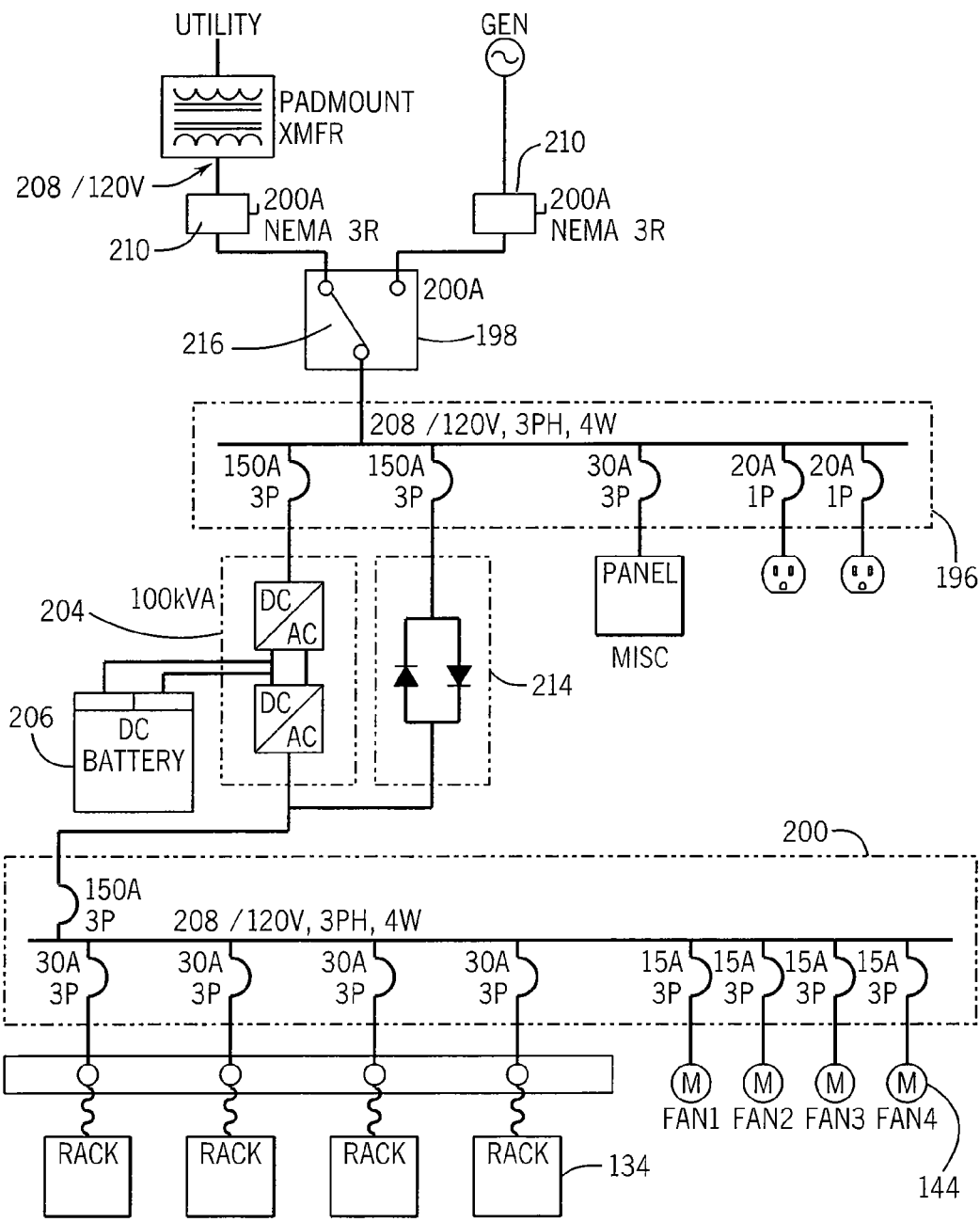

FIGS. 23-26 show various one line electrical diagrams of how various components of the UPS and electrical modules may be electrically connected to different types of power sources. To maximize electrical efficiency, 415/240 volt power may be used at the server rack 134. Common power supply in the United States is 480/277 or 208/120 volts. Outside of North America, 415/240 volts is common. Thus, potential set-ups of the UPS module for 480 volt, 415 volt, and 208 volt power sources are shown in FIGS. 23, 24, and 25, respectively. For the 480 volt and 415 volt set-ups shown in FIGS. 23 and 24, respectively, the power delivered to the server racks would be 240 volts. With respect to the 208 volt power source set-up shown in FIG. 25, the power delivered to the server racks would be 120 volts.

With reference to FIGS. 23-25, the UPS main box 204 contains the electronics for in-line AC/DC and DC/AC power conversion. The AC/DC converter in the UPS main box 204 delivers usable AC power to the server racks 134. A box for the UPS battery 206 is positioned adjacent to the UPS main box 204, and the UPS battery 206 is directly connected to the electronics contained in the UPS main box 204. The UPS battery 206 provides short duration DC power, usually 5-10 minutes, when normal power is lost.

The UPS module may include a maintenance bypass 214. The maintenance bypass 214 is external the UPS main box 204 and provides power to the server racks 134 when the components in the UPS main box 204 fail or the UPS main box 204 is taken off line for service.

The service entrance ATS 198 may include an automatic transfer switch 216. The automatic transfer switch 216 senses a loss of normal power from the utility line. Upon sensing a loss normal power, the automatic transfer switch 216 signals the generator to start and then transfers the power source to the generator. The UPS module may include safety or service entrance disconnect switches 210 to turn off all power to the equipment.

For UPS modules connected to 480 or 415 volt sources, the UPS module may include the mini power unit 194. The mini power unit 194 may house a transformer 218 and a branch circuit panel 220 to transform and deliver 120 volt power to use for convenience power and lighting. For UPS modules connected to a 480 volt source, the UPS module may also include the transformer 208, such as a 75 KVa or other voltage transformer, for converting the power to 415 volt power for use at the server racks 134.

Figure 26:
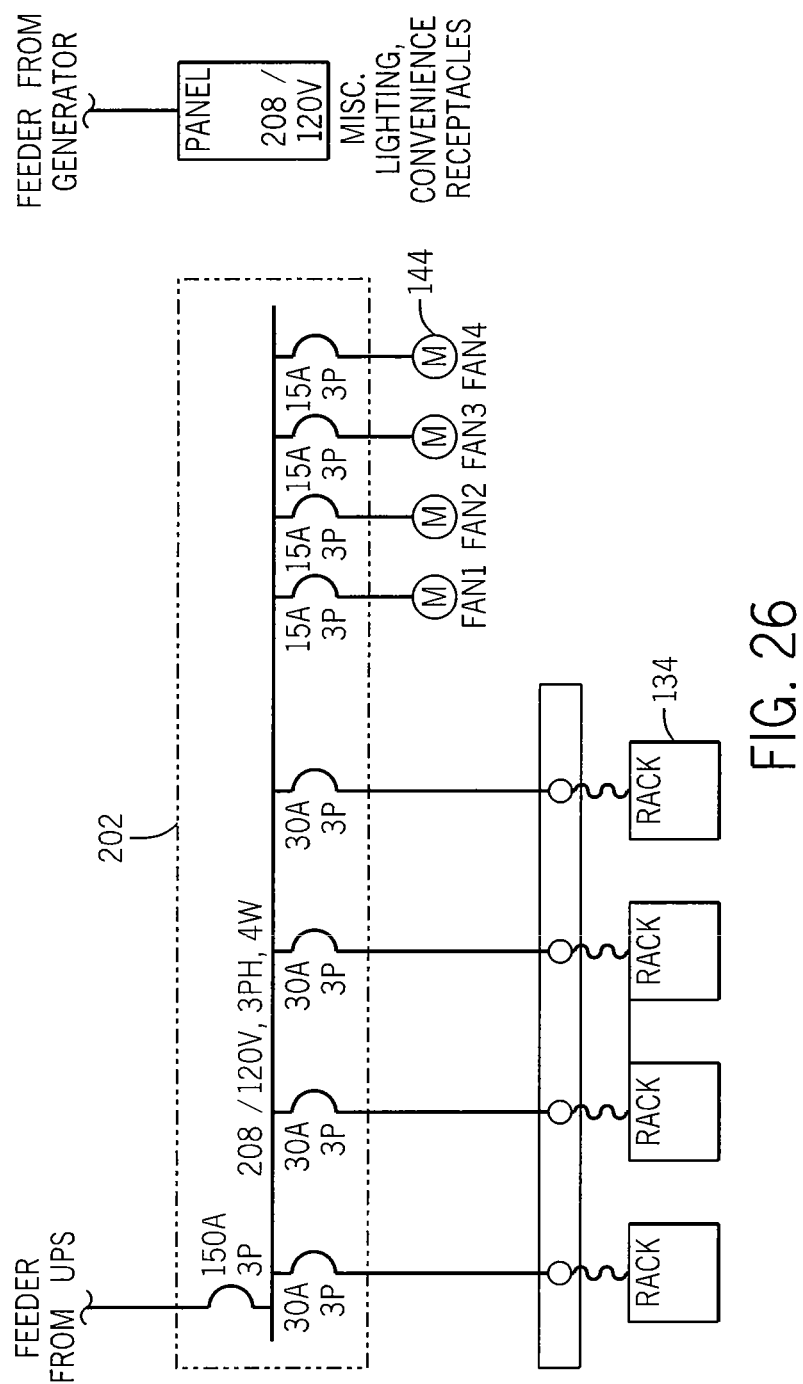

FIG. 26 shows a set-up for a situation where main and generator power is provided centrally from a user's building. In this set-up, the power source is already considered to be continuous. Thus, the UPS module only requires the UPS distribution panel 202 to distribute power to the server racks 134.

Figure 27:
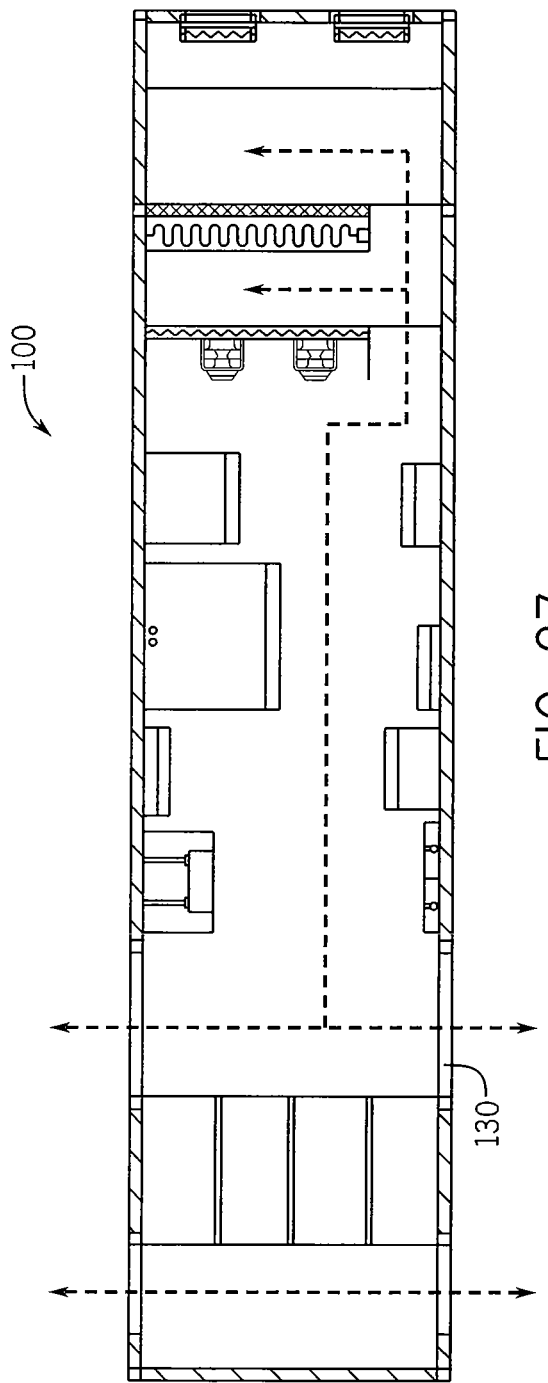
FIG. 27 shows a schematic plan view of the interior of the modular pod shown in FIG. 1, showing access pathways to the various modules contained within the modular pod.
Figure 28:
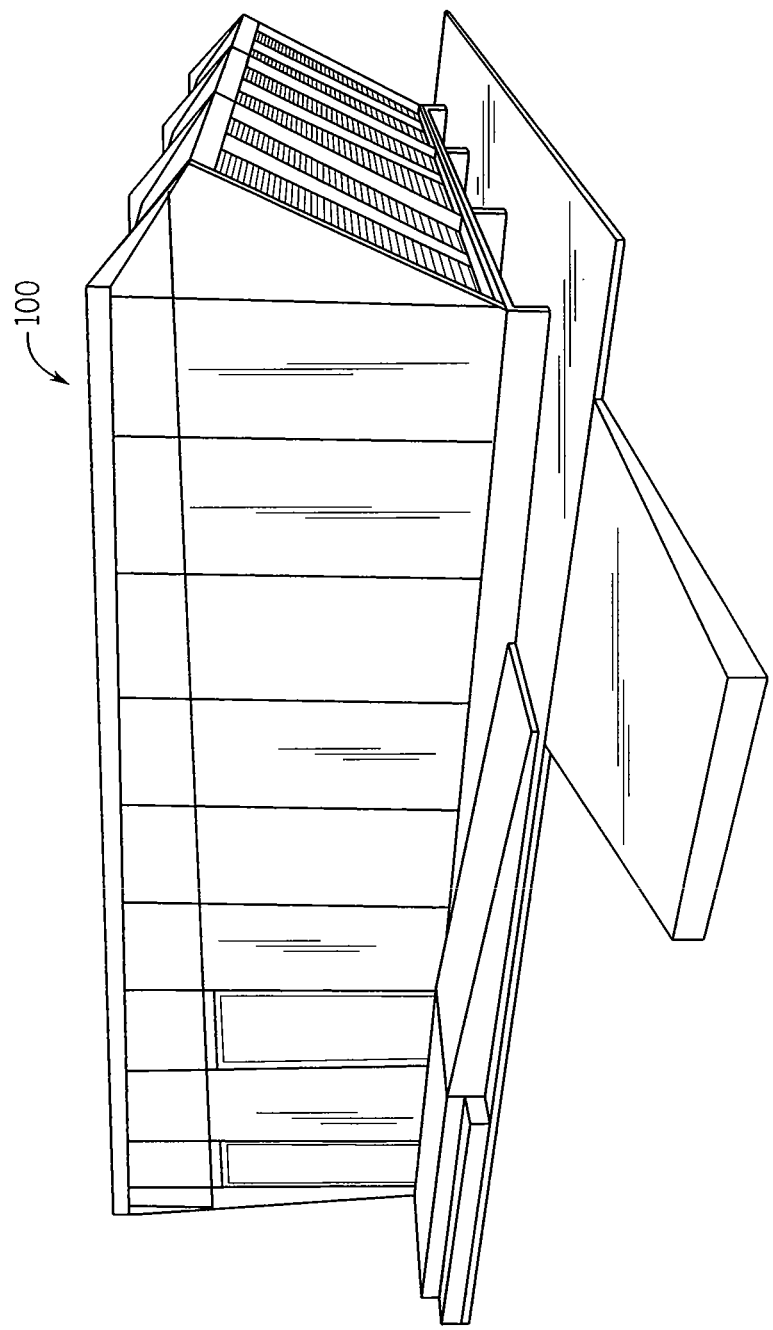
FIG. 28 shows an isometric view of multiple modular pods aligned next to each.
Figure 29:
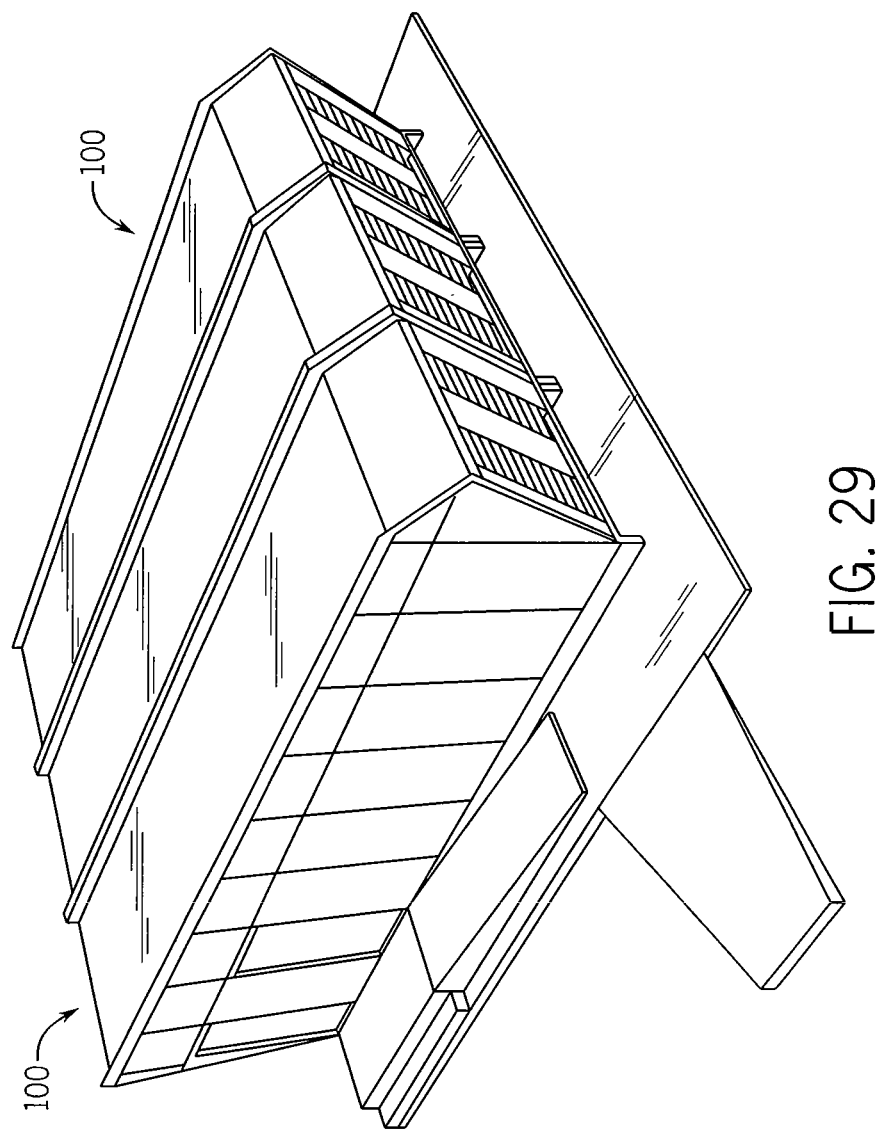
FIG. 29 shows another isometric view of the modular pods aligned next to each.
Figure 30:
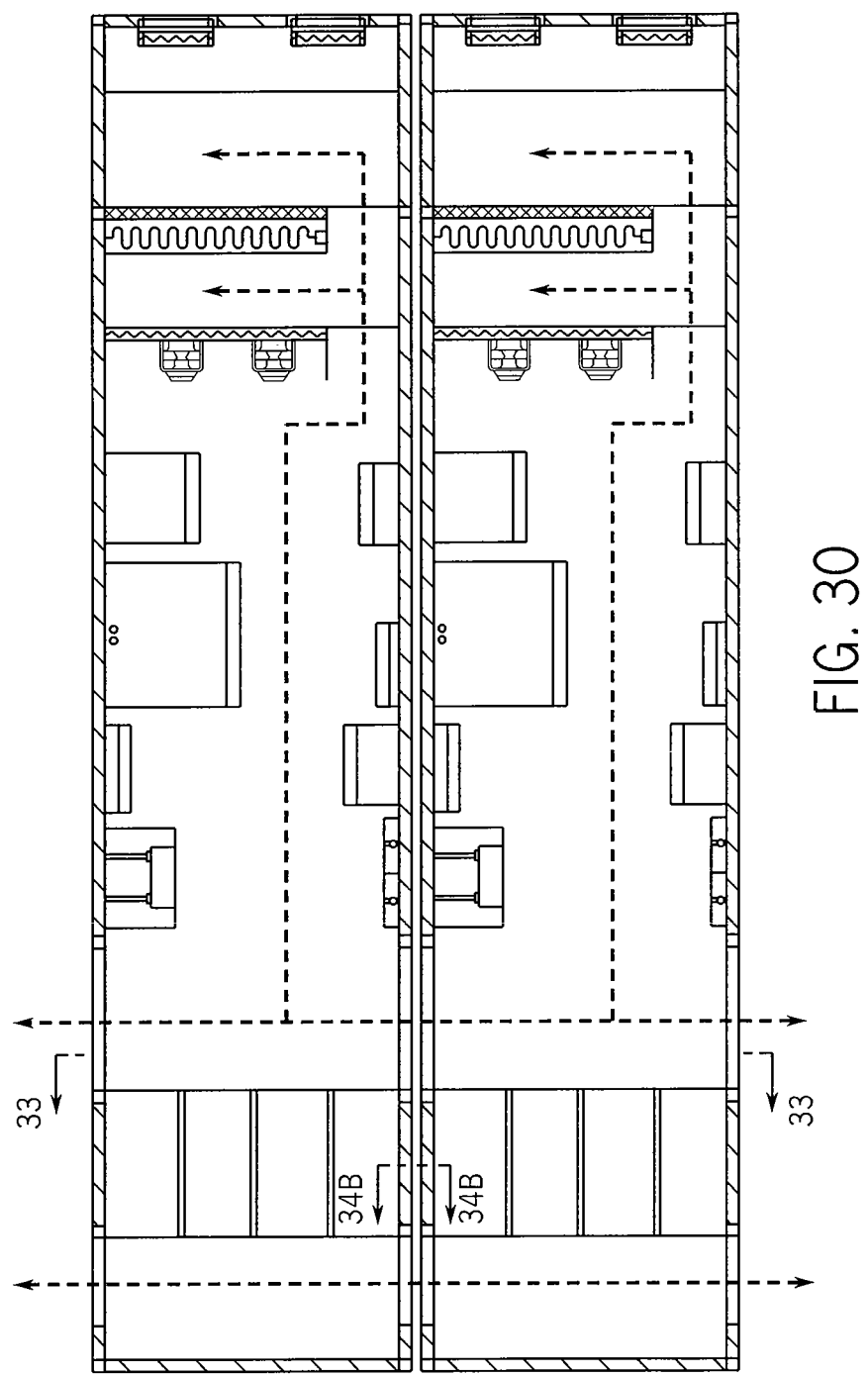
FIG. 30 shows a schematic plan view of the interior of two adjacent modular pods, showing access pathways to the various modules contained within each modular pod.
Figure 31:
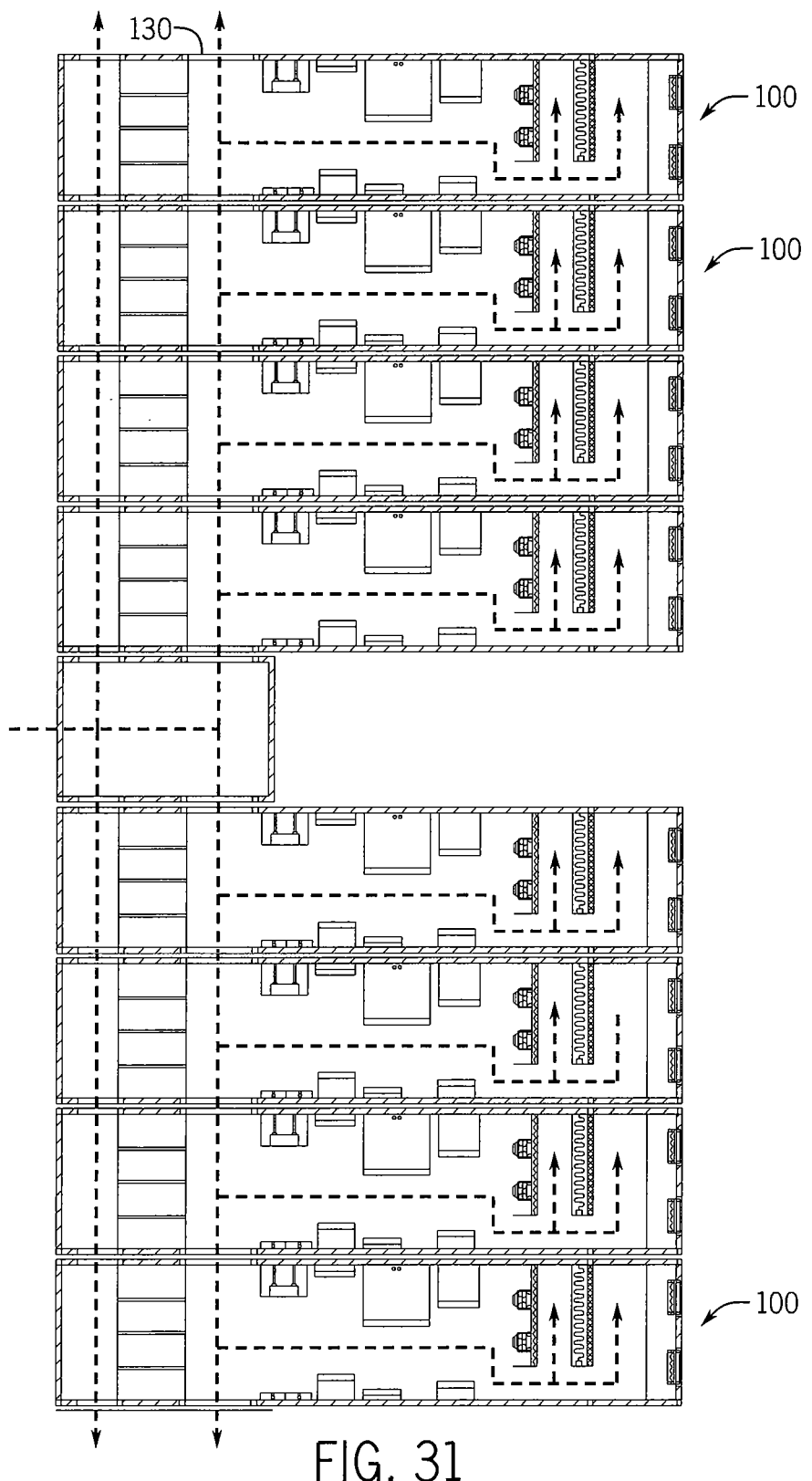
FIG. 31 shows a schematic plan view of the interior of multiple adjacent modular pods, showing access pathways to the various modules contained within each modular pod.
Figure 32:
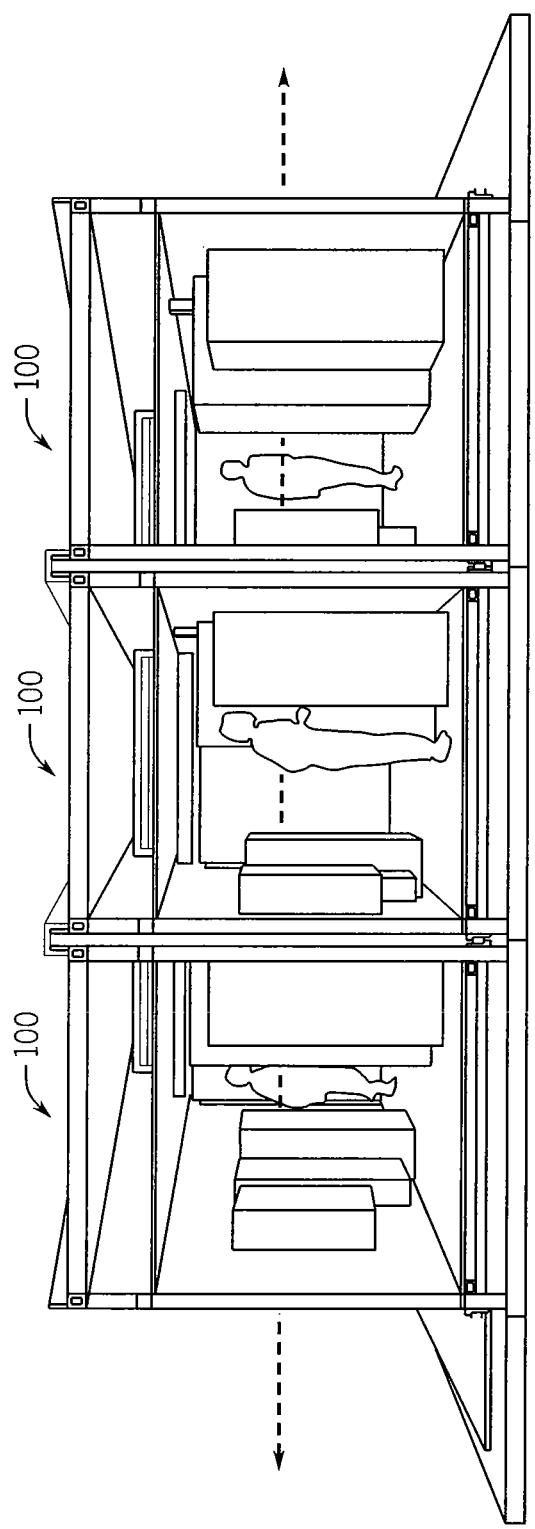
FIG. 32 shows a schematic cross-section view of three aligned modular pods, showing a potential interior spatial relationship for various pieces of equipment placed within the modular pods.

With reference to FIGS. 28-32, two or more modular pods 100 may be coupled together using various connectors, gaskets, and seals to form larger, watertight structures, such as data centers. Each coupled modular pod 100 may be approximately the size as the other coupled modular pods 100, and the adjacent first or second sidewalls 102, 104 of the coupled modular pods 100 may be approximately co-extensive with each other. The coupled modular pods 100 may be configured to provide continuous, internal access between modular pods 100. For example, the doorways 130 of the modular pods 100 may be aligned so that entrances and exits to each modular pod 100 are aligned. Dotted lines in FIGS. 27, 30, and 31 show various available walking paths for people to access different areas with each module pod. The dotted lines in FIGS. 30 and 31 also how modular pods 100 may be accessed from adjacent modular pods. Additionally, the modular pods 100 may be installed initially in a large array or may be added over time to create a large array.

The modular pod 100 may include a rugged structural system designed to withstand shipping. Further, the modular pod 100 may include a weather tight enclosure that is formed using insulated panels, such as insulated metal panels. The panels may be designed to handle placement in many different types of environments. Further, the modular pods 100 may include an integrated framing system to facilitate joining various architectural paneling systems to the modular pod 100.

Figure 33:
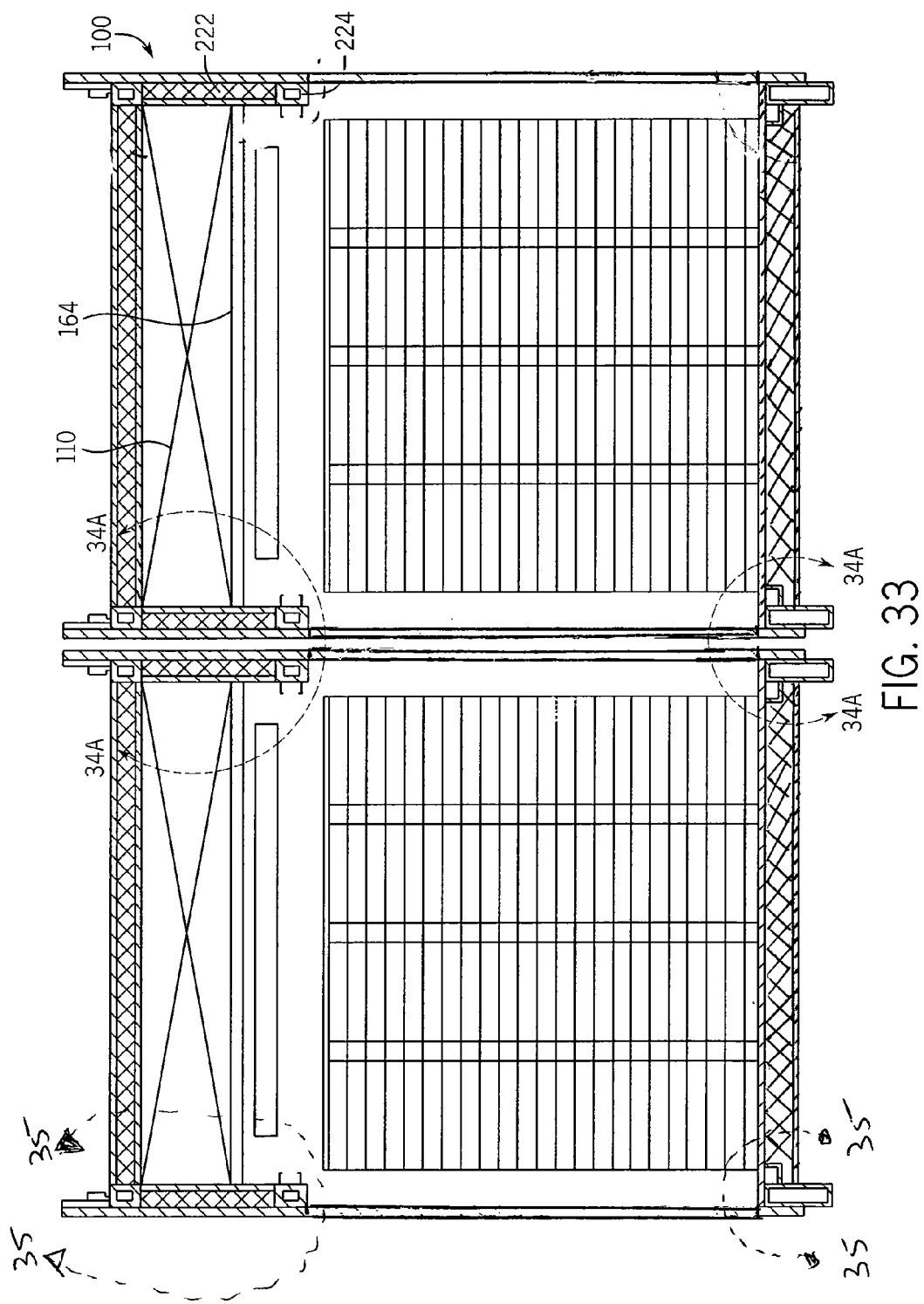
FIG. 33 shows a cross-section elevation view of pair of adjacent modular pod, viewed along line 33-33 in FIG. 30 and showing possible architectural and structural details.

FIG. 33 shows a schematic elevation view of adjacent modular pods 100, showing various architectural and structural details, and FIGS. 34A-39 show details of the various connectors, gaskets, and seals that may be utilized between adjacent modular pods 100.

With reference to FIG. 33, insulating material 222 may be positioned within the open spaces defined by the structural members 224 for the first and second structural frames 178, 180. Further, along the first sidewall 102, the insulating material 222 may further be positioned between first sidewall outer panels 280 and first sidewall inner panels 226 joined to the first structural frame 178 so that the insulating material 222 is sandwiched between the first the first sidewall outer panels 280 and the first sidewall inner panels 226 that from the first sidewall 102. Similarly, along the second sidewall 104, the insulating material 222 may further be positioned between second sidewall outer panels 282 and second sidewall inner panels 228 joined to the second structural frame 180 so that the insulating material 222 is sandwiched between the second sidewall outer panels 282 and the second sidewall inner panels 228 that form the second sidewall 104.

Insulating material 222 may also be positioned under the outer roof panels 284 of the roof 110, under the floor 174 and between inner and outer end wall panels for the first and second end walls 106, 108. For the insulating material 222 positioned under outer roof panels 284 of the roof 110, an inner roof panel 286 may be positioned underneath the insulating material 222 in order to sandwich the insulating material 222 between the outer and inner roof panels 284, 286 that form the roof 110. Similarly, for the insulating material 222 positioned underneath the floor 174, an outer base panel 288 may be positioned underneath the insulating material in order to sandwich the insulating material 22 between the floor 174 and the outer base panel 288 that form the base 112. For the first and second end walls 106, 108, the insulating material 222 may be positioned between inner and outer end wall panels so that the insulating material 222 is sandwiched between the panels that form the first and second end walls 106, 108.

Figure 37:
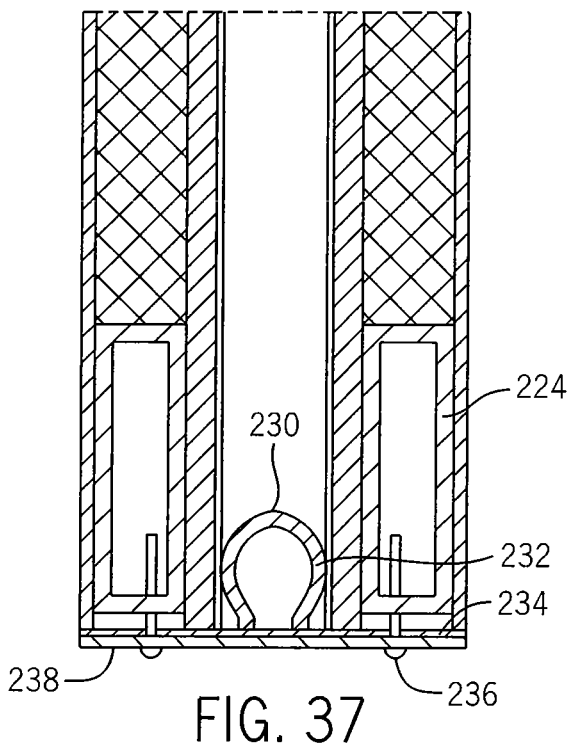
FIG. 37 shows an enlarged view of a portion of the cross-section elevation view of FIG. 34A.
Figure 38:
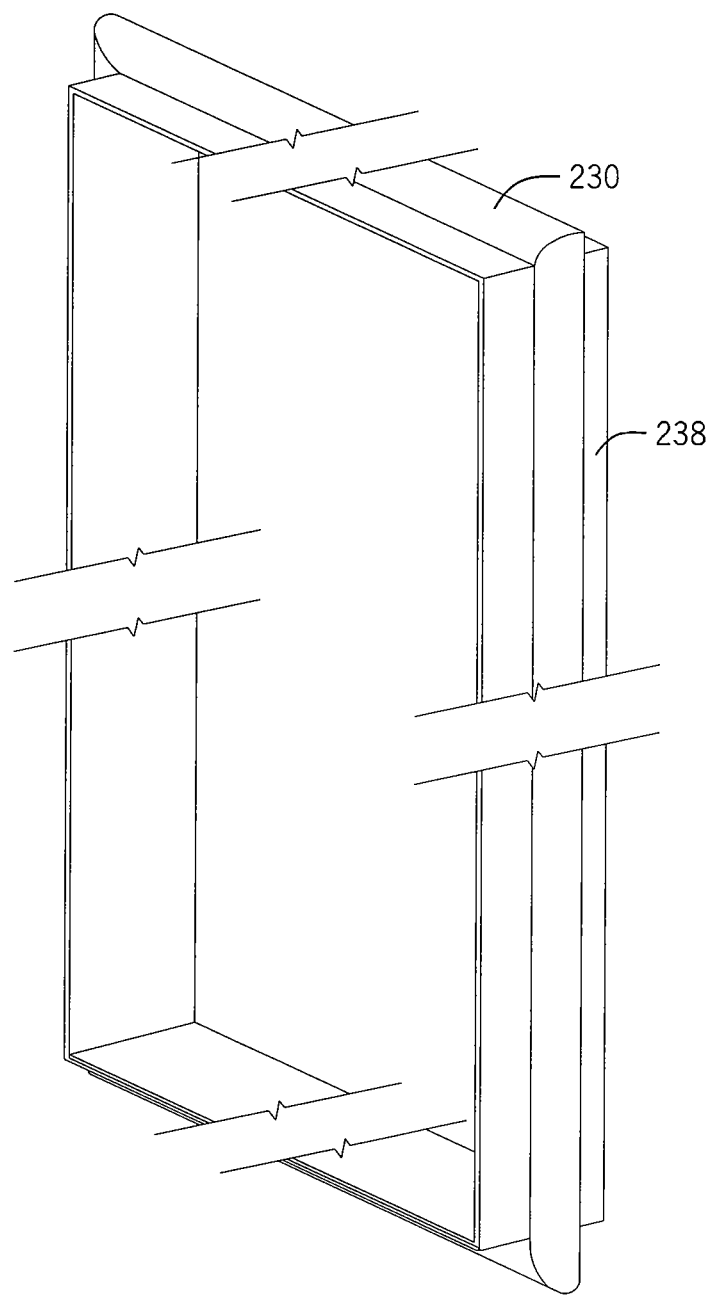
FIG. 38 shows an isometric view of a door gasket and door frame for a pair of adjacent modular pods.

With reference to FIGS. 34A, 37, and 38, door gaskets 230 may be positioned between the modular pods 100 around the doors 132 to provide a water tight seal between the aligned doorways 130 of adjacent modular pods 100. Each door gasket 230 may generally define a rectangle or otherwise suitable shape to match the shape of the modular pod's doorway shape and may include a central portion 232 with an oval or circular shaped cross-section and plate-like end portions 234 on each side of the central portion 232. The central portion 232 of the door gasket 230 may further be hollow so that the central portion 232 of the door gasket 230 may change shape upon the application of pressure to the central portion 232. Mechanical fasteners 236, such as screws or bolts, may be passed through the plate-like end portions 234 of the door gasket 230 in order to fasten the door gasket 230 to the structural members 234 of the frame structures 178, 180 of the modular pods 100.

To maintain the position of the door gasket 230 relative to the modular pods 100, the door gasket 230 may encompass a door frame 238 that is sized to fit within the adjacent doorways 130 of the adjacent modular pods 100. Generally, the door frame 238 is rectangular in shape and spans between and through the adjacent doorways 130 of the adjacent modular pods 100 so that the door frame 238 provides a structure that a user can step upon when moving from one modular pod 100 to the other adjacent modular pod 100 through the aligned doorways 130 of the adjacent modular pods 100.

The door gasket 230 may be positioned along the centerline of the door frame 238. In this configuration, the door gasket 230 is located between the exterior facing sides of the adjacent sidewalls 102, 104 of the adjacent modular pods 100 when the door frame 238 is positioned within one set of aligned doorways 130 of the adjacent modular pods 100. The mechanical fasteners 236 may be passed through the plate-like end portions 234 of the door gasket 230 and through the door frames 238 in order to fasten the door gasket 230 and the door frames 238 to the structural members 224 of the respective frame structures 178, 180 of the adjacent modular pods 100.

To further enhance the water tight seal between adjacent modular pods 100, a base gasket 240 may be positioned underneath the door gaskets 230 between the exterior facing sides of the adjacent sidewalls 102, 104 of the adjacent modular pods 100. The base gasket 240 may extend along the length of the adjacent modular pods 100 from the first end walls 106 of the modular pods 100 to the second end walls 108 of the modular pods 100. Similar to the door gasket 230, the base gasket 240 may include a central portion 242 with an oval or circular shaped cross-section and plate-like end portions 244 on each side of the central portion 242. Also, like the door gasket 230, the central portion 242 of the base gasket 240 may be hollow so that the central portion 242 of the base gasket 240 may change shape upon the application of pressure to the central portion 242. Mechanical fasteners 246, such as screws or bolts, may be passed through the plate-like end portions 244 of the base gasket 240 in order to fasten the base gasket 240 to the structural members 224 of one of the adjacent modular pods 100.

The door and base gaskets 230, 240 may be formed from a flexible material, such as flexible rubber. To press the door and base gaskets 230, 240 tightly against the adjacent sidewalls 102, 104 of adjacent modular pods 100, torque bolts 248 or the like may be passed through the adjacent sidewalls 102, 104 of adjacent modular pods 100. The torque bolts 248 may be generally positioned between the ceilings 164 and the roofs 110 of the adjacent modular pods 100 and may be spaced apart from each other at any suitable or desired spacing along the lengths of the modular pods 100. Each torque bolt 248 may be selectively tightened to draw the adjacent modular pods 100 together. As the adjacent modular pods 100 are drawn together, the door and base gaskets 230, 240 are compressed between the adjacent sidewalls 102, 104 of the adjacent modular pods 100, thus tightly pressing the door and base gaskets 230, 240 against the adjacent sidewalls 102, 104 of the adjacent modular pods 100.

Figure 36:
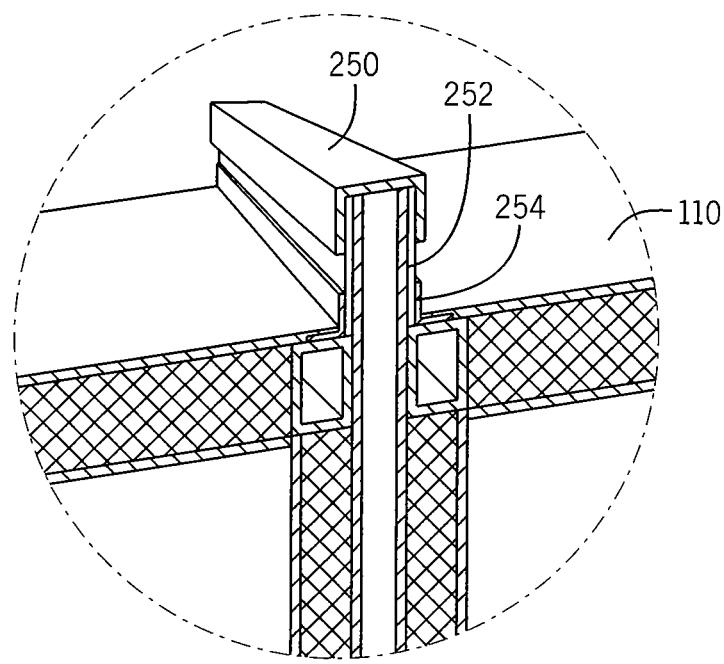
FIG. 36 shows an enlarged view of a portion of the cross-section elevation view of FIG. 34B.

The water tight seal between adjacent pods 100 may also be enhanced by positioning caps along the roofs 110 and the first and second end walls 106, 108 of adjacent modular pods 100. FIG. 36 shows the details for a cap 250 that runs along the lengths of the roofs 110 for adjacent modular pods 100. In particular, the adjacent sidewalls 102, 104 of the adjacent modular pods 100 may each extend above the roofs 110 for the adjacent modular pods 100, thus creating a parapet along the lengths of the roofs 110 of the modular pods 100. Connection members, such as clip plates 252 and angles 254, may also extend above the roofs 110 of the adjacent modular pods 100 in order join the upper portion of each sidewall 102, 104 to its respective structural frame 178, 180. The cap 250 may be C-shaped, U-shaped or any other suitable shape. The cap 250 may extend along the lengths of the adjacent sidewalls 102, 104 of the adjacent modular pods 100 and may be joined to upper ends of the adjacent sidewalls 102, 104 in such a manner so as to close the gap between the adjacent sidewalls 102, 104 of the adjacent modular pods 100. A similar cap detail may be used along the end portions of the adjacent sidewalls 102, 104 of adjacent modular pods 100 where the end portions are located at the first or second end walls 106, 108 of the modular pods 100 in order to close the gap between the adjacent modular pods 100 along the heights of the modular pods 199 at the first and second end walls 106, 108.

Figure 39A:
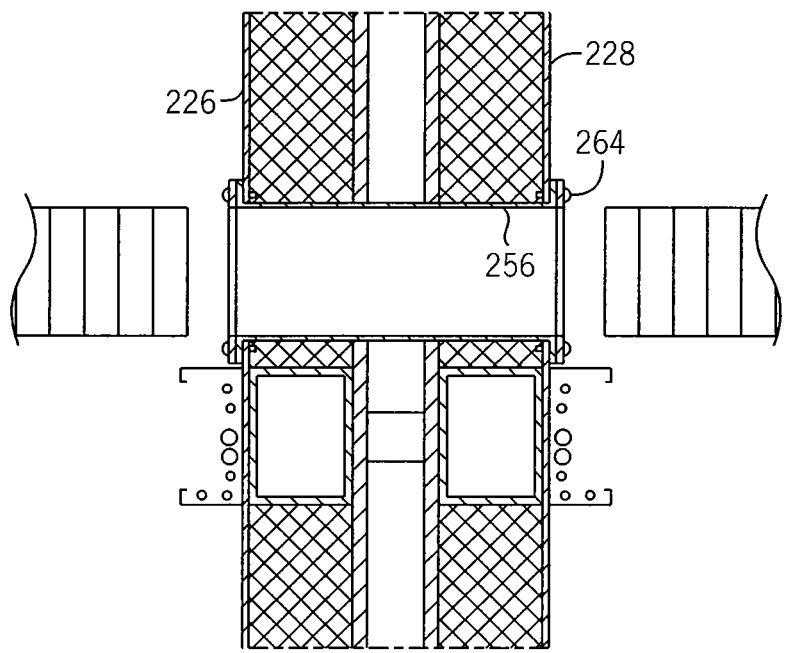
FIG. 39A shows an enlarged view of a portion of the cross-section elevation view of FIG. 34B.
Figure 39B:
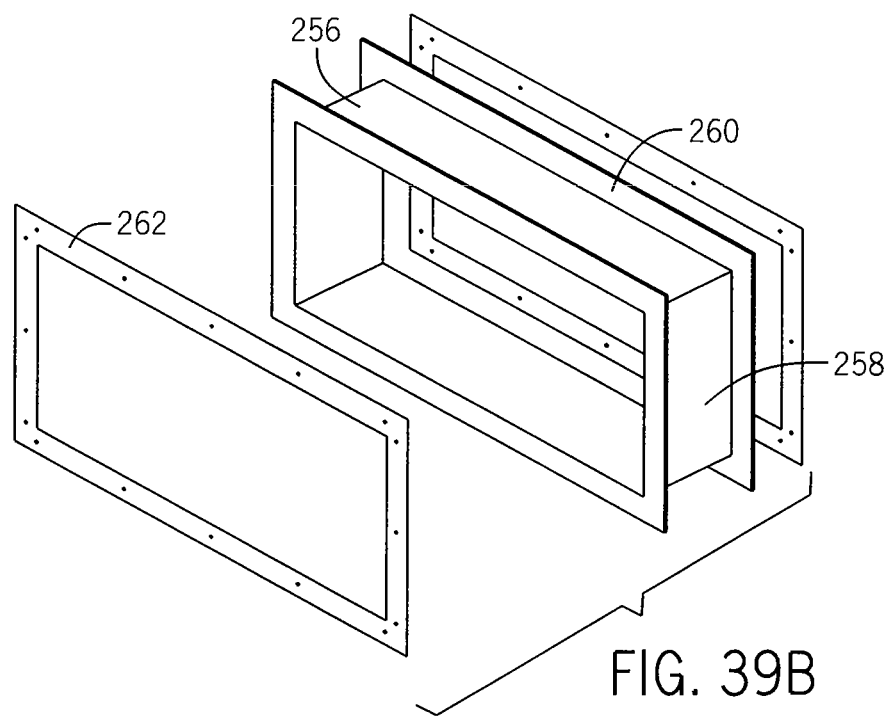
FIG. 39B shows an exploded isometric view of a flexible cable boot assembly for use with a pair of adjacent modular pods.
Figure 40:
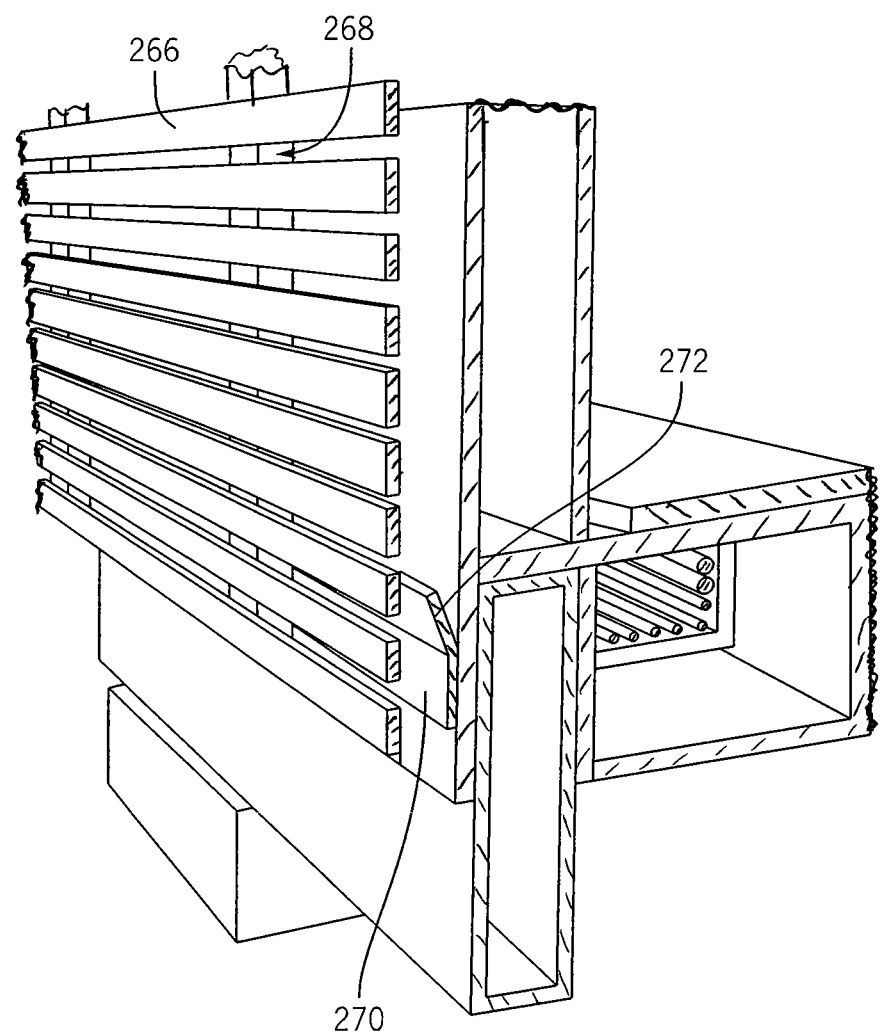
FIG. 40 shows an enlarged framing detail for joining an architectural skin to the modular pod.
Figure 41:
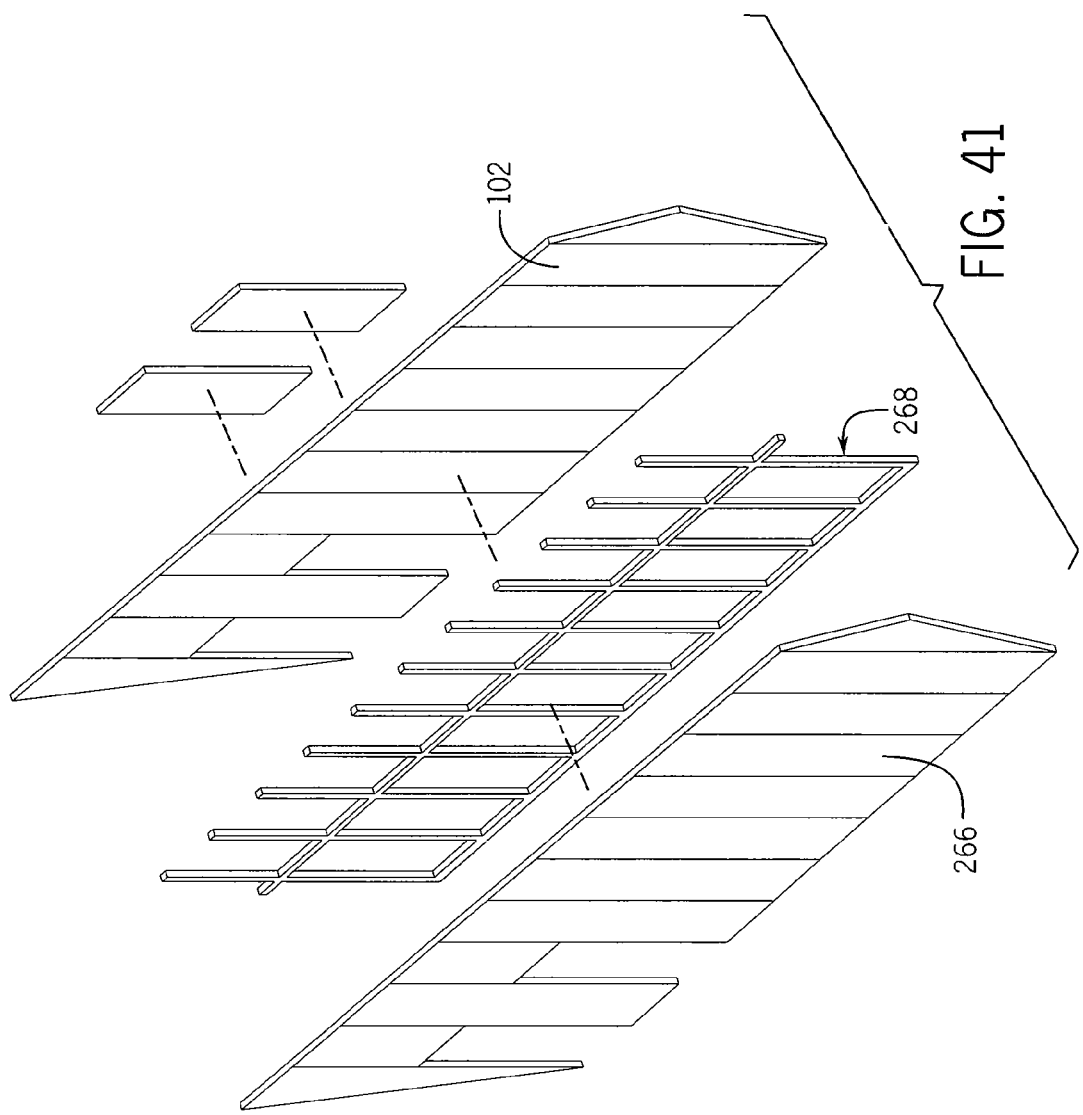
FIG. 41 shows an exploded view of an architectural skin assembly and a portion of the modular pod.
Figure 42:
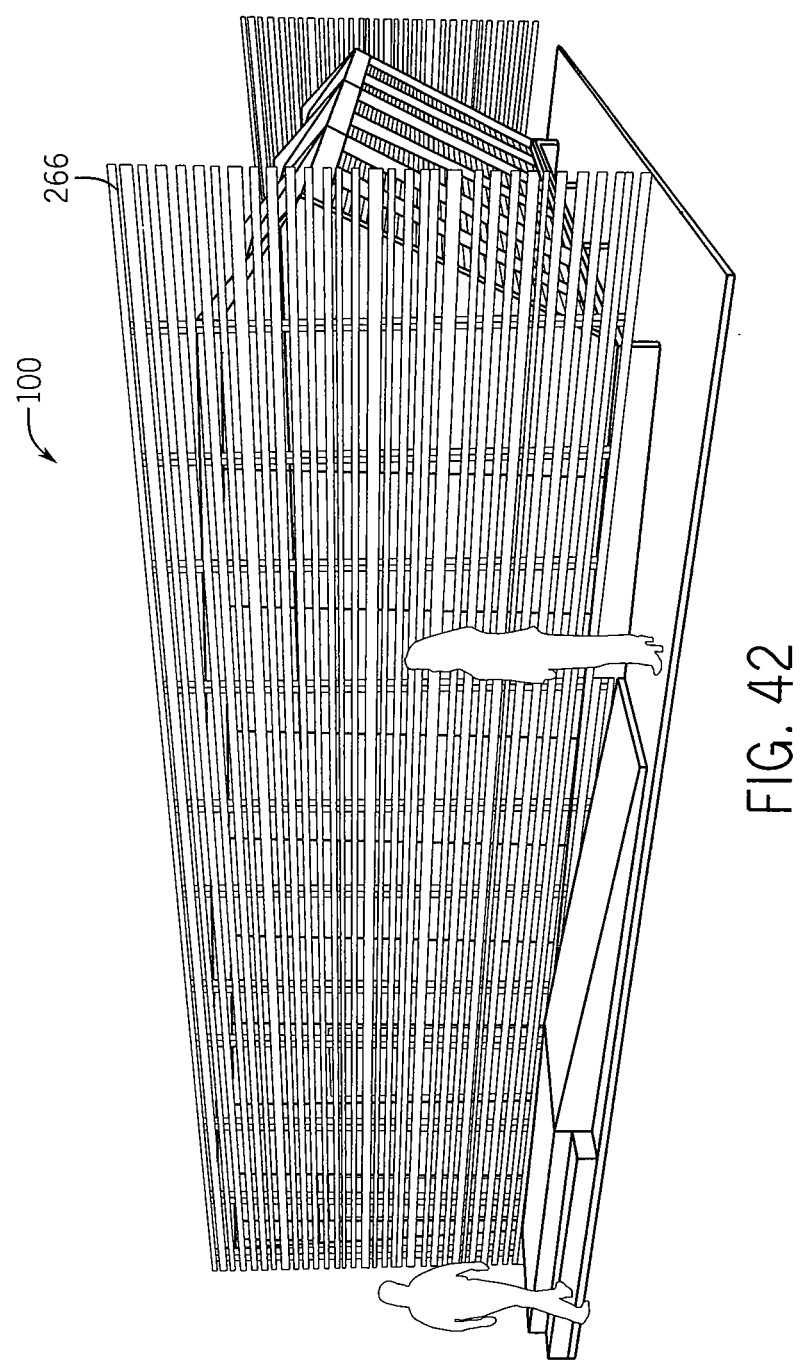
FIGS. 42 and 43 show isometric views of the modular pod, each figure showing the modular pod with an embodiment of an architectural skin attached to it.
Figure 43:
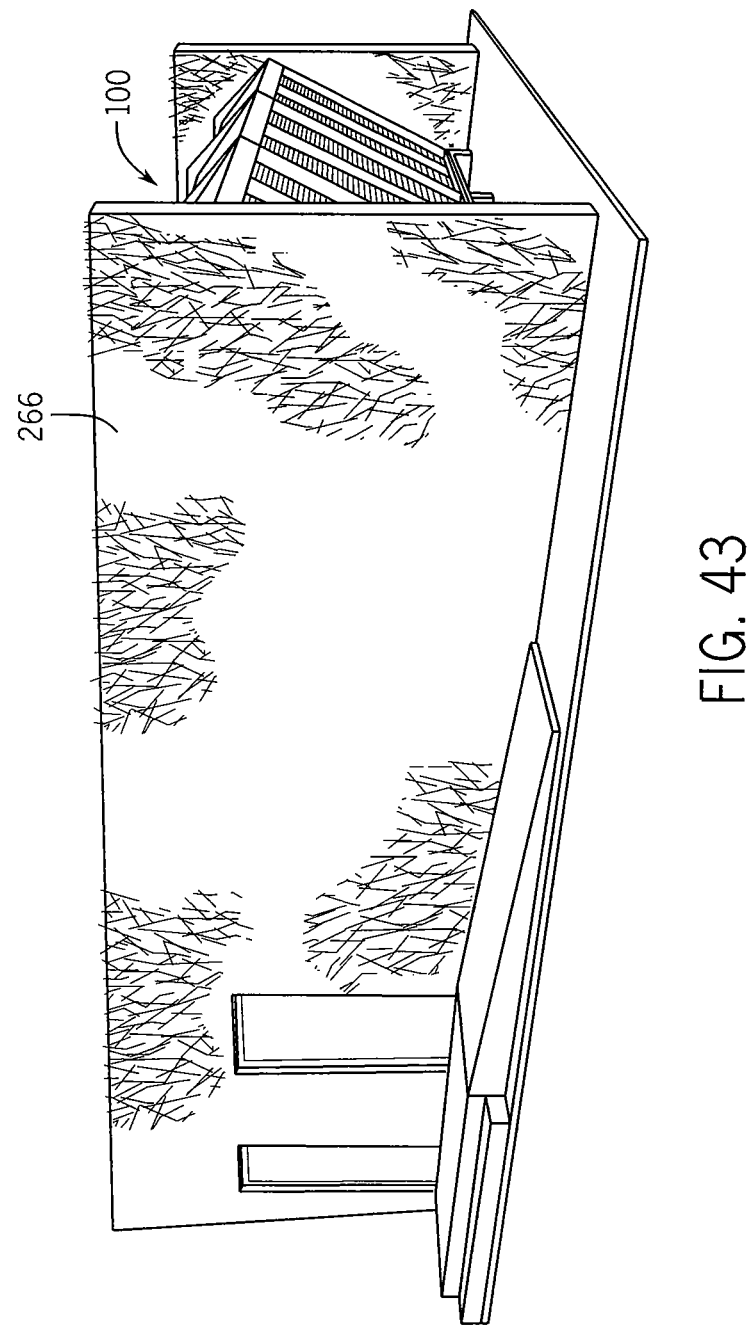
Figure 44:
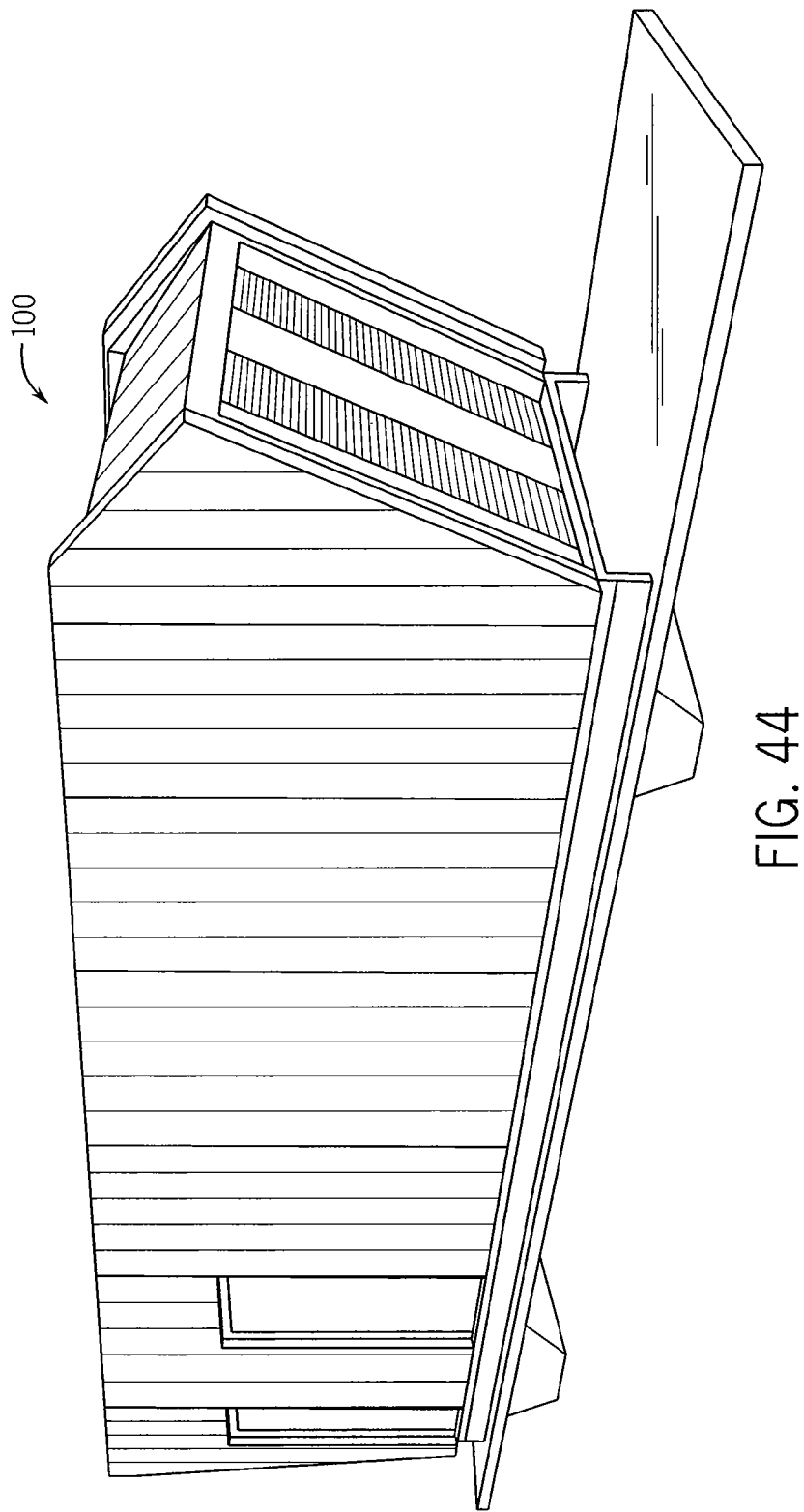
FIGS. 44 and 45 show isometric views of the modular pod, each figure showing the modular pod with a potential exterior design pattern.

With reference to FIGS. 34B, 39A, and 39B, a flexible cable boot assembly may be positioned between adjacent modular pods 100 to encompass cables and other wires that are routed through and between adjacent modular pods 100. The flexible cable boot assembly may include a flexible cable boot 256 and flexible cable boot plates 260. The flexible cable boot 256 may include a main body 258 that is generally shaped to resemble a rectangular duct, although any other suitable shape, such a tube, may be used. At each end of the main body 258, a flange 260 may extend outwardly from the main body 258 of the flexible cable boot 256 around the outer perimeter of the main body 258. At each flange 260, a flexible cable boot plate 262 that matches the shape of the flange 260 may abut the flange 260. Mechanical fasteners 264 may be passed through flexible cable boot plate 262 and the flanges 260 to join the flexible cable boot plate 262 and the flexible cable boot 256 to the interior sidewall panels 226, 228 of the adjacent modular pods 100. The flexible cable boot 256 may be formed used a watertight material, such a flexible rubber, to protect the cables passing through the flexible cable boot 256 from water.

Figure 45:
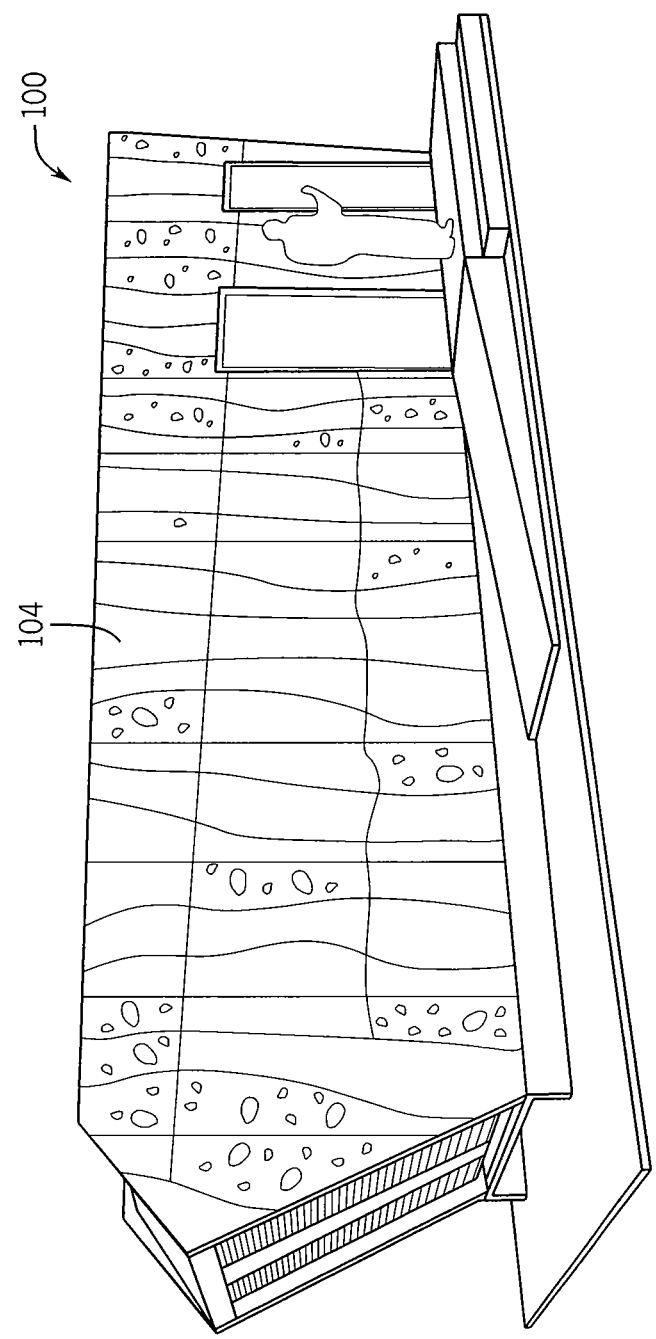

With reference to FIGS. 40-45, graphics and/or architectural skins 266 may be utilized to blend the modular pod 100 into a site. An architectural frame 268 may support the architectural skin 266. The architectural frame 268, in turn, may be joined to one of the sidewalls 102, 104 of the modular pod 100 via one or more bent rails 270 that extend along the length of the sidewall 102, 104. Each bent rail 270 may be continuous along the length of the sidewall 102, 104. The vertical or horizontal frame elements of the architectural frame 268 may include slots that are configured to receive the projecting portions 272 of the bent rails 270 in the slots. In some embodiments, each sidewall 102, 104 of the modular pod 100 may include an upper bent rail that is located slightly above the doorways 130 of the modular pod 100 and a lower bent rail that is located slightly below the doorways 130 of the modular pod 100. This architectural skin system allows for various architectural skins 266 to be applied to the exterior of the modular pod 100. In some embodiments, the architectural skin may include multiple horizontal or vertical slats. Various types of metal, wood, or green wall systems may be hung to the architectural frame 268 to readily adapt the modular pod 100 to the context of the site. As such, the modular pod 100 can be more readily integrated into an environment. Additionally, as shown in FIG. 45, graphical design may be applied directly to one or more sidewalls 102, 104 of the modular pod 100.

Figure 46:
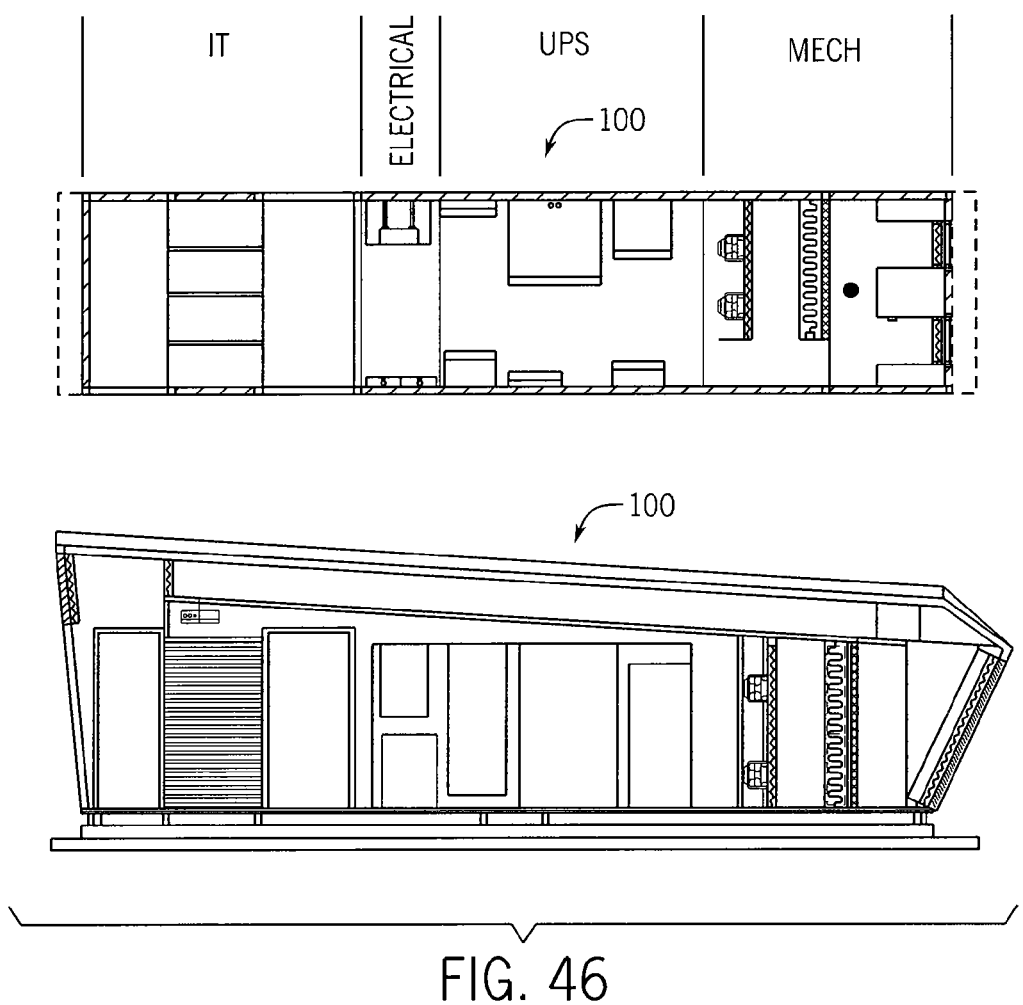
FIG. 46 shows a plan view and an elevation view of a modular pod that includes an information technology ("IT") module, an electrical module, a UPS module, and a mechanical module.
Figure 47:
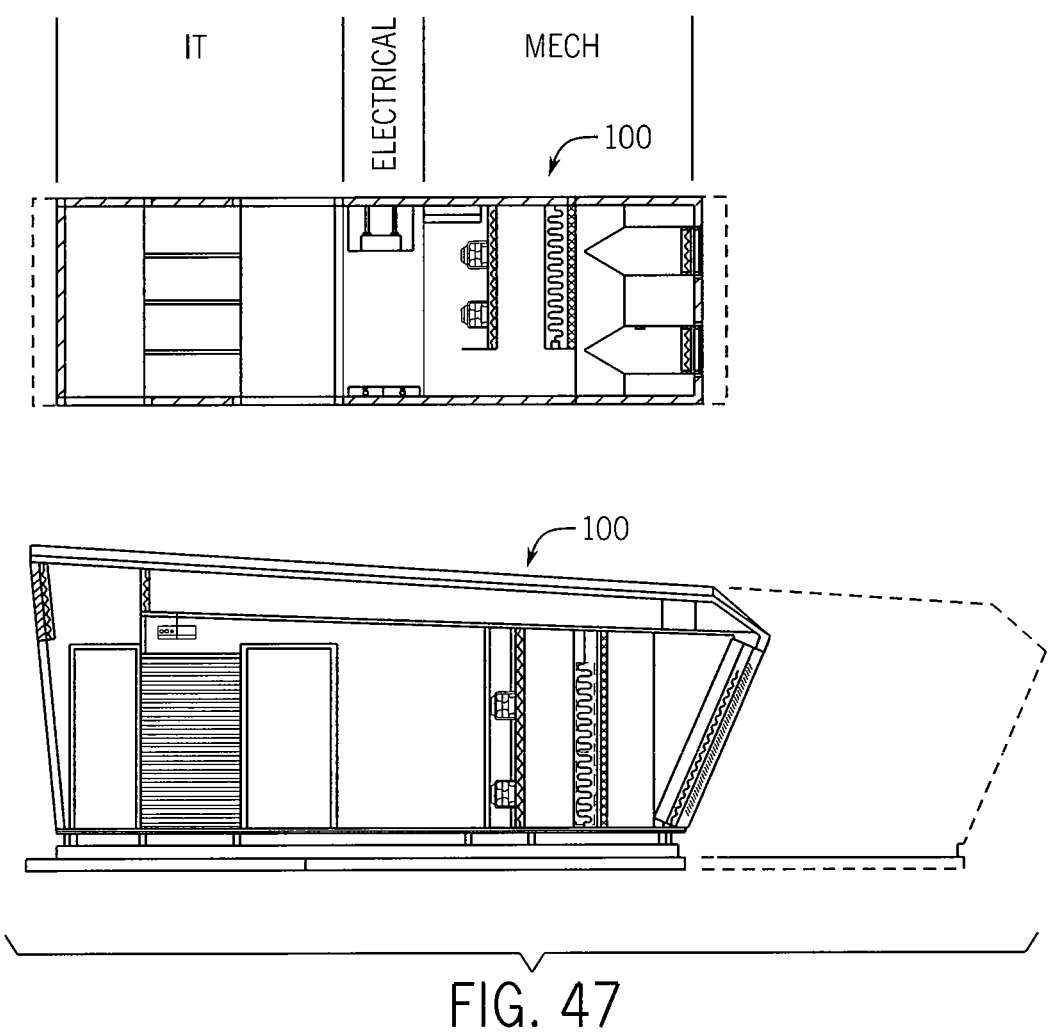
FIG. 47 shows a plan view and an elevation view of a modular pod that includes that includes an IT module, an electrical module, and a mechanical module.

With reference to FIGS. 46 and 47, the modular pod 100 may include individual equipment modules. In some embodiments, the modules may include a mechanical module (e.g., fans and an air economizer), an electrical module (e.g., a panel board with circuit breakers feeding the IT racks with power), an IT module (e.g., server racks), and the UPS module (e.g., the UPS main box, the transformer, and the UPS battery). In other embodiments, one or more of the foregoing modules may be omitted. For example, the UPS module may be omitted. In such embodiments, the length of the modular pod 100 may be shorter than a module that includes the UPS module. For example, a modular pod 100 that includes the mechanical module, the electrical module, the IT module, and the UPS module may be up to approximately 40' long, while a modular pod 100 that contained all modules except the UPS module may be approximately 30' long. The various modules and the enclosure for the modular pod 100 may be assembled in a factory and shipped to the site, thus requiring little to no assembly of the modular pod 100 at the site.

With reference to FIGS. 48-50, in some embodiments, the first end wall 106 may include a first end wall panel 274 that is located between the first end wall opening 118, the base 112, and the first and second sidewalls 102,104. The first end wall panel 274 may be joined by a hinged connection to the structural frames 178, 180 along a top edge of the first end wall panel 274. This hinged connection allows the first end wall panel 274 to be pivoted relative to the remaining components of the first end wall 106 in order to selectively create an opening in the first end wall 106. This opening may be utilized to facilitate moving equipment, such as the server racks 134, into and out of the modular pod 100.

The air economizer utilized in the modular pod 100 may be used in other implementations that require the mixing of air streams at two different temperatures to create a blended air stream with a temperature between the temperatures of the individual air streams that are used to create the blended air stream. In particular, a mixing zone, such as the air mixing chamber, may be placed into communication with a first air inlet and with at least one air shaft that tapers from a top end to a bottom end of the air shaft. The first air inlet could be placed into communication with an air supply at a first temperature, and the at least one air shaft, which may be two or more air shafts, could be placed into communication with an air supply at a second temperature via a second air inlet. Further, the second air inlet could be placed into communication with an air plenum, such as the mechanical return air plenum, or any other air passageway or the like that delivers air to the second air inlet. The air supply at the first temperature could be a cold air supply, and the air supply at the second temperature could be a hot air supply, or vice versa. Other features of the air mixing system could be similar to the air economizer described above, including, but not limited to, positioning a damper between the first air inlet and the mixing zone, and positioning a perforated wall between the air shafts and the mixing zone. Yet further, the air mixing system may further include air cooling coils or the like downstream of the mixing zone to further adjust the mixed air flow to a desired temperature.

The apparatuses and associated methods in accordance with the present disclosure have been described with reference to particular embodiments thereof in order to illustrate the principles of operation. The above description is thus by way of illustration and not by way of limitation. Various modifications and alterations to the described embodiments will be apparent to those skilled in the art in view of the teachings herein. Those skilled in the art may, for example, be able to devise numerous systems, arrangements and methods which, although not explicitly shown or described herein, embody the principles described and are thus within the scope of this disclosure. Accordingly, it is intended that all such alterations, variations, and modifications of the disclosed embodiments are within the scope of this disclosure as defined by the appended claims.

Where appropriate, common reference words are used for common structural and method features. However, unique reference words are sometimes used for similar or the same structural or method elements for descriptive purposes. As such, the use of common or different reference words for similar or the same structural or method elements is not intended to imply a similarity or difference beyond that described herein.

All directional references (e.g., upper, lower, upward, downward, left, right, leftward, rightward, top, bottom, above, below, vertical, horizontal, clockwise, and counterclockwise) are only used for identification purposes to aid the reader's understanding of the embodiments of the present invention, and do not create limitations, particularly as to the position, orientation, or use of the invention unless specifically set forth in the claims. Connection references (e.g., attached, coupled, connected, joined, and the like) are to be construed broadly and may include intermediate members between a connection of elements and relative movement between elements. As such, connection references do not necessarily infer that two elements are directly connected and in fixed relation to each other.

In some instances, components are described with reference to "ends" having a particular characteristic and/or being connected with another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, part, member or the like.

In methodologies directly or indirectly set forth herein, various steps and operations are described in one possible order of operation, but those skilled in the art will recognize that steps and operations may be rearranged, replaced, or eliminated without necessarily departing from the scope of the present invention.

It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A modular pod comprising:
   a plurality of walls, a roof, and a base defining a substantially enclosed interior space;
   a return air plenum positioned within the interior space;
   an air inlet positioned proximate one of the walls; and
   an air economizer positioned within the interior space, at least one server rack positioned in the interior space downstream of the air economizer, the air economizer comprising:
      a mixing zone in communication with the air inlet; and
      a plurality of return air shafts in communication with the return air plenum and in communication with the mixing zone, each return air shaft tapering from a first length as measured between the mixing zone and another of the walls at an end of the return air shaft proximate the roof to a second shorter length as measured between the mixing zone and another of the walls at an end of the return air shaft proximate the base.

2. The modular pod of claim 1, wherein each return air shaft includes at least one wall that includes at least a partially perforated portion that extends from a bottom end portion to a top end portion of the at least one wall, and the at least partially perforated portion at the top end portion of the at least one wall is distal from the return air plenum.

3. The modular pod of claim 1, wherein each return air shaft includes a substantially constant width, and the first length of each return air shaft proximate the roof is approximately 4 to 8 times greater than the second length of each return air shaft proximate the base.

4. The modular pod of claim 1, wherein the plurality of return air shafts comprises at least three return air shafts aligned along one of the walls of the modular pod with at least one return air shaft centrally positioned between two sidewall return air shafts, and the at least one centrally positioned return air shaft has approximately double the volume of the two sidewall return air shafts.

5. The modular pod of claim 1, further comprising an air diverter positioned between the return air plenum and the plurality of return air shafts, and at least one damper positioned between the air inlet and the mixing zone.

6. The modular pod of claim 1, further comprising at least one of the following positioned within the interior space between the air economizer and the at least one server rack: an air cooling system, an air filter, an uninterrupted power system, or a fan array including at least one fan.

7. The modular pod of claim 1, wherein the plurality of walls comprise a first end wall, a second end wall, a pair of opposing sidewalls that each extend at least between the first end wall and the second end wall, the first end wall is taller than the second end wall, and the roof slopes downward from the first end wall to the second end wall.

8. The modular pod of claim 7, wherein the plurality of return air shafts are positioned proximate the second end wall.

9. The modular pod of claim 7, wherein the first end wall and the second end wall each extend upward from the base at an acute angle relative to vertical.

10. The modular pod of claim 7, further comprising at least one doorway defined in at least one of the sidewalls at a location closer to the first end wall than the second end wall.

11. The modular pod of claim 7, further comprising a first doorway defined in one of the sidewalls, and a second doorway defined in the other sidewall, and the first and second doorways located on their respective sidewalls at approximately the same distance from the first end wall.

12. The modular pod of claim 1, further comprising an architectural skin joined to at least one wall of the plurality of walls.

13. The modular pod of claim 12, wherein the architectural skin comprises a plurality of horizontal slats.

14. The modular pod of claim 12, wherein the at least one wall of the plurality of walls includes at least one rail, and the architectural skin is joined to the at least wall of the plurality of walls by the at least one rail.

15. The modular pod of claim 12, wherein the architectural skin is at least coextensive with the at least one wall of the plurality of walls.

* * * * *